United States Patent
Suga et al.

(10) Patent No.: US 8,091,764 B2
(45) Date of Patent: *Jan. 10, 2012

(54) JOINING METHOD AND DEVICE PRODUCED BY THIS METHOD AND JOINING UNIT

(75) Inventors: Tadatomo Suga, Tokyo (JP); Masuaki Okada, Osaka (JP)

(73) Assignees: Bondtech, Inc., Kyoto (JP); Tadatomo Suga, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/819,442

(22) Filed: Jun. 21, 2010

(65) Prior Publication Data

US 2010/0252615 A1  Oct. 7, 2010

Related U.S. Application Data

(63) Continuation of application No. 10/586,690, filed as application No. PCT/JP2005/000788 on Jan. 21, 2005, now Pat. No. 7,784,670.

(30) Foreign Application Priority Data

| Jan. 22, 2004 | (JP) | 2004-014659 |
| Jan. 22, 2004 | (JP) | 2004-014660 |
| Feb. 16, 2004 | (JP) | 2004-037670 |
| Mar. 23, 2004 | (JP) | 2004-084935 |
| Mar. 23, 2004 | (JP) | 2004-084936 |
| Jan. 21, 2005 | (JP) | 2005-013920 |

(51) Int. Cl.
*B23K 31/02* (2006.01)
*H01L 21/30* (2006.01)

(52) U.S. Cl. ............ 228/180.21; 228/116; 228/180.22; 228/219; 228/262.21; 438/455

(58) Field of Classification Search .............. 228/116, 228/219, 180.21, 180.22; 438/455
See application file for complete search history.

(56) References Cited

U.S. PATENT DOCUMENTS 5,686,353 A   11/1997   Yagi et al.
(Continued)

FOREIGN PATENT DOCUMENTS

JP   57-195593   12/1982
(Continued)

OTHER PUBLICATIONS

Gösele et al., "What determines the lateral bonding speed in silicon wafer bonding?" Applied Physics Letters, vol. 67, No. 6, Aug. 1995, pp. 863-865.

(Continued)

*Primary Examiner* — Kiley Stoner
*Assistant Examiner* — Devang R Patel
(74) *Attorney, Agent, or Firm* — Vedder Price P.C.; Ajay A. Jagtiani

(57) ABSTRACT

A practical bonding technique is provided for solid-phase room-temperature bonding which does not require a profile irregularity of the order of several nanometers, in which a high-vacuum energy wave treatment and continuous high-vacuum bonding are not required.

Since an adhering substance layer is thin immediately after a surface activating treatment using an energy wave, a bonding interface is spread by crushing the adhering substance layer to perform bonding, so that a new surface appears on a bonding surface, and objects to be bonded are bonded together. In order to crush the adhering substance layer more easily, a bonding metal of a bonding portion of the object to be bonded needs to have a low hardness. According to the results of various experiments conducted by the present inventors, it was found that the hardness of the bonding portion which is a Vickers hardness of 200 Hv or less is particularly effective for room-temperature bonding.

4 Claims, 26 Drawing Sheets

U.S. PATENT DOCUMENTS

| | | | |
|---|---|---|---|
| 5,833,758 | A | 11/1998 | Linn et al. |
| 5,971,253 | A | 10/1999 | Gilleo et al. |
| 6,793,829 | B2 | 9/2004 | Platt et al. |
| 7,279,358 | B2 * | 10/2007 | Yamauchi et al. ............ 438/108 |
| 7,692,292 | B2 | 4/2010 | Higashi et al. |
| 2003/0148593 | A1 | 8/2003 | Okamoto et al. |
| 2003/0164396 | A1 | 9/2003 | Suga et al. |
| 2004/0140551 | A1 | 7/2004 | Usui et al. |
| 2004/0157407 | A1 * | 8/2004 | Tong et al. .................... 438/455 |
| 2004/0169020 | A1 | 9/2004 | Yamauchi |
| 2007/0108634 | A1 | 5/2007 | Higashi et al. |

FOREIGN PATENT DOCUMENTS

| | | |
|---|---|---|
| JP | 63-101085 | 5/1988 |
| JP | 8-181144 | 7/1996 |
| JP | 10-92702 | 4/1998 |
| JP | 2791429 | 8/1998 |
| JP | 2000-138255 | 5/2000 |
| JP | 2001-351892 | 12/2001 |
| JP | 2002-231838 | 8/2002 |
| JP | 2003 234370 | 8/2003 |
| JP | 2003 318217 | 11/2003 |
| JP | 2003-318219 | 11/2003 |
| JP | 2004 273941 | 9/2004 |
| JP | 2005-129600 | 5/2005 |
| JP | 2005-175047 | 6/2005 |
| WO | WO 0217378 A1 | 2/2002 |
| WO | WO 03001858 A1 | 1/2003 |

OTHER PUBLICATIONS

Takagi et al., "Room-temperature bonding of lithium niobate and silicon wafers by argon-beam surface activation" Applied Physics Letters, vol. 74, No. 16, Apr. 1999, pp. 2387-2389.

Japanese Office action dated Nov. 16, 2010 (non English translation).

* cited by examiner

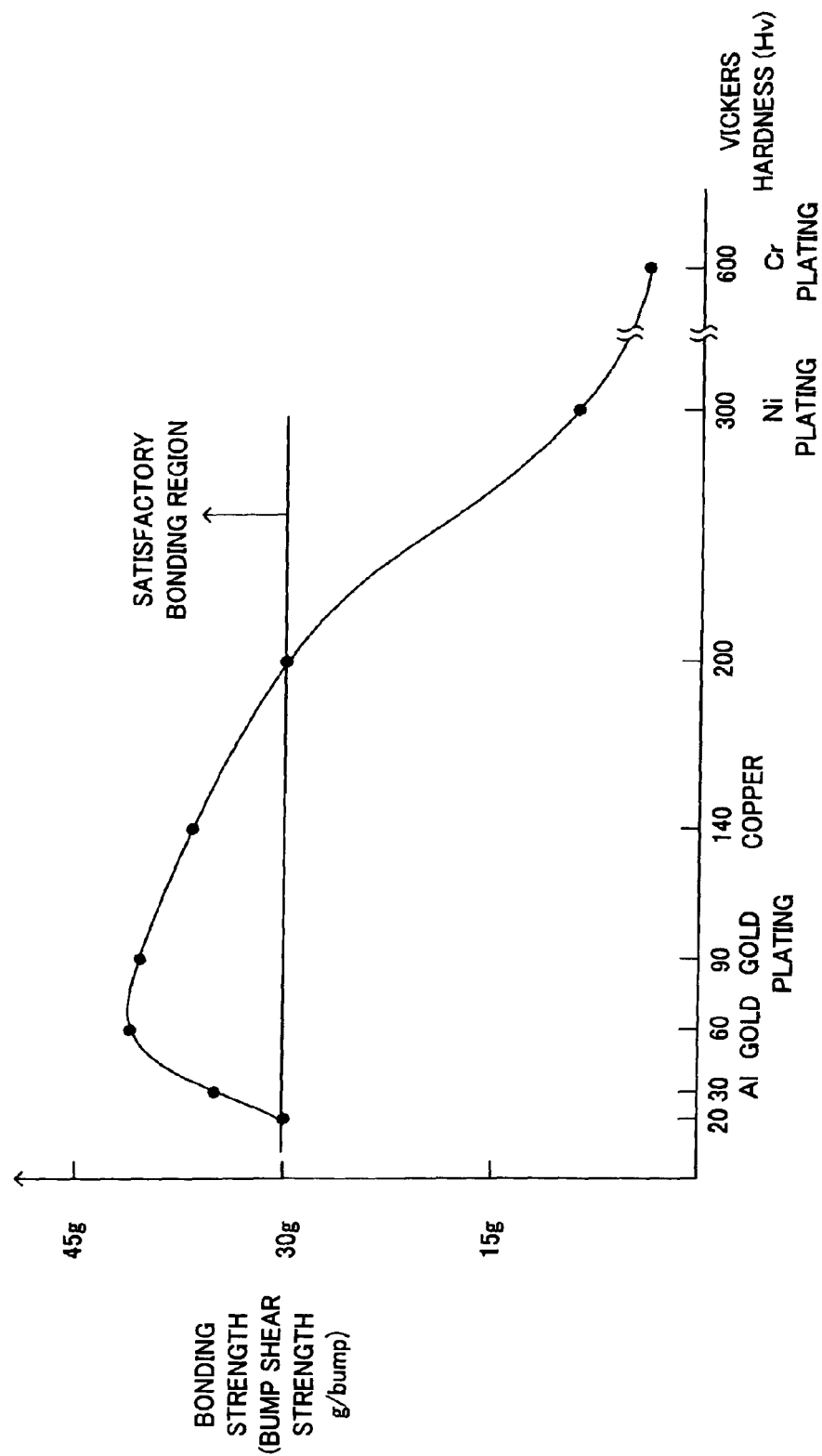
F I G. 1

FIG. 3A
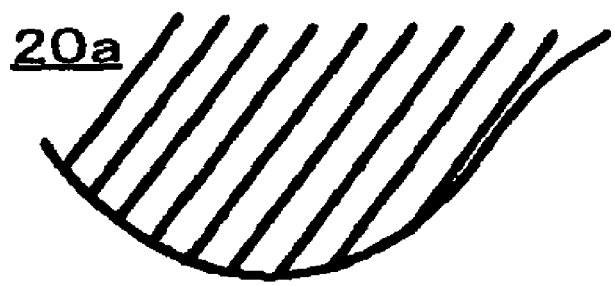
FIG. 3B

F I G. 16A
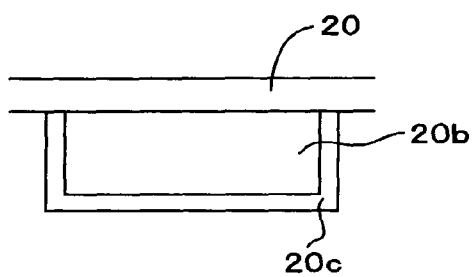
F I G. 16B
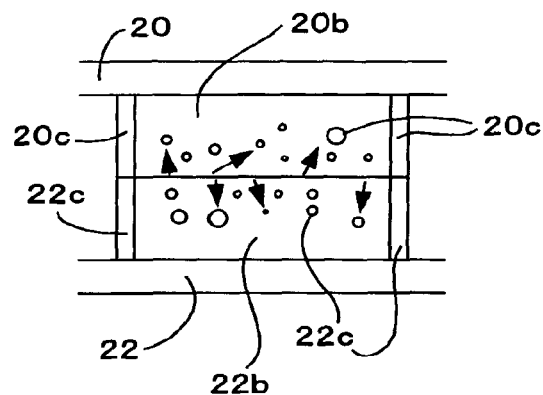

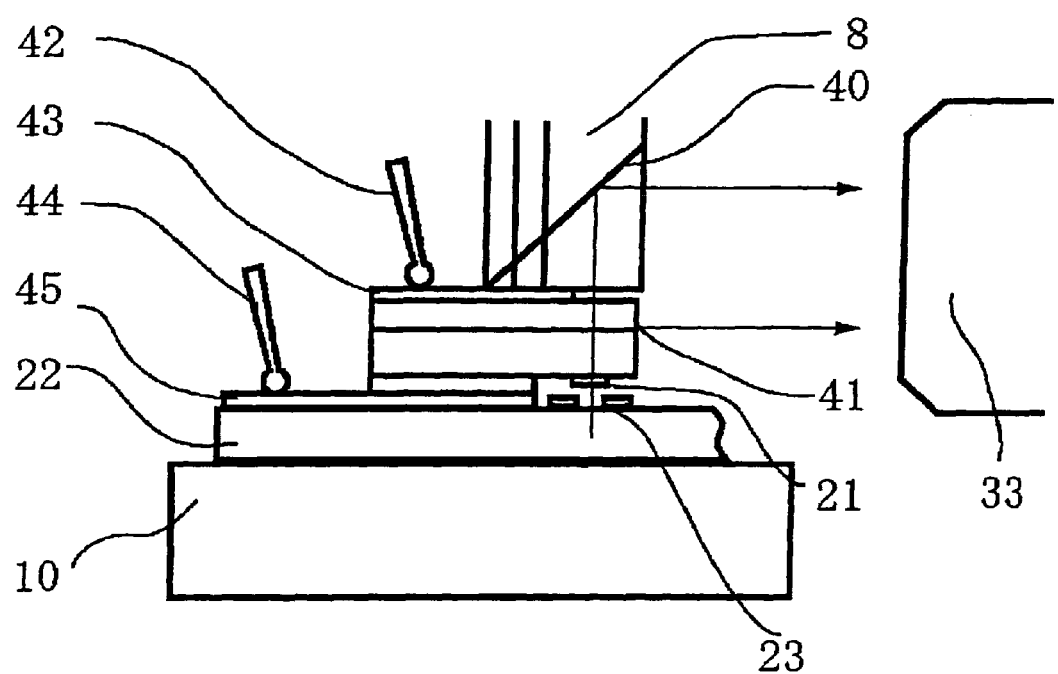
F I G. 17

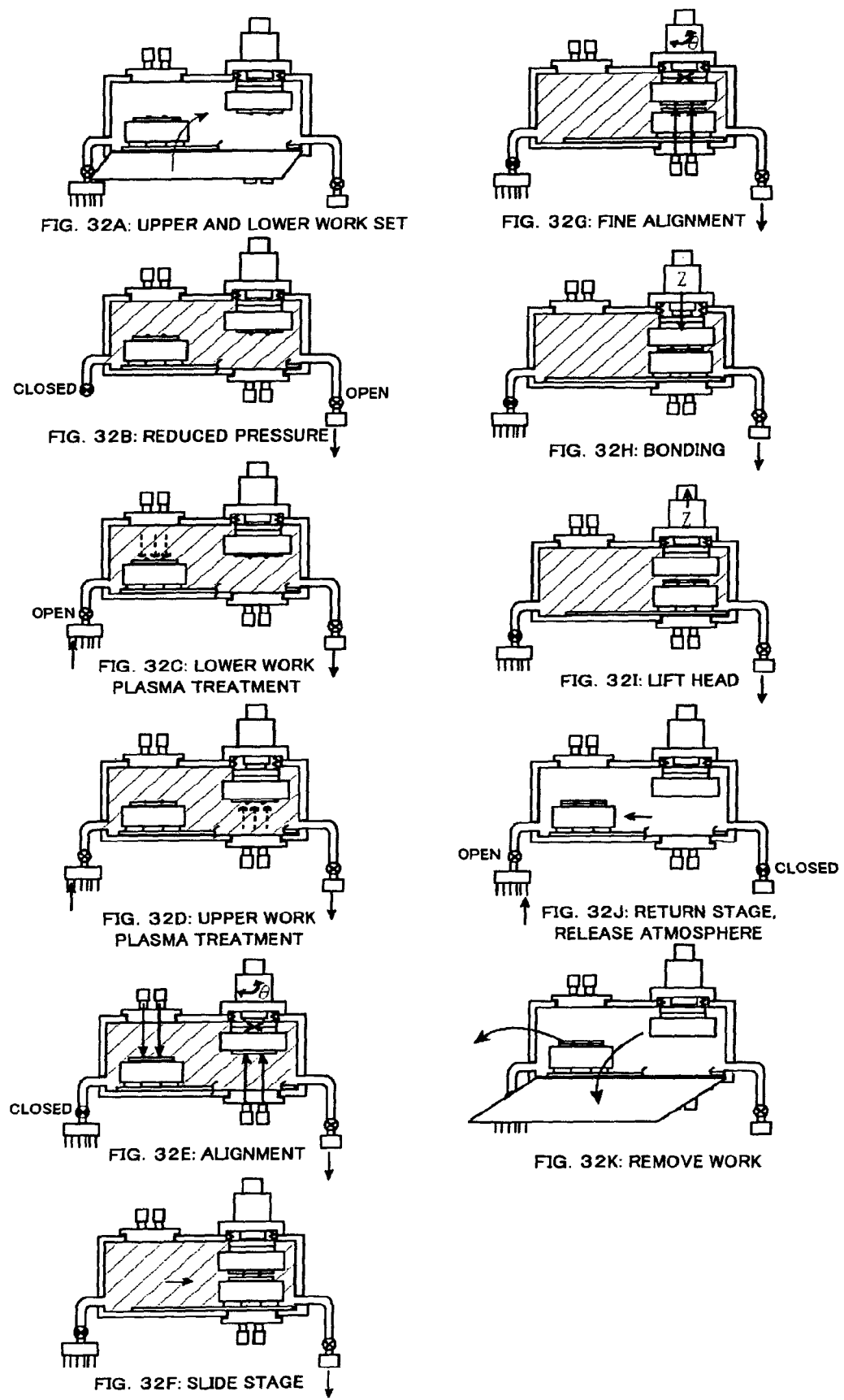

JOINING METHOD AND DEVICE PRODUCED BY THIS METHOD AND JOINING UNIT

CROSS-REFERENCE TO RELATED APPLICATIONS

This application is a divisional of U.S. patent application Ser. No. 10/586,690, filed Jul. 20, 2006, allowed, which claims priority from national stage of PCT/JP05/00788, filed Jan. 21, 2005. The entire contents and disclosures of the above applications are incorporated herein by reference.

TECHNICAL FIELD

The present invention relates to a bonding technique for bonding a plurality of objects to be bonded having a metal bonding portion at room temperature.

BACKGROUND ART

Conventionally, room-temperature bonding methods are performed in a vacuum as described in Patent Document 1 or in inert gas as described in Patent Document 2 after a bonding surface is cleaned using an energy wave. This is because, if the bonding surface is exposed to the atmospheric air, oxidation or readhesion of organic substances or the like prevents metal atoms from being attracted by each other.

In the case of Patent Document 2, if gold is used, which does not react, oxidation is prevented, but adhesion of organic substances remains. Therefore, bonding is performed in inert gas.

The bonding surface is polished to a profile irregularity of the order of several nanometers before being subjected to bonding under a low load. This is because the profile irregularity of the order of several nanometers can lead to spontaneous bonding due to intermolecular force in a vacuum.

Patent Document 1: JP No. 2791429 B
Patent Document 2; JP No. 2001-351892 A

DISCLOSURE OF INVENTION

Problem to be Solved by the Invention

However, in conventional methods, bonding needs to be performed in a vacuum, and at least in the atmospheric air, it is difficult to perform bonding due to a readhesion film. Also, since bonding is performed only by contact under a low load, the profile irregularity needs to be reduced to the order of several nanometers, so that conventional methods are not suitable for semiconductor wafers or chips after a plurality of times of a thin-film treatment or a heat treatment which undulate or have a low profile irregularity.

Therefore, an object of the present invention is to provide a practical bonding technique for solid-phase room-temperature bonding which does not require a profile irregularity of the order of several nanometers, in which a high-vacuum energy wave treatment or continuous high-vacuum bonding is not required.

Means for Solving Problem

To achieve the above-described object, a bonding method is provided for bonding objects to be bonded which have a bonding portion formed of a metal, in a solid phase at room temperature, by contacting the bonding portions with each other and pressing the bonding portions after treating the bonding portions with an energy wave which is an atom beam, an ion beam, or a plasma, wherein the bonding portion has a hardness of 200 Hv or less (claim 1).

A bonding apparatus according to the present invention comprises a head for holding one of the objects to be bonded, a stage for holding the other object to be bonded, and a vertical drive mechanism capable of performing a pressing control with respect to at least one of the head and the stage in a direction substantially perpendicular to a bonding surface of the object to be bonded, wherein the objects to be bonded which have a bonding portion formed of a metal are bonded together in a solid phase at room temperature by contacting the bonding portions with each other and pressing the bonding portions after treating the bonding portions with an energy wave which is an atom beam, an ion beam, or a plasma, and the bonding portion has a hardness of 200 Hv or less (claim 26).

As used herein, an energy wave treatment refers to a treatment which activates a bonding interface of objects to be bonded using an atom beam, an ion beam, or a plasma so as to achieve bonding at low temperature in a solid phase. This treatment may also be referred to as a surface activating treatment. The principle of bonding by surface activation can be considered as follows. Specifically, assuming that an object to be bonded is formed of a material, such as a metal, adhering substances, such as organic substances, oxide film, or the like, are removed by etching from a bonding surface to generate an active dangling bond of a metal atom on the bonding surface, whereby the dangling bonds of the bonding surface of the objects to be bonded are bonded together. If the bonding surface is formed of gold, it is difficult for organic substances, an oxide film, or the like to adhere to the bonding surface after a surface activating treatment, and bonding can be achieved if it is performed within several hours after the surface activating treatment and even if not in a vacuum atmosphere.

As used herein, room-temperature bonding refers to a method for performing bonding by heating at room temperature to a low temperature of 180° C. or less, preferably at room temperature. Regarding conventional low-temperature bonding, lead-tin solder has a melting point of 183° C. Therefore, bonding at 183° C. or less is effective. Bonding at 150° C. or less or at 100° C. or less is preferable, more preferably at room temperature.

As described in Patent Document 1, by performing a surface activating treatment using an energy wave in a high vacuum of $10^{-5}$ Torr or less, adhering substances, such as organic substances, oxide film, or the like, is removed from bonding surfaces (bonding portions) of objects to be bonded, and the objects to be bonded can be bonded only by contacting directly if it is performed in a high vacuum. However, when objects to be bonded are bonded in a low vacuum of $10^{-5}$ Torr or more or in the atmospheric air after cleaning, an adhering substance layer is formed on the bonding surface, so that the objects to be bonded are not bonded only by contacting directly. However, since the adhering substance layer is thin immediately after the surface activating treatment, a bonding interface is spread by crushing the adhering substance layer to perform bonding, so that a new surface appears on a bonding surface, and the objects to be bonded are bonded together. In order to crush the adhering substance layer more easily, a bonding metal of a bonding portion of the object to be bonded needs to have a low hardness. According to the results of various experiments conducted by the present inventors, it was found that the hardness of the bonding portion which is a Vickers hardness of 200 Hv or less, preferably 20 Hv to 200 Hv, is particularly effective for room-temperature bonding (see FIG. 1).

FIG. 1 illustrates the result of a bonding strength comparison experiment regarding the hardness of the bonding portion. A surface activating treatment was performed under the following experiment conditions: Ar plasma was used as an energy wave; and irradiation was performed with an intensity of 100 W for 30 seconds. After the surface activating treatment, objects to be bonded were bonded together in an Ar atmosphere by pressing. As a result, bonding was defective when the bonding portion was a Ni plating having a hardness of 300 Hv or a chromium plating of 600 Hv. When copper, gold, or Al, which are metals having a Vickers hardness of 200 Hv or less, were used as the bonding portion, a satisfactory level of bonding strength was obtained. A more limited region, i.e., a Vickers hardness range of 20 Hv to 200 Hv (connected with a curve line in FIG. 1) is considered as a satisfactory bonding region. Note that a region where bonding was achieved with a strength of 30 g/bump or more corresponding to 80% of the maximum strength was determined to be a satisfactory bonding region, and a region where bonding was achieved with a strength of 15 g/bump or less was determined to be defective bonding. When a wafer or the like is subjected to surface bonding, the strength is represented by a tensile strength. In this case, bonding may be determined to be satisfactory when the strength is 20 MPa or more, and to be defective when the strength is 10 MPa or less.

In the case of gold and copper, bonding was able to be achieved even in the atmospheric air if bonding was performed immediately after a plasma treatment. Particularly in the case of gold, the same level of bonding strength remained in an Ar atmosphere even after one-hour exposure in the atmospheric air. It was also found that, when objects to be bonded are bonded together, the objects to be bonded can be more firmly bonded together by applying a pressure of 150 Mpa or more to the objects to be bonded using a pressing means. In this case, when the metal constituting the bonding portion is gold, copper, or Al, bonding was able to be particularly effectively achieved.

Assuming that objects to be bonded are formed of different materials, when these different materials are melted and diffused so as to perform bonding, the resultant bonding is brittle, or weak in terms of the material. Therefore, when the present invention is applied to this case, the present invention is particularly effective since bonding can be achieved in a solid phase. When an object to be bonded is melted, the melted metal is not uniformly spread. In this case, when the object to be bonded is solidified, a portion containing a larger amount pulls a portion containing a smaller amount, resulting in a position error. Therefore, bonding in a solid phase is effective.

Note that a process of performing surface activation with respect to objects to be bonded using an energy wave and a process of bonding the objects to be bonded may be performed in respective separate apparatuses, or in an integrated apparatus having a function of performing both the processes.

An energy wave emitting means for generating the energy wave may be provided (claim 27). In this case, regarding the energy wave of the invention of claim 26, it is assumed to use a means provided outside the apparatus. However, with the configuration of claim 27, it is possible to perform a batch process from the surface activating treatment of objects to be bonded using the energy wave to the bonding process of the objects to be bonded. As a result, for example, it is possible to perform the surface activating treatment and the bonding process in a single chamber, thereby making it possible to save the space of the apparatus.

In the bonding method and the bonding apparatus, during the time from the surface activating treatment to the bonding process of the objects to be bonded, the objects to be bonded may not be exposed to the atmospheric air. With this configuration, the surface activating treatment of objects to be bonded to the bonding process are performed without exposure of the objects to be bonded to the atmospheric air, thereby preferably making it possible to prevent airborne matter or the like from readhering to the objects to be bonded after surface activation of the objects to be bonded.

A batch process from the surface activating treatment to the bonding process of objects to be bonded may be performed in the bonding apparatus. By performing the batch process from the surface activating treatment to the bonding process of objects to be bonded, it is possible to prevent airborne matter or the like from readhering to the objects to be bonded. In addition, if the surface activating treatment and the bonding process of objects to be bonded are performed in the same chamber, it is possible to further prevent airborne matter or the like from readhering to the objects to be bonded, and at the same time, it is possible to achieve a compact size and a reduction in cost of the bonding apparatus.

The bonding portion may be formed of gold (claims 2 and 28). With this configuration, particularly, gold has a low hardness and is not oxidized in the atmospheric air, so that it has less adhering substances. Thus, gold is an effective metal. As described below, bonding can be achieved even if it is performed within several hours after exposure to the atmospheric air.

The bonding portion of the object to be bonded may be formed by forming a gold film on a surface of a base material having a hardness of 200 Hv or less, and after the objects to be bonded are bonded together, the gold film may be diffused into the base material (claims 3 and 29). Thus, if the bonding surface (a surface of the bonding portion) is formed of gold, it is difficult for organic substances or the like to readhere to the bonding surface after the energy wave treatment, and therefore, bonding can be achieved in the atmospheric air. If the gold film is diffused into the base material after the objects to be bonded are bonded together, the base materials are bonded together after bonding. Therefore, bonding can be achieved using a uniform material having a high strength. Regarding a method for diffusion, diffusion can be achieved even at room temperature though it takes a long time. Diffusion can be accelerated by heating even at low temperature. Note that diffusion indicates that particles formed of molecules or atoms move or spread, and particles spread in an opposing material or a base material at a bonding interface.

In the bonding method and the bonding apparatus, gold or gold film constituting the bonding portion of at least one of the objects to be bonded may be caused to have a hardness of 100 Hv or less by annealing. As described above, in order to crush the bonding portion for copying, the bonding portion hardness is preferably reduced and softened. Therefore, the hardness of gold plating, which is typically 120 Hv or more, is preferably reduced to 100 Hv or less by annealing, more preferably 60 Hv or less.

The object to be bonded may be a semiconductor or a MEMS device in which the bonding portion comprises a plurality of metal bumps formed by forming a gold film on a surface of the base material (copper), and after the objects to be bonded are bonded together, the gold film is diffused into the base material (claims 4 and 30). In an electronically functioning device of a semiconductor or a MEMS device, it is desired to change conventional Al electrodes to copper electrodes in terms of current-carrying capacity. However, it is practically difficult to use a copper bump because of its high bonding temperature. Therefore, by covering a surface of a base material formed of copper with a gold film, bonding can be achieved at low temperature in gas or in the atmosphere which are not vacuum. Thereafter, if gold is allowed to diffuse into the base material, the coppers are bonded, thereby achieving the purpose.

The energy wave may be a low-pressure plasma (claims 5 and 31). If the energy wave treatment is assumed to be performed using an ion beam or an atom beam, a high vacuum atmosphere of about $10^{-8}$ Torr is required, resulting in a load to the equipment. By using a plasma, the energy wave treatment can be achieved with the degree of vacuum of about $10^{-2}$ Torr, resulting in a simple equipment. As a result, it leads to a compact size and a reduction in cost of the apparatus. It is more preferable to use Ar as reaction gas for generating plasma, since Ar is inert and has a high etching capability. Also, it is preferable to reduce the pressure to $10^{-3}$ Torr or less in order to remove the reaction gas or etched matter after or during cleaning (energy wave treatment) of the object to be bonded. In order to remove the reaction gas, such as Ar implanted into the bonding surface (bonding portion) of the object to be bonded, or the like, heating can be performed at about 100 to 180° C. as well.

In the bonding method, at least one of the objects to be bonded may be a semiconductor, and the bonding portion of each of the objects to be bonded may be subjected to plasma cleaning using the low-pressure plasma which is generated with electric field having alternating + and − directions generated by an alternating power supply before the objects to be bonded are bonded together in a solid phase at room temperature (claim 6).

In the bonding apparatus, at least one of the objects to be bonded may be a semiconductor, and the bonding portion of each of the objects to be bonded may be subjected to plasma cleaning using the low-pressure plasma which is generated with electric field having alternating + and − directions generated by an alternating power supply before the objects to be bonded are bonded together in a solid phase at room temperature (claim 32).

For example, assuming that at least one of the objects to be bonded is a semiconductor, if + ions or − electrons strike a circuit surface of the semiconductor, charge-up damage occurs with respect to the circuit, particularly a gate oxide film or the like. To avoid this, the + ion and the − electron are caused to alternately strike so as to neutralize before accumulating charge. Thereby, it is possible to avoid charge-up damage. If adhering substances are removed by etching from the bonding surface by plasma, resulting in surface activation, bonding of a metal, Si, or an oxide can be achieved at low temperature in a solid phase.

In the bonding method and the bonding apparatus, the alternating power supply may be changed evenly at more than 1:5. If the ratio of alternately changing is even more than 1:5, charge-up damage can be reduced. More preferably, the ratio is even more than 1:2.

Regarding the alternating power supply, Vdc is a negative (−) value, and the + region accounts for 20% to 40% in the bonding method and the bonding apparatus. Ar or oxygen plasma, or the like is a + ion. Therefore, in order to accelerate the + ion to strike and etch a surface to be cleaned, an electrode holding an object to be bonded needs to have − electric field. Therefore, the value Vdc is preferably negative (−). Here, Vpp indicates peak-to-peak of an alternating current waveform of a voltage, and Vdc indicates a bias voltage which is an offset value from a voltage value of 0 V which is the center of Vpp.

The alternating power supply is an RF plasma generating power supply capable of controlling a value of the bias voltage Vdc (claims 7 and 33). When the + and − of the alternating power supply are excessively even, the chance of strike of + ions is reduced, resulting in a reduction in cleaning capability (surface activating capability). Also, charge-up damage occurs due to − electrons. Therefore, preferably, when the value of Vdc can be adjusted to an optimum value for each application, optimum cleaning capability can be exhibited without causing charge-up damage.

When an RF plasma generating power supply which provides an alternating current as illustrated in FIG. 26 is used as an alternating power supply, electric field can be alternately switched between + and −. By adjusting the value of Vdc, the ratio of + and − can be easily adjusted.

The alternating power supply may be a pulsed wave generating power supply capable of controlling a pulse width (claims 8 and 34). As the alternating power supply, a pulsed wave generating power supply illustrated in FIG. 27 can be used. If a pulsed wave is used, steep rising and falling can be obtained, thereby increasing cleaning capability.

By adjusting a pulse width or interval as illustrated in FIG. 28 in addition to the adjustment of the value of Vdc, the ratio of + and − or the strike time can be managed. Therefore, finer setting can be achieved than when an alternating RF plasma generating power supply is used, so that it is easier to find an optimum value.

The degree of vacuum is preferably $10^{-3}$ Torr or less during, before, or after plasma cleaning (energy wave treatment). In order to remove impurities, cleaning is preferably performed after reducing the pressure to $10^{-3}$ Torr or less. Also, it is preferable to reduce the pressure to $10^{-3}$ Torr or less in order to remove the reaction gas or etched matter after or during cleaning of the object to be bonded. In order to remove the reaction gas, such as Ar implanted into the bonding surface, heating can be performed at about 100 to 180° C. as well. During the cleaning, reaction gas may be supplied from one side of the object to be bonded and the reaction gas may be sucked from the other side. With this configuration, it is possible to flow the reaction gas on the bonding surface in one direction. Therefore, adhering substances scattered during plasma cleaning can be efficiently removed, thereby making it possible to effectively suppress removed matter from readhering to the object to be bonded.

The head and the stage of the present invention each comprise an object-to-be-bonded holding means. In order to achieve uniform bonding without unbalanced bonding, an elastic material is preferably provided on a surface of at least one of the object-to-be-bonded holding means, and pressing is preferably performed via the elastic material with respect to both objects to be bonded when the objects to be bonded are bonded together. In the bonding method of the present invention, since metal bonding is performed in a solid phase (i.e., bonding is not performed using melted solder), bonding can be achieved only at a contact portion if the parallelism or the flatness is not sufficient between the objects to be bonded. Therefore, an elastic material may be provided on a surface of at least one of the objects-to-be-bonded holding means, and pressing may be performed via the elastic material with respect to both the objects to be bonded. Thereby, it is possible to increase the parallelism of the objects to be bonded. Also, it is possible to increase the flatness if an object to be bonded is thin Also, after the objects to be bonded are contacted with each other, an elastic material may be inserted between the object to be bonded and the object-to-be-bonded holding means.

At least one of the object-to-be-bonded holding means is preferably held by a spherical bearing, and objects to be bonded are preferably contacted and pressed by each other during or before bonding so that the tilt of at least one of the objects to be bonded can match the tilt of the other. The object-to-be-bonded holding means may be held on the stage and/or the head via a spherical bearing, and the objects to be bonded may be contacted and pressed by each other during or before bonding so that the tilt of at least one of the objects to be bonded can match the tilt of the other. With such a configuration, bonding can be performed after increasing the parallelism of the objects to be bonded (see FIG. 29). The spherical bearing may have a lock mechanism which selects lock/free, and is normally in a locked state, and when copying, is in a free state. The spherical bearing can be locked after the parallelism is once increased, and while holding this state, objects to be bonded can be subjected to a plasma treatment (energy wave treatment) and alignment, followed by bonding. Therefore, since alignment is performed after increasing the parallelism, the objects to be bonded can be preferably bonded together without a position error.

In the method and the bonding apparatus, an ultrasonic vibration head comprising a horn, a horn holding section, and an oscillator may be provided, and ultrasonic vibration having an amplitude of 2 μm or less may be applied to objects to be bonded in the atmospheric air during bonding, so that metal bonding is performed in a solid phase, where a load is 150 MPa or less and heating is at 180° C. or less. When bonding is performed in the atmospheric air, bonding is more easily achieved by applying ultrasonic vibration. Since surface activation has already been performed, only a small level of ultrasonic energy is required, i.e., an amplitude of 2 μm or less which can suppress damage and position error, is sufficient. More preferably, the amplitude is 1 μm or less. Also, by applying ultrasonic waves, a bonding load can be reduced by half, i.e., to 150 MPa or less. When bonding is performed with respect to a metal (gold) protrusion, bonding can be achieved using a pressing force of as high as about 300 MPa at room temperature. If a bump is present on a semiconductor circuit surface, some circuits are generally damaged with 200 MPa or more. Experiments were conducted under the following conditions: a gold bump (metal protrusion) having 50 μm square and 20 μm in height is provided on a semiconductor chip, where a variation in bump height is 1 μm, and the semiconductor chip is bonded onto a thin gold film substrate using ultrasonic waves (ultrasonic bonding) or at room temperature (room-temperature bonding). In the case of the room-temperature bonding, bonding was achieved when the load was 80 g/bump or more. In the case of the ultrasonic bonding, bonding was achieved when the load was 40 g/bump or more. Therefore, the bump needs to be crushed by 1 μm or more as a crushed bump amount. When a bump having a height of 20 μm is produced by gold plating, the lower limit of a variation in height is 1 μm. Therefore, it is necessary to crush the bump in such an amount.

Between the cleaning in a reduced pressure and the bonding in the atmospheric air, at least one of the objects to be bonded is transported into a cleaning chamber, which is linked to a transport means for transporting the objects to be bonded to a bonding section after cleaning, and the next objects to be bonded are cleaned during bonding. Objects to be bonded whose bonding surfaces are formed of gold or copper can be previously separately surface-activated by a plasma treatment in a vacuum chamber, and can be removed into the atmospheric air, followed by bonding. The cleaned objects to be bonded are transported to a bonding section by a transport means, and the next objects to be bonded are cleaned during bonding. Therefore, cleaning can be performed parallel to bonding, thereby making it possible to save time. When balance is not attained on a one-by-one basis, a plurality of objects to be bonded may be placed on a tray or the like and may be simultaneously cleaned. When a continuous object to be bonded is provided on a reel, the object to be bonded may be seized via a packing by a chamber door so as to be subjected to a plasma treatment.

The bonding portion of at least one of the objects to be bonded may have a surface roughness Ry of 120 nm or more (claims 9 and 35). As used herein, the surface roughness indicates minute irregularities in a predetermined area, excluding undulating pattern. For example, the surface roughness is represented by a highest value and a smallest value of minute irregularities in 10 μm². As described in Patent Document 1, by cleaning objects to be bonded in a vacuum using an energy wave, adhering substances, such as organic substances, oxide film, or the like, is removed from the bonding surface, and the objects to be bonded can be directly bonded together if it is performed in a vacuum. However, after cleaning, if bonding is performed in the atmospheric air or a low vacuum which have much airborne matter, an adhering substance layer is formed on the bonding surface, so that the objects to be bonded cannot be bonded if they are directly contacted with each other. However, since the adhering substance layer is thin immediately after cleaning, bonding can be achieved by the following method. This is because, as illustrated in FIG. 2A, by providing minute irregularities on the bonding surface, the convex portions are crushed by pressing to be spread, so that a new surface appears and bonding is achieved (see FIG. 2B). When viewed microscopically, crystal orientations arranged as illustrated in FIGS. 3A and 3B are rotated by the convex portion being crushed, so that the new surface appears. As can be seen from FIG. 4, when the surface roughness (minute irregularities) is 120 nm or more, a sufficient bonding strength is obtained. This is measured as follows. Metal protrusions (a plurality of bumps) are provided on an object to be bonded, a shear strength is measured after bonding, and a shear strength per bump is indicated. A bump which was formed of gold plating and was 40 μm square and 15 μm in height, was used. As a guide, a sufficient shear strength was assumed to be 30 g/bump corresponding to 80% of a maximum strength.

In the bonding method and the bonding apparatus, at least one of the bonding surfaces preferably has a surface roughness Ry of 120 nm or more and 2 μm or less. If irregularities on the bonding surface (bonding portion) of the object to be bonded are excessively large, a contact area becomes small since the maximum crushed amount is not more than about several micrometers, resulting in a reduction in bonding strength. As illustrated in FIG. 4, if the surface roughness is 2 μm or more, a sufficient bonding strength is not obtained. Thus, it is found that the surface roughness is preferably 120 nm or more and 2 μm or less.

In the bonding method and the bonding apparatus, the bonding surface of the object to be bonded may be a plurality of metal protrusions, and the tip may be in a convex shape. In the case where surfaces are bonded together, even when a plurality of convex-shaped bonding portions are used so as to cause the micro irregularities to be effective as described above, the bonding area is smaller than that of surface bonding, but a similar effect is obtained.

In the bonding method and the bonding apparatus, Ar plasma (reaction gas: Ar gas) may be used as an energy wave when objects to be bonded are subjected to a surface activating treatment, and the bonding surfaces of the objects to be bonded may be etched using the Ar plasma to roughen the bonding surfaces. When Ar plasma is used to clean a bonding portion, a rough bonding surface is obtained by setting a cleaning time to be longer (e.g., three minutes, where an ordinary time is 30 seconds). The roughness can be effectively caused to be 120 nm or more.

The bonding method may comprise a head for holding one of the objects to be bonded, a stage for holding the other object to be bonded, and a vertical drive mechanism for performing a position control with respect to at least one of the head and the stage in a direction substantially perpendicular to the bonding surface of the object to be bonded, and performing a pressing control, wherein, when the objects to be bonded are bonded together, during the bonding, the vertical drive mechanism may be driven to press the objects to be bonded, and thereafter, the vertical drive mechanism may be stopped to hold a constant height of the head from the stage for a predetermined time (claim 10).

In the bonding apparatus, the vertical drive mechanism may be capable of performing a position control with respect to at least one of the head and the stage in a direction substantially perpendicular to the bonding surface of the object to be bonded, and when the objects to be bonded are bonded together, during the bonding, the vertical drive mechanism may be driven to press the objects to be bonded, and thereafter, the vertical drive mechanism may be stopped to hold a constant height of the head from the stage for a predetermined time (claim 36).

As used herein, the height of the head from the stage indicates a distance between objects to be bonded during a process which presses an object to be bonded held by the head against an object to be bonded held by the opposing stage to microscopically crush the bonding portion. To keep constant the height of the head from the stage means to keep constant the distance between the objects to be bonded. In the case where the objects to be bonded are bonded, when pressing is instantaneously performed with respect to the objects to be bonded, irregularities of the bonding surface are elastically deformed, so that crystal at the interface may not be rotated. Also, the elastic deformation remains as residual stress which acts in a direction which causes the object to peel off, rather than bonding force, resulting in a reduction in bonding strength. Regarding a method for preventing this, the head height is kept constant for a predetermined time, so that the crystal cannot endure a load at the bonding interface as viewed microscopically, and therefore, crystal orientations are rotated or particles are moved. As a result, a new surface appears and bonding is performed, and the movement of particles removes the residual stress. During the pressing control, the height is being more and more reduced, and elastic deformation invariably occurs, so that the crystal orientation is not displaced. However, if the height remains constant, the crystal orientation starts being displaced from the elastic deformation, and successively collapses over time. Thereby, a new surface appears, contributing to bonding.

In the bonding apparatus, a head height detecting means may be provided in the head section positioned at a tip of the vertical drive mechanism so as to control the height when the head is stopped. A head height detecting means may be provided so as to keep constant the head height of the order of submicrons. When viewing the bonding interface microscopically, in the elastically deformed bonding interface, elastic deformation is released due to rotation of crystal orientations or movement of particles. If an elastically deformed portion coincides with a ball or the like of a bolt-nut mechanism of a Z lifting/lowering mechanism (vertical drive mechanism), the elastic deformation mode is caused by further pressing even when a drive motor is stopped. To avoid this, a height detecting means is provided to the head section so as to keep constant the height of the order of submicrons. Thereby, elastic deformation is gradually released, leading to an increase in bonding strength. FIG. 5 illustrates an increase in bonding strength after the head is stopped.

Note that the head structure capable of a pressing control and a position control can be composed of a ball screw in which pressure detecting means are arranged in series, and a servo motor. The head structure can also be composed of a cylinder in which a position detecting means is provided, and a servo valve, thereby making it possible to perform a pressing control and a position control. Note that the present invention is not limited to this, and any pressing means and position control means may be used as long as a pressing control and a position control can be achieved.

In the bonding method and the bonding apparatus, the stop time may be one second or more. Regarding the stop time, as illustrated in FIG. 5, an effect was obtained in the case of one second or more, and a change did not occur in the case of two minutes or more, depending on the material or the bonded state.

In the bonding method and the bonding apparatus, a heating means may be provided so as to heat at 180° C. or less when the head is stopped. By heating when the head is stopped, rotation of crystal orientations or movement of particles is efficiently performed, so that bonding is developed and residual stress is removed, resulting in an increase in bonding strength. FIG. 6 illustrates heating temperature and bonding strength when the head is stopped. Regarding heating temperature, low-temperature heating at 180° C. or less was sufficient.

In the bonding method, after the bonding portion of at least one of the objects to be bonded is subjected to leveling, the bonding portion of each of the objects to be bonded may be treated with the energy wave, and thereafter, the objects to be bonded may be bonded together in a solid phase at room temperature (claim 11).

In the bonding apparatus, after the bonding portion of at least one of the objects to be bonded is subjected to leveling, the bonding portion of each of the objects to be bonded may be treated with the energy wave, and thereafter, the objects to be bonded may be bonded together in a solid phase at room temperature (claim 37).

With this configuration, as illustrated in FIG. 7, room-temperature bonding can be achieved by pressing even in the atmospheric air if the objects to be bonded are not allowed to stand after dry cleaning (energy wave treatment). This may be because, although a thin attached layer is formed on the bonding surface, the layer is so thin that it can be crushed by pressing. When bonding is performed at room temperature, a load about two times higher than when heating is performed is required to crush and contact bumps. However, in the case of leveled bumps, a sufficient bonding strength can be obtained using a pressing force of 150 MPa, while a pressing force of 300 MPa is required when leveling is not performed. This is because it is necessary to crush a roughness or the like of the bonding surfaces of objects to be bonded so as to certainly contact the objects to be bonded together, and thus a pressing force is required depending on a variation in the bump height or the magnitude of the surface roughness. In the case of an ordinary bump, the height variation was 2 μm. However, after performing leveling, both the height variation was 120 nm or less. Therefore, it is considered that the bonding load was able to be reduced. As used herein, the leveling, with reference to the surface roughness of the bump surface of FIG. 8 and the variation in height between each bump of FIG. 9, indicates that the height or surface roughness of a bump is corrected to be uniform by pressing the bump against a smoothing means, such as a reference support or the like, having a high flatness as illustrated in FIG. 10. After leveling, as illustrated in FIG. 11, the objects to be bonded are bonded together. Although a chip having a bump and a substrate having a pad are illustrated in this example, other objects to be bonded may be used.

The leveling may be performed using an opposing object to be bonded before the objects to be bonded are bonded together (claims 12 and 38). With this configuration, since leveling is performed using an opposing object to be bonded, leveling can be achieved to fit features (irregularities) of the surface of the object to be bonded. Therefore, it is possible to reduce a bonding load for an object to be bonded having a low flatness. For example, in the case of a build-up substrate having wiring layers stacked up, a slight difference occurs in the height of an upper electrode pad, depending on a lower wiring pattern.

In the bonding method and the bonding apparatus, both objects to be bonded may have a metal bump (bonding portion), and the metal bumps may be bonded together after leveling. Preferably, when both the objects to be bonded are leveled, the bonding surfaces are contacted with each other without irregularities, resulting in a further reduction in bonding load. The bonding load was able to be reduced to 100 MPa or less as measured in FIG. 7.

In the bonding method, in a chamber having a reduced pressure, while the bonding surfaces of the objects to be bonded are not placed facing each other, the bonding portions may be treated with the energy wave, and thereafter, at least one of the objects to be bonded may be moved so that the bonding surfaces are placed facing each other, and thereafter, at least one of the objects to be bonded may be moved in a direction substantially perpendicular to the bonding surface to contact the bonding portions with each other, and bond the objects to be bonded together in a solid phase (claim 13).

The bonding apparatus may comprise, in a vacuum chamber, the head, the stage, the vertical drive mechanism, and a moving means for moving at least one of the head and the stage in a side direction, wherein the energy wave emitting means may be capable of performing the energy wave treatment with respect to each of the objects to be bonded separately. In the vacuum chamber having a reduced pressure, while the moving means causes the bonding surfaces of the objects to be bonded not to be placed facing each other, the bonding portions may be treated with the energy wave, and thereafter, at least one of the objects to be bonded may be moved so that the bonding surfaces are placed facing each other, and thereafter, at least one of the objects to be bonded may be moved by the vertical drive mechanism in a direction substantially perpendicular to the bonding surface to contact the bonding portions with each other, and bond the objects to be bonded together in a solid phase (claim 39).

Conventionally, when an energy wave treatment is performed while both objects to be bonded are placed facing each other, adhering substances etched on one of the objects to be bonded readhere to the other. Therefore, in the present invention, while the bonding surfaces of the objects to be bonded are not placed facing each other, the bonding portions are subjected to the energy wave treatment, and thereafter, the objects to be bonded are shifted to a position where they face each other, followed by bonding. Thereby, it is possible to prevent the above-described adhering substances from readhering. By performing plasma cleaning (treatment) while the stage is slid to a standby position, etched adhering substances are prevented from being scattered to an opposing surface and readhering to the other object to be bonded.

In the bonding method and the bonding apparatus, the degree of vacuum may be $10^{-3}$ Torr or less during the plasma cleaning (treatment). Preferably, when the degree of vacuum is $10^{-3}$ Torr or less, scattered matter strikes ions so that the direction is changed, resulting in a reduction in probability of readhering.

In the bonding method and the bonding apparatus, a gap between the objects to be bonded after being slid to the bonding position may be 20 mm or less. Conventionally, plasma generation requires at least about 30 mm between the upper and lower objects to be bonded. Therefore, when the head is lowered, a position error occurs irrespective of alignment due to the tilt or play of the Z axis (vertical drive mechanism). However, by generating a plasma on each of the head and the stage while the stage is slid to the standby position, the movement distance of the Z axis can be minimized, so that the distance between the objects to be bonded can be set to be 20 mm or less which is smaller than conventional 30 or less. More preferably, the distance can be set to be 5 μm or less. When the distance is suppressed to several micrometers or less, an error due to the tilt of the Z axis is negligible, so that an error in a horizontal direction due to the Z movement can be minimized in proportion to the movement amount.

Since plasma can be generated after the objects to be bonded are slid, a metal is provided on a surface opposed to the object to be bonded, and the metal is used as a plasma electrode, so that the metal is sputtered on the surface of the object to be bonded, and a thin film is formed. By providing a metal film on the surfaces of both the objects to be bonded by sputtering, the metals can be bonded together. As a result, Al, ceramics, oxides, and the like can be used which are difficult to achieve bonding by conventional surface activation, so as to achieve bonding. When the bonding surface of the object to be bonded is previously etched and cleaned using the object to be bonded as a plasma electrode before the above-described sputtering, bonding can be more easily achieved. Alternatively, while the objects to be bonded are placed facing each other after being slid, one object to be bonded having a metal surface can be used as an electrode and sputtered with respect to the other object to be bonded. Particularly, it is suitable when one object to be bonded has a metal, such as gold or copper, which can easily allow bonding, and the other has a material which is difficult to achieve bonding.

When the bonding portion is treated with the energy wave, a metal electrode may be provided at a position facing the bonding surface of at least one of the objects to be bonded, a metal film including a metal forming the metal electrode may be formed on the bonding surface of the object to be bonded by sputtering, and the objects to be bonded may be bonded together in a solid phase (claims 14 and 40).

In the bonding method and the bonding apparatus, a metal film may be formed on the bonding surface of the other object to be bonded formed of a hard metal (Ni, etc.), an oxide, Si, or a ceramic, and the metals may be bonded together in a solid phase. A metal to be sputtered is provided at a position facing the bonding surface of the object to be bonded, and the metal is irradiated with an energy wave, so that the metal is sputtered onto the surface of the object to be bonded and a thin film is formed. If a metal film is sputtered onto the surfaces of both the objects to be bonded, the metals can be bonded together in a solid phase. A hard metal (Ni, etc.), a ceramic, an oxide, Si, and the like which are difficult to achieve bonding by conventional surface activation can be used to achieve bonding. When the energy wave is a low-pressure plasma, sputtering can be performed by using the metal as the plasma electrode. When the bonding surface of the object to be bonded is etched and cleaned (energy wave treatment) by using the object to be bonded as the plasma electrode before sputtering, bonding can be easily achieved. Alternatively, while the objects to be bonded are placed facing each other, one object to be bonded having a metal surface is used as an electrode, so that sputtering can be performed with respect to the opposing other object to be bonded. Particularly, it is suitable when one object to be bonded has a metal formed of gold or copper which easily achieve bonding, and the other object to be bonded is formed of a material which is difficult to achieve bonding.

In the bonding method and the bonding apparatus, when surface activation is performed using an energy wave, the surface metal formed of gold or copper of one object to be bonded may be sputtered to form a metal film formed of gold or copper on the bonding surface of the other object to be bonded, and room-temperature bonding may be achieved in a solid phase in the atmospheric air. When the metal to be sputtered is gold or copper, room-temperature bonding can be achieved in a solid phase in the atmospheric air.

The bonding portion may be formed in the shape of a contour, the bonding portion is surface-activated with the energy wave, and thereafter, the objects to be bonded may be bonded together in a solid phase at room temperature, so that space surrounded in the shape of contour by the bonding portions may be formed between the bonding surfaces of the objects to be bonded to enclose a predetermined atmosphere in the space (claims 15 and 41). With this configuration, when the bonding portion is formed of a metal, the objects to be bonded can be bonded together in a solid phase at low temperature ranging from room temperature to 180° C. after performing etching using an energy wave (surface activating treatment). As compared to solder which conventionally allows metal bonding at low temperature, bonding can be achieved at 183° C. (the melting point of solder) or less, even 150° C. or less. The objects to be bonded can be bonded in a vacuum atmosphere or in a filling gas atmosphere. Thereby, the steps of bonding, evacuation, gas replacement, and enclosing can be performed in one process using a single apparatus. In addition, since the surface (bonding portion) is activated by etching using an energy wave, and bonding is performed by atomic force, bonding can be achieved at room temperature. Although the bonding strength is increased by heating at about 150° C. as well, room-temperature bonding can achieve a bonding strength higher than that of conventional heating-diffusion bonding. Note that the surface activation treatment of the objects to be bonded using an energy wave and the process of bonding the objects to be bonded together may be performed by respective separate apparatuses.

In the bonding method and the bonding apparatus of the present invention, the surface activating treatment to the bonding may be performed without exposing the objects to be bonded to the atmospheric air. With this configuration, since the surface activation to the bonding is performed without exposure to the atmospheric air, it is preferably possible to prevent airborne matter from readhering to the objects to be bonded after the surface activation.

In the bonding apparatus of the present invention, the surface activation to the bonding may be performed as a batch process. By performing the surface activation to the bonding of the objects to be bonded as a batch process, it is possible to further prevent airborne matter from readhering. If the surface activation and the bonding are performed in the same chamber, it is possible to further prevent airborne matter from readhering, and at the same time, a compact size and a reduction in cost can be achieved.

If the bonding portion is formed of gold, the bonding portion is not corroded or gas is not generated. Therefore, gold is preferable as an enclosing material for enclosing an atmosphere. Also, since gold has a considerably high melting point, gold has a high level of reliability at high temperature after bonding is performed at low temperature in a solid phase. Thus, when gold is used, bonding can be achieved in the atmospheric air or in filling gas if it is performed within a predetermined time after surface activation. In the present invention, gold may be used only in the bonding surface. Regarding a portion which requires a high height, a soft material can be selected as the base material of the bonding portion.

The bonding portion may be formed of gold, or a gold film on a surface of a base material having a hardness of 200 Hv or less, and the gold or the gold film constituting the bonding portion of at least one of the objects to be bonded may be a gold plating having a thickness of 1 μm or more (claims 16 and 42). With this configuration, regarding a method for absorbing the undulating pattern or surface roughness of the bonding surface (bonding portion) of an object to be bonded, gaps can be filled by at least one of the bonding surfaces being crushed by a certain height, resulting in copying. Therefore, the gold of one object to be bonded is effectively plated to 1 μm or more.

Bonding is performed in a vacuum, so that a vacuum atmosphere is enclosed in the space (claims 17 and 43). With this configuration, the bonding method for the objects to be bonded is etching (surface activating treatment) for the bonding portion in a vacuum using an energy wave. Therefore, it is preferably possible to easily enclose a vacuum atmosphere in the space. Also, if the surface activation and the bonding are performed in the same chamber, bonding is preferably performed directly in the vacuum atmosphere of the surface activation.

After the surface activation of the bonding portion, a vacuum state of a reduced pressure chamber may be replaced with filling gas, and the objects to be bonded may be bonded in the filling gas to enclose the filling gas atmosphere in the space (claims 18 and 44).

The bonding portion which is formed of gold is not corroded and adhesion of foreign matter is suppressed for a predetermined time even if bonding is not performed in a vacuum or in inert gas. Therefore, there is not an influence on bonding even if bonding is not performed in a vacuum. Therefore, other gases as well as inert gas can be preferably applied to the present invention.

Note that the filling gas may be Ar or nitrogen in the bonding method and the bonding apparatus. Preferably, if the filling gas is Ar or nitrogen, there is not an influence (corrosion, etc.) on the device. If the filling gas is Ar, a reaction gas atmosphere used for bonding is preferably used directly.

Regarding the surface activating treatment using an energy wave, since adhering substances present on the surface of the object to be bonded adhere by 1 nm or more for several seconds if the surface is exposed to the atmospheric air after wet cleaning, it is effective to etch by at least 1 nm or more.

In the bonding method and the bonding apparatus of the present invention, gold included in the bonding portion of at least one of the objects to be bonded may be annealed to have a hardness 100 Hv or less.

As described above, it is preferable to reduce and soften the hardness of the bonding portion so as to crush and cause the bonding portion to perform copying. Therefore, the hardness of gold which is normally 120 Hv or more is caused by annealing to be 100 Hv or less. Also, 60 Hv or less is more preferable.

Preferably, if the object to be bonded is a wafer, a plurality of devices can be simultaneously bonded together with a batch process. The wafer is diced into pieces after bonding.

In the bonding method and the bonding apparatus of the present invention, the object to be bonded may be a device including a surface elastic wave device, a RF device, or the like. A semiconductor device including a semiconductor device, a surface elastic wave device, a RF device, and the like, a MEMS device having a mechanical movable portion, and the like particularly require enclosing. Also, these are susceptible to heat, and are formed of a combination of different materials. Therefore, a distortion occurs due to thermal expansion, and these devices cannot endure bonding at high temperature. Therefore, the present invention is preferable to these devices. There is not a conventional bonding method at 200° C. or less for these devices which is susceptible to gas from a resin or moisture. Also, since these devices have vibrating surfaces and MEMS has a mechanically moving actuator, it is not possible to perform attachment using a resin, and direct bonding is required. Therefore, the present invention is preferable to these devices. As a form, attachment by handling on a wafer during a semiconductor production process is most effective, and the present invention is also suitable for a chip state after dicing.

The objects to be bonded may be bonded together in the atmospheric air (claims 19 and 45). With this configuration, since the adhering substance layer is thin immediately after the surface activating treatment, the bonding interface is spread by crushing the adhering substance layer so as to perform bonding, so that a new surface appears on the bonding surface, and the objects to be bonded are bonded together even in the atmospheric air. Regarding time, after the surface activating treatment, particularly in the case where the bonding portion is formed of gold, it is difficult for oxides, organic substances, and the like to readhere, and therefore, bonding is easily achieved if it is performed within one hour.

According to experimental results, required heating temperature depends on an elapsed time after the energy wave treatment of the bonding portion, the type of gas, a moisture content (humidity). If mounting (bonding) is performed within one hour after exposure to the atmospheric air, bonding was able to be achieved by heating at 100° C. or less. In the bonding method, although bonding is performed in a solid phase, metal molecules are directly coupled with each other on the bonding surface. Therefore, even if heating is performed at high temperature (e.g., 350° C.) after bonding, the metal molecules are only diffused, and the bonding strength does not decrease, or the resistance value does not increase. Thus, high reliability is obtained even at high temperature.

One of the objects to be bonded may be an electrically functioning device which employs the bonding portion as an electrode, and the bonding portion may have a surface formed of gold or copper, the bonding portion of the object to be bonded may be cleaned with the energy wave, and thereafter, an attached layer may be formed on the bonding portion using gas, the bonding portions including an metal electrode may be contacted with each other in the atmospheric air, the positions of the objects to be bonded may be adjusted to optimum positions while the device is caused to electrically function, and thereafter, the objects to be bonded may be bonded together in a solid phase at room temperature (claim 20).

One of the objects to be bonded may be an electrically functioning device which employs the bonding portion as an electrode. The bonding apparatus may comprise the head for holding the functioning device, the stage for holding the other object to be bonded, the vertical drive mechanism for vertically moving at least one of the head and the stage, a probe for causing the functioning device to electrically function, a recognizing means for recognizing a function of the functioning device, and an alignment table for correcting relative positions of the functioning device and the object to be bonded. The bonding portion may have a surface formed of gold or copper, the bonding portion of the object to be bonded may be cleaned with the energy wave, and thereafter, an attached layer may be formed on the bonding portion using gas, the bonding portions including an metal electrode may be contacted with each other in the atmospheric air, the positions of the objects to be bonded may be adjusted to optimum positions while the device is caused to electrically function, and thereafter, the objects to be bonded may be bonded together in a solid phase at room temperature (claim 46).

In order to mount a functional device while adjusting the position thereof with high efficiency and high accuracy, it is effective to perform metal bonding with respect to a metal electrode by heating after performing position adjustment while the functional device is being directly caused to electrically function, where a metal electrode is contacted during mounting. As in conventional techniques, once an alignment mark is used instead, an error is included and the efficiency is reduced due to complication. Therefore, the surface of the bonding portion of the functional device (object to be bonded) is formed of gold or copper, both bonding surfaces are treated with an energy wave, such as an atom beam, an ion beam, or a plasma, in a vacuum, and thereafter, an attached layer is attached to the bonding portion using gas, the bonding portions formed of a metal electrode are contacted with each other in the atmospheric air, the functional device is adjusted to an optimum position while being caused to electrically function, and thereafter, metal bonding is performed in a solid phase by heating at 180° C. or less.

As a method for bonding metals in a solid phase at room temperature, a method of treating bonding surfaces formed of gold with an energy wave in a vacuum, and bonding the bonding surfaces together in an inert gas atmosphere, is effective. However, if the bonding surfaces are contacted with each other, the bonding surfaces are bonded together. Therefore, after the energy wave treatment, an attached layer is once formed using gas, so that the metal electrodes are not bonded only by contacting them with each other in the atmospheric air. Therefore, relative positions of the functional device and the object to be bonded can be adjusted while the functional device is caused to electrically function. After completion of the position adjustment, both the metal electrodes are bonded only by low-temperature heating at 180° C. or less. Thus, the temperature can be set to be lower than 183° C. which is the melting point of lead-tin solder for conventional low-temperature metal bonding. In order to suppress a position error due to heating to a small level, 150° C. or less is preferable. 100° C. or less is more preferable.

When solder is melted, the melted solder is not uniformly spread. In this case, when the solder is solidified, a portion containing a larger amount of solder pulls a portion containing a smaller amount of solder, resulting in a position error. Therefore, if objects to be bonded (functional devices) can be bonded together in a solid phase, it is effective. According to data, required heating temperature depends on an elapsed time after the energy wave treatment of the bonding portion, the type of gas, and a moisture content (humidity). If mounting is performed within one hour after exposure to the atmosphere (forming an attached layer), bonding was able to be achieved by heating at 100° C. or less. In the bonding method, although bonding is performed in a solid phase, metal molecules are directly coupled with each other on the bonding surface. Therefore, even if heating is performed at high temperature (e.g., 350° C.) after bonding, the metal molecules are only diffused, and the bonding strength does not decrease, or the resistance value does not increase. Thus, high reliability is obtained even at high temperature.

Regarding the gas for attaching an attached layer, when gas containing nitrogen, oxygen, He, hydrogen, fluorine, or carbon is used, it is more difficult to achieve bonding only by contacting as compared to when inert gas (Ar, etc.) is used, and bonding can be achieved at low temperature.

In the bonding method and the bonding apparatus, the gas may be the atmospheric air. In the case of the atmospheric air, handling is easy and the above-described effect can be expected.

Regarding a method of cleaning an object to be bonded using an energy wave, a plasma, which requires about $10^{-2}$ Torr, is easy and effective, as compared to an atom beam and an ion beam, which require a high vacuum of about $10^{-5}$ Torr. Also, when Ar is used as reaction gas, etching is efficiently performed, and since Ar gas is inert, reaction matter is not formed on the surface of the object to be bonded.

One of the objects to be bonded may be a light emitting element, a probe from a power supply may be contacted with the bonding portion functioning as an electrode of the light emitting element, a light emitting point of the light emitting element may be recognized using a recognizing means to adjust the position of the light emitting element to an optimum position while the light emitting element is caused to electrically function, and thereafter, the objects to be bonded may be bonded together in a solid phase at room temperature (claims 21 and 47).

In the bonding method and the bonding apparatus, the light emitting element may be of a surface light emission type, or may be of a type in which light is emitted in a direction perpendicular to the bonding surface of the light emitting element and toward one of the objects to be bonded.

In the bonding method and the bonding apparatus, one of the objects to be bonded may be a light emitting element which emits light parallel to the bonding surface, and one probe may be contacted with an electrode opposed to the bonding surface of the light emitting element, and the other probe may be contacted with the other electrode, so that the light emitting element is caused to electrically function, and the light emitting point may be recognized using a recognizing means, and the position of the light emitting element may be adjusted to an optimum value, and thereafter, metal bonding may be performed in a solid phase by heating at 180° C. or less. Particularly, when the functional device is a light emitting element, the positioning of the light emitting point and an optical fiber requires accuracy of the order of submicrons, and the present invention is effective in terms of accuracy. Also, in the case of the light emitting element, heat radiation occurs during light emission, so that reliability is required at a high temperature of 250° C. or more. Therefore, the bonding method of the present invention is effective in which bonding is performed at low temperature and reliability can be maintained at temperature higher than the bonding temperature.

In the present invention, as illustrated in FIGS. 12 and 13, when the light emitting element is, for example, a laser diode which emits light parallel to the bonding surface, the present invention is effective. In this case, as illustrated in FIGS. 12 and 13, an electrode which is the bonding surface of the light emitting element is provided facing the object to be bonded, and the position is adjusted by moving vertically while holding the opposite surface. While pressing the lower electrode of the light emitting element against the upper electrode of the object to be bonded, the electrode on the holding surface of the light emitting element is contacted with the upper electrode of the object to be bonded, so that the light emitting element is caused to electrically function. After the light emitting point is adjusted to an optimum position, metal bonding is performed in a solid phase by heating at 180° C. or less.

In the bonding method and the bonding apparatus, the light emitting element may be a surface light emission type, and a type in which light is emitted in a direction perpendicular to the bonding surface and toward one object to be bonded. The bonding electrode of the object to be bonded may be contacted with the bonding surface (electrode) on the surface of the light emitting element, and probing may be performed with respect to the other end of the object to be bonded to cause the light emitting element to electrically function to recognize the light emitting point using a recognizing means, and after the position of the light emitting element is adjusted to an optimum value, metal bonding may be performed in a solid phase by heating at 180° C. or less. As described above, when the light emitting element (surface light emitting laser, etc.) which emits light in a direction perpendicular to the bonding surface is used instead of the light emitting element (FIG. 13) which emits light parallel to the bonding surface, a simple configuration can be particularly obtained since the light emitting direction and the electrode direction can be provided on the lower side as illustrated in FIG. 14. In this case, as illustrated in FIG. 14, the position is adjusted while the light emission surface is placed facing the object to be bonded and the opposite surface is held. Since the electrode is positioned on the same side as that of the light emission surface, a probe is contacted with the electrode on the upper surface of the object to be bonded while pressing against the electrode of the object to be bonded, to cause the light emitting element to electrically function. After adjusting the light emitting point to an optimum position, metal bonding is performed in a solid phase by heating at 180° C. or less. When an optical fiber is not buried and emits light downward, light can be recognized from the side by providing an optical path converting means comprising a prism to the stage, for example.

In the bonding method and the bonding apparatus, regarding the method of adjustment to an optimum value, light emitted from the light emitting element may be input to an optical fiber, and the input value may be detected so as to adjust the position of the light emitting element. Regarding the method of recognizing the light emitting point, when light is input to the optical fiber, the other end of the optical fiber is connected to a measuring apparatus, and the output is monitored to adjust a center position which provides a maximum value. This is an effective and easy method. Regarding a method of recognizing a light emitting point, a position which provides a maximum light amount is generally considered as the light emitting point, or alternatively, preferably a light emitting point is recognized, taking into consideration a contrast state therearound as well as a maximum value, even though the light emitting point may not have the maximum value.

In the bonding method and the bonding apparatus, an object-to-be-bonded recognizing means and a light emitting point recognizing means may be provided, and the method of adjustment to an optimum value may comprise a first step of recognizing the position of an object to be bonded using the object-to-be-bonded recognizing means, a second step of reading light emitted from the light emitting element using a matrix imaging element to recognize the position of the light emitting point, and a third step of adjusting the position of the light emitting element based on the result of the recognition. Particularly, when light is not input to an optical fiber, or the other end of the optical fiber is not connected, the position of the object to be bonded is initially recognized using the object-to-be-bonded recognizing means to recognize a position where the light emitting point is to be placed. Next, the light emitting point is directly input to the matrix imaging element to detect the input value, and the position of the light emitting element is adjusted so that the position on the matrix imaging element which provides a maximum light amount matches a target position on the matrix imaging element. Specifically, initially, the light emitting element is caused to emit light, and the light is read using the matrix imaging element, so that the maximum light amount position on the matrix imaging element is obtained. The position of the matrix imaging element attached on a table in a manner which allows the matrix imaging element to move is previously known, so that the light emitting point position of the light emitting element can be recognized. Therefore, the position of a light emitting point which is to be placed on the matrix imaging element is originally known, and therefore, the position of the light emitting point is corrected so that the light emitting element is placed at a position on the matrix imaging element which allows the maximum light amount. Regarding a method of recognizing the light emitting point using a matrix imaging means, a position which provides a maximum light amount is generally considered as the light emitting point, or alternatively, preferably the light emitting point is recognized in units of a subpixel of the imaging element, taking into consideration a contrast state therearound as well as a maximum value, even though the light emitting point may not have the maximum value.

In the bonding method and the bonding apparatus, the object-to-be-bonded recognizing means and the light emitting point recognizing means may be separate matrix imaging elements, and relative positions of the imaging elements may be recognized using a reference jig which determines positions of a light emitting point and a mark position of an object to be bonded mark, thereby performing calibration and recognition. For example, when the light emitting point recognizing means and the object-to-be-bonded recognizing means have different optical system magnifications, separated matrix imaging elements are provided. In this case, assuming that relative positions of the separate matrix imaging elements are not known, even if the mark of an object to be bonded is recognized, it cannot be determined where to place the light emitting point. Therefore, if the relative positions of the light emitting point and the mark for recognizing the object to be bonded are recognized using a reference jig which previously determines the relative positions, the relative position relationship can be calibrated. Thereby, it is possible to recognize a light emitting point and an object to be recognized on an object to be bonded even when they have different sizes.

In the bonding method and the bonding apparatus, when the light emitting element is caused to electrically function and the position of the light emitting point is recognized using the recognizing means, light may be intermittently emitted so as to recognize the position. In the case of the light emitting element, if light is continuously emitted since heat is radiated during light emission, heat is accumulated to about 250° C. In this case, bonding is performed during position adjustment, and a position error occurs due to thermal expansion or the like. Therefore, by emitting light intermittently, and instantaneously capturing the light emitting point in synchronization with light emission, heat accumulation can be prevented and the light emitting point can be recognized at low temperature.

In the bonding method and the bonding apparatus, an alignment mark may be provided on both the objects to be bonded, an alignment mark recognizing means may be provided, and after the positions of both the objects to be bonded are corrected using the alignment marks, the objects to be bonded may be caused to electrically function so as to be adjusted to an optimum position. In the case where the light emitting point is recognized, when the position accuracy is initially poor, it takes a long time to align the center of the light emitting point by contacting the light emitting element if a position error is large. Also, since the light emitting point recognizing means needs to have a large visual field, the accuracy is also poor. Therefore, preferably, the alignment marks previously provided on the light emitting element and the object to be bonded are used to recognize both the alignment marks using a recognizing means, and the position is corrected to perform rough positioning before recognizing the light emitting point. If an outer shape, a recognizable pattern, or the like is provided, it can be recognized as an alignment mark without particularly providing an alignment mark.

In the bonding method and the bonding apparatus, the light emitting point recognizing means and the object-to-be-bonded recognizing means may be composed of the same recognizing means. In the bonding method and the bonding apparatus, at least one of the objects to be bonded may be held using a tool having an optical path converting means, and the object to be bonded and the light emitting point may be recognized from the side. In the case of a surface light emitting element, if an object to be bonded is held using a tool having an optical path converting means, such as a prism or a mirror, and optical path conversion is performed from the bottom to the side, both the position of the object to be bonded and the position of the light emitting point can be read from the side, resulting in a simple structure. In the case of a parallel light emitting element, the light emitting element is held using a tool having an optical path converting means, and an upper surface mark on the object to be bonded can be read from the side, resulting in a simple structure. The position of an object to be bonded is determined by image-recognizing an alignment mark on a light emitting element or a substrate, or an outer shape thereof, and is used so as to recognize a mark on a substrate to determine the position of the light emitting point or so as to recognize alignment marks on the light emitting element and the substrate to previously perform alignment.

If IR (infrared) light is used, at least one of the objects to be bonded is caused to be transparent and alignment marks on the objects to be bonded can be read. For example, in the case of a light emitting element which emits light parallel to the bonding surface, an optical path converting means is provided in the light emitting element holding tool, the light emitting element or the object to be bonded is caused to be transparent so that alignment marks can be read by recognizing IR light. Regarding an IR light source, reflected light may be used on the same axis, or a light source may be used on the opposite side and transmitted light may be used. The optical path converting means may be provided on the object-to-be-bonded holding stage instead of the holding tool. If the object-to-be-bonded position recognition including the light emitting point and the light emitting element is recognized in the same direction using the same recognizing means by using the optical path converting means, measurement can be performed with higher accuracy. For example, if an optical system of the light emitting point recognizing means is used to recognize the mark on or an outer shape of the object to be bonded, a position at which the next light emitting point to be placed is easily known after the recognition of the object to be bonded, so that, preferably, a relative position error caused by the recognizing means being provided separately, a change over time due to thermal expansion, or the like, does not occur. Also, the apparatus can be simplified, and particularly it is not necessary to provide a multiaxial moving table in the recognizing means, so that the apparatus can be simplified, and the apparatus can be further simplified if the alignment table is limited to only either of the head or the stage. Even if separate matrix imaging elements are provided, an integrated structure can be obtained by splitting the optical system partway.

In a light emitting module fabricated using the above-described bonding method, a light emitting element is efficiently mounted with high accuracy using the above-described method, so that the light emitting module can be fabricated with high accuracy and low cost, i.e., the present invention is effective.

In the bonding method, one of the objects to be bonded may be a chip, and the other object to be bonded may be a wafer on which a plurality of the chips are to be mounted, and a plurality of the chips may be continuously bonded to the wafer (claim 22).

In the bonding apparatus, one of the objects to be bonded may be a chip, and the other object to be bonded may be a wafer on which a plurality of the chips are to be mounted, and a plurality of the chips may be continuously bonded to the wafer (claim 48).

As illustrated in FIG. 7, room-temperature bonding can be achieved by pressing even in the atmospheric air if the object to be bonded is not allowed to stand after dry cleaning (surface activation using an energy wave). This may be because, although a thin attached layer is formed on the bonding surface (bonding portion), the layer is so thin that it can be crushed by pressing. Since solder is heated at high temperature so as to mount a plurality of chips onto a wafer, surrounding solder on the wafer is also affected, and may be defectively melted or oxidized, or a bonded chip may be defectively displaced since solder is melted. In the present invention, bonding can be performed at no more than 183° C. which is the melting point of solder, so that there is not an influence on surroundings, and mounting can be continuously performed. Also, since bonding can be performed in a solid phase, the above-described position error due to melting does not occur. Note that a chip which had not been subjected to an energy wave treatment was not bonded. Note that the chip generally indicates a piece obtained by dicing a wafer, including mounted parts, such as a transistor, a resistance, a capacitor, a reactance, and the like.

In the bonding method and the bonding apparatus, a time required to bond a chip and a wafer may be two seconds or less, and chips may be continuously mounted. In the case of solder, after heating for melting, if a chip is released by the time when the solder is cooled and fixed, a position error occurs or the solder is displaced, so that it takes a long time to continuously mount chips, resulting in poor production efficiency. For example, a time required to bond one chip is about 10 seconds. However, in the present invention, since bonding is achieved only by pressing, the bonding time can be extremely short. Thus, if chips are continuously bonded onto a wafer where the bonding time is two seconds or less, the efficiency is good. Preferably, the bonding time is one second or less. More preferably, the bonding time is 0.5 seconds or less, since it is shorter than when ultrasonic vibration bonding is performed.

During the time when the chips are continuously bonded to the wafer, after a predetermined time has passed, the wafer may be treated again with the energy wave, and thereafter, bonding of the chips to the wafer may be resumed (claims 23 and 49). Assuming that a plurality of chips are bonded onto a single wafer, if the number of chips is large, it takes a long time. In order to achieve room-temperature bonding in the atmospheric air, bonding is performed within about one hour after dry cleaning (an activation treatment using an energy wave). This is because, if otherwise, adhering substances increases on a bonding surface of an object to be boded, so that bonding cannot be performed. Therefore, dry cleaning is preferably performed again using an energy wave (a low-pressure plasma, etc.) within one hour, preferably 30 minutes. Therefore, a cleaning machine (energy wave emitting means) is coupled with the bonding apparatus for the objects to be bonded so that, when a chip is bonded onto a wafer, after a predetermined time has passed, the wafer is temporarily transported to the cleaning machine, in which cleaning is in turn performed again. After cleaning, the wafer is set on the stage again to start chip bonding. Thereby, a number of chips can be continuously bonded to a wafer in the atmospheric air at room temperature.

In a semiconductor, since a number of electrodes are bonded using bumps, damage occurs at high temperature, and therefore, low-temperature bonding is desired. When bonding is performed using bumps having a fine pitch smaller than about 50 μm, low-temperature bonding which suppresses thermal expansion is desired. In view of damage to a circuit surface, a low load is required. If chips are continuously bonded to a wafer, the efficiency is good. For these reasons, the present invention is preferable.

The object to be bonded may be a chip or a wafer composed of a semiconductor or a MEMS device (claim 24).

A device which is formed with the bonding method according to any one of claims 1 to 24, wherein the device is a semiconductor device, a MEMS device, or the like (claim 25).

Flipchip bonding for a semiconductor chip which has a number of electrode portions (metal convex portions) is expected to provide mounting having a high accuracy ranging from minute pitch electrodes to several micrometers or less, and is desired to be performed at a low temperature of 180° C. or less, preferably room temperature, because of an influence of heat to a semiconductor. Therefore, this embodiment is particularly effective to the flipchip bonding.

In the bonding method and the bonding apparatus, a metal protrusion may be provided on at least one of objects to be bonded, and at least one of the objects to be bonded may be a semiconductor chip. A semiconductor apparatus may be fabricated by the method in which a metal protrusion is provided on at least one of objects to be bonded, and at least one of the objects to be bonded is a semiconductor chip. Flipchip bonding for a semiconductor chip which has a number of electrode portions (metal convex portions) is expected to provide mounting having a high accuracy ranging from minute pitch electrodes to several micrometers or less, and is desired to be performed at a low temperature of 180° C. or less, preferably room temperature, because of an influence of heat to a semiconductor. Therefore, this embodiment is particularly effective to the flipchip bonding.

By attaching semiconductors, a three-dimensional structure can be preferably obtained, resulting a semiconductor apparatus having a higher packaging density. Preferably, after wafers are bonded together, the wafers are diced into chips, thereby increasing the production efficiency.

Effects of the Invention

In a bonding method of bonding a plurality of objects to be bonded having a metal bonding surface at low temperature, room-temperature bonding can be performed in the atmospheric air. Direct bonding can be obtained without a high profile irregularity which is required by conventional room-temperature bonding.

At least one of the objects to be bonded may be a semiconductor, and the bonding surface of each of the objects to be bonded may be subjected to plasma cleaning using the low-pressure plasma which is generated with electric field having alternating + and − directions generated by an alternating power supply before the cleaned bonding surfaces are bonded together in a solid phase at room temperature. Thereby, the + ion and the − electron can be caused to alternately strike the object to be bonded so as to neutralize before accumulating charge. Thereby, it is possible to avoid charge-up damage. By adjusting the times of the + region and the − region using a bias voltage Vdc or the pulse width of pulsed waves, an optimum region for neutralization can be created.

In the bonding method of bonding a plurality of objects to be bonded having a metal bonding surface formed of gold or copper at low temperature, room-temperature bonding can be performed in the atmospheric air. Also, a bonding load can be reduced.

In a chamber having a reduced pressure, both objects to be bonded are shifted to side positions so that the bonding surfaces do not overlap each other, and after both the bonding surfaces are subjected to plasma cleaning, the objects to be bonded are shifted to positions which allow both the bonding surfaces to face each other, and at least one of the objects to be bonded is shifted in a direction substantially perpendicular to the bonding surface of the object to be bonded, followed bonding. Thereby, it is possible to clean the objects to be bonded using a plasma (surface activating treatment) while preventing organic substances or the like from readhering to the other object to be bonded. Also, a gap in height direction between both the objects to be bonded can be minimized, thereby making it possible to perform bonding without a position error after alignment and with high accuracy.

A contour-shaped bonding portion is formed in at least one space between the device and the object to be bonded serving as a lid using a bonding metal, and bonding portions of the device and the object to be bonded are subjected to surface activation using an energy wave (e.g., an atom beam, an ion beam, or a plasma) in a reduced pressure chamber, and thereafter, the bonding portions are bonded at a low temperature of 180° C. or less, thereby making it possible to enclose a predetermined atmosphere in a space between the device and the object to be bonded. Thus, an atmosphere can be enclosed using a single apparatus and a single step, resulting in a reduction in cost and an increase in productivity. Also, an evacuation hole or a resin sealing material is not required. Since bonding can be achieved at low temperature, the present invention can be applied to a device susceptible to heat, or a device in which distortion occurs due to thermal expansion caused by a combination of different materials and which cannot endure high-temperature bonding.

Direct bonding can be performed at a position which is adjusted while a functional device is caused to function, resulting in high-efficiency bonding without a position error. Since bonding can be performed at low temperature and in a solid phase, bonding can be achieved with high accuracy.

In a bonding method of bonding a plurality of objects to be bonded having a metal bonding surface formed of gold or copper at low temperature, room-temperature bonding can be performed in the atmospheric air in a solid phase. Also, chips can be continuously mounted onto a wafer with a short bonding time and high efficiency. Also, bonding can be performed using a low load even at room temperature in a solid phase.

BRIEF DESCRIPTION OF DRAWINGS

FIG. 1 is a diagram illustrating a relationship between metal hardness and bonding strength.

FIGS. 3A and 3B are schematic diagrams illustrating rotation of crystal orientation on a bonding interface during bonding.

FIGS. 16A and 16B are schematic diagrams illustrating diffusion of a gold film.

FIG. 17 is a diagram illustrating a configuration for simultaneous recognition using an optical path converting means of a parallel light emitting element, as viewed from the side.

FIGS. 32A to 32K are diagrams illustrating a bonding process.

DESCRIPTION OF REFERENCE CHARACTERS

20 . . . chip (object to be bonded)
20a . . . bump (bonding portion)
22 . . . chip (object to be bonded)
22a . . . bump (bonding portion)
25 . . . vertical drive mechanism
26 . . . head section
28 . . . mounting mechanism (stage)
42, 44 . . . probe
531 . . . Z axis (vertical drive mechanism)
532 . . . piston type head (head)
539 . . . lower electrode (stage)
550 . . . copying mechanism (spherical bearing)

BEST MODE FOR CARRYING OUT THE INVENTION

First Embodiment

Figure 15:
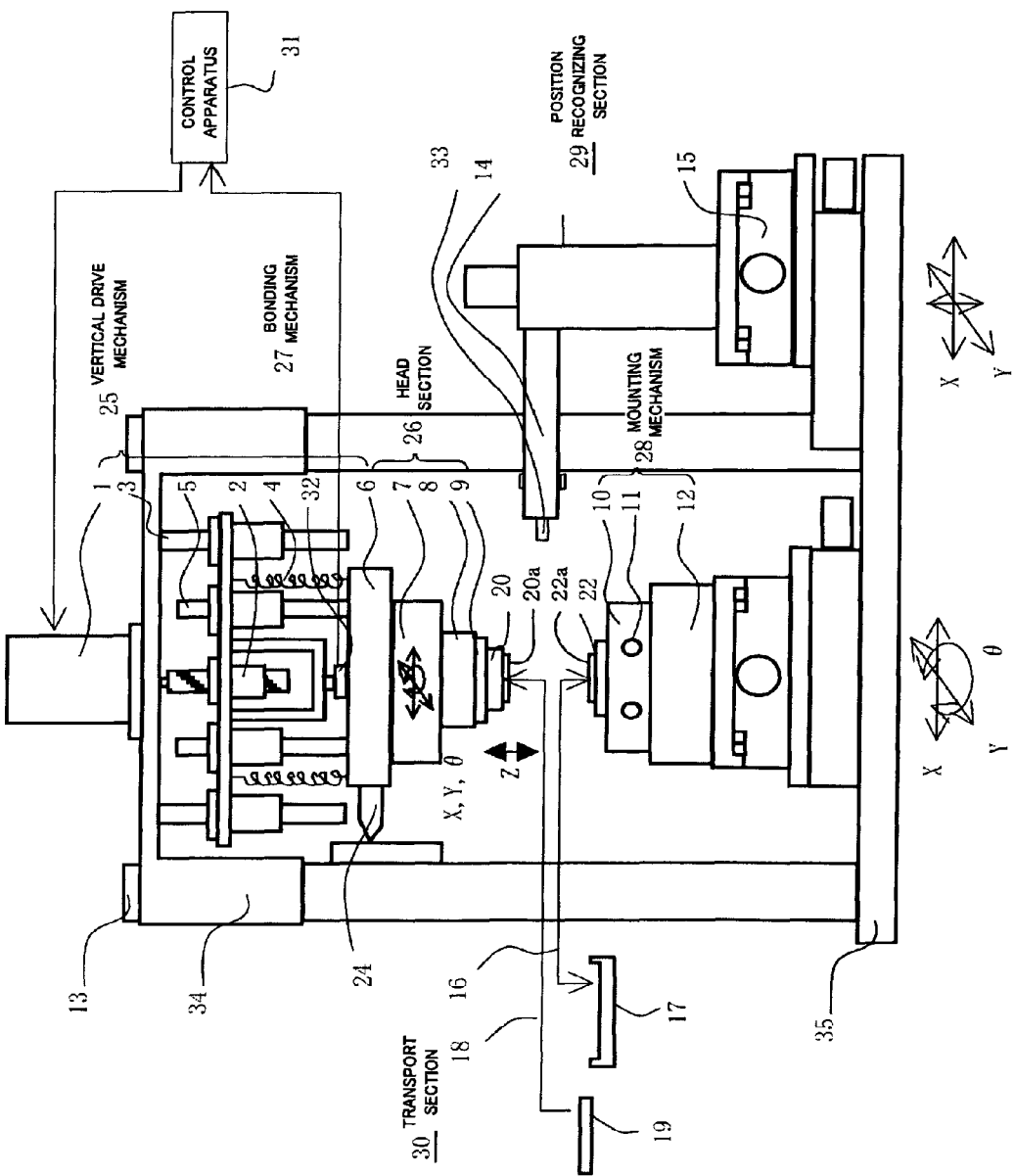
FIG. 15 is a light emitting element center aligning bonding apparatus.

Hereinafter, a first embodiment of the present invention will be described with reference to the drawings. FIG. 15 illustrates the first embodiment of a bonding apparatus according to the present invention. In this embodiment, an apparatus for bonding a chip 20 formed of a semiconductor (first object to be bonded) and a substrate 22 (second object to be bonded) will be described as an example. A bonding surface of the chip 20 has a metal electrode 20a which is an electrode and is formed of gold, and a bonding surface of the substrate 22 has a metal electrode 22a which is an electrode and is provided at a position which allows to face the metal electrode 20a of the chip. The metal electrode 20a of the chip and the metal electrode 22a of the substrate are bonded together by pressing.

The bonding apparatus roughly includes a bonding mechanism 27 including a vertical drive mechanism 25 and a head section 26, a mounting mechanism 28 including a stage 10 and a stage table 12, a position recognizing section 29, a transport section 30, and a control apparatus 31. The vertical drive mechanism 25 moves the head section 26 vertically using a vertical drive motor 1 and a bolt-nut mechanism 2 while being guided by a vertical guide 3. The head section 26 is guided vertically by a head escape guide 5, and contacts a pressing force detecting means 32 for detecting a pressing force and the vertical drive mechanism 25 while being pulled by a head own-weight counter 4 for canceling the head's own weight and pressing the head against the pressing force detecting means 32.

The head section 26 is composed of a chip holding tool 8 which sucks and holds the chip 20, a tip tool 9, a head's alignment table 7 which has movement axes of translation and rotation and performs position correction, and a head holding section 6 which supports them. A heating heater is buried and provided inside the chip holding tool 8. The mounting mechanism 28 is composed of the stage 10 which sucks and holds the substrate 22, and the stage table 12 which has movement axes of translation and rotation and performs alignment of positions of a chip and a substrate. A stage heater 11 is included in the stage 10. The bonding mechanism is coupled with a frame 34 and is linked to a pedestal 35 via four supporting poles 13 provided around a pressing center.

The position recognizing section 29 is composed of a vertical mark recognizing means 14 which is inserted between a chip and a substrate facing each other and recognizes alignment marks for recognizing positions of the chip (upper position) and the substrate (lower position), and a recognizing means moving table 15 which moves the vertical mark recognizing means 14 horizontally and/or vertically. The transport section 30 includes a substrate transport apparatus 16 and a substrate transport conveyer 17 which transport the substrate 22, and a chip supply apparatus 18 and a chip tray 19 which transport the chip 20. A control section 31 includes a control of the whole apparatus and an operation section. Particularly in a pressing force control, the control section 31 controls the torque of the vertical drive motor 1 based on a signal from the pressing force detecting means 32 to control a pressing force for bonding.

Next, a series of operations will be described. The chip 20 is supplied from the chip tray 19 to the chip holding tool 8 by the chip supply apparatus 18, and is sucked and held by the chip holding tool 8. The substrate 22 is supplied from the substrate transport conveyer 17 to the stage 10 by the substrate transport apparatus 16, and is sucked and held by the stage 10. The vertical mark recognizing means 14 is inserted between the chip 20 and the substrate 22 whose bonding surfaces face each other by the recognizing means moving table 15. Positions of the positioning alignment marks of the chip 20 and the substrate 22 facing each other are recognized by the vertical mark recognizing means 14. Using the chip 20 as a reference, the position of the substrate 22 is moved in a translation direction and a rotation direction by the stage table 12 for the purpose of alignment. During alignment, position correction may be performed by the stage table 12 and the head's alignment table, or only by the head's alignment table. Only either of them may be provided.

When bonding positions of the chip 20 and the substrate 22 match each other, the vertical mark recognizing means 14 is retreated by the recognizing means moving table 15. Next, the head section 26 is lowered by the vertical drive mechanism 25 so that the chip 20 and the substrate 22 contact each other. A position in a height direction of the head section 26 is detected by a head height detecting means 24. Contact timing of the chip 20 and the substrate 22 is detected by the pressing force detecting means 32, and the vertical drive motor is switched from a position control to a torque control. The head height is also monitored by the head height detecting means 24 during the time when pressing is performed in the torque control, so that the position in the height direction can be controlled. After completion of bonding, the suction of the chip 20 is released, so that the chip 20 is left on the stage while being mounted on the substrate 22. The substrate 22 is discharged to the substrate transport conveyer 17 by the substrate transport apparatus 16. The series of operations are ended.

In order to performing metal bonding while keeping a solid phase at a low temperature of 180° C. or less in the atmospheric air, the bonding surfaces (portions to be bonded) of objects to be bonded which are formed of a metal (the chip 20, the substrate 22) are previously etched (cleaned) by several nanometers in a vacuum using an energy wave (an atom beam, an ion beam, or a plasma) to remove adhering substances. When bonding is performed in the atmospheric air after cleaning (surface activating treatment), an adhering substance layer is formed on a bonding surface, so that bonding is not achieved only by contacting. However, since the adhering substance layer is thin immediately after cleaning, the adhering substance layer is crushed by pressing, so that the crushed adhering substance layer forms a new surface which allows bonding. In this embodiment, gold is used as a bonding portion, which has a Vickers hardness of 60 Hv, so that the chip 20 and the substrate 22 are firmly bonded together even at room temperature (see FIG. 1).

Second Embodiment

Next, a second embodiment of the bonding apparatus of the present invention will be described in detail with reference to FIGS. 16A and 16B. This embodiment is significantly different from the above-described first embodiment in that a bonding portion of an object to be bonded is constructed by forming a gold film on a surface of a base material formed of a metal, and other parts of this embodiment are similar to those of the first embodiment. Hereinafter, the second embodiment will be described in detail, mainly in terms of the difference from the first embodiment. Note that the same configuration and operation as those of the first embodiment will not be described.

In the second embodiment, bonding portions of the chip 20 and the substrate 22 are formed as metal bumps as follows. Specifically, a plurality of coppers are used as base materials 20b and 22b, and gold films 20c and 22c are formed on surfaces of the base materials 20b and 22b. The metal bumps are subjected to a surface activating treatment using an energy wave, and thereafter, are bonded together in the atmospheric air, followed by low-temperature heating to diffuse gold. FIG. 16A illustrates the bonding portion composed of the copper base material and the gold film. FIG. 16B illustrates how the gold films 20c and 22c are diffused in the base materials 20b and 22b by low-temperature heating after the objects to be bonded (FIG. 16A) are bonded together. Note that, if the bonding surface is formed of gold, it is difficult for organic substances or the like to readhere to the bonding surface after the surface activating treatment, and bonding can be achieved in the atmospheric air if it is performed within several hours after the surface activating treatment. Thus, if the gold film is diffused into the base material after room-temperature bonding, the base materials are bonded together after bonding, resulting in a high strength and a uniform material structure. Regarding the diffusion method, diffusion can be achieved by allowing the bonded objects to stand at room temperature. Alternatively, diffusion can be accelerated by heating at low temperature. In this embodiment, by heating at 150° C. for two hours, the gold films 20c and 22c were able to be diffused into the base materials 20b and 22b.

When an object to be bonded is an electronically functioning device in a semiconductor or a MEMS device, a conventional Al electrode is desired to be changed to a copper electrode in terms of a current-carrying capacity. However, it is practically difficult to use a copper bump because its bonding temperature is high. Therefore, as in this embodiment, the bonding temperature can be reduced by covering the surface of a copper base material with a gold film, the reduced bonding temperature is effective. In addition, it is effective that atmospheres, such as gas, the atmospheric air, and the like, can be selected in addition to a vacuum. Thereafter, if the gold is diffused into the base material, the coppers are bonded together, so that the object is achieved.

Third Embodiment

Next, a third embodiment of the bonding apparatus of the present invention will be described in detail. This embodiment is significantly different from the above-described first and second embodiments in that minute irregularities are formed on a surface of a bonding portion, and other parts and operations of this embodiment are similar to those of the first and second embodiments, and will not be described. Hereinafter, specific features of this embodiment will be described in detail.

Figure 2A:
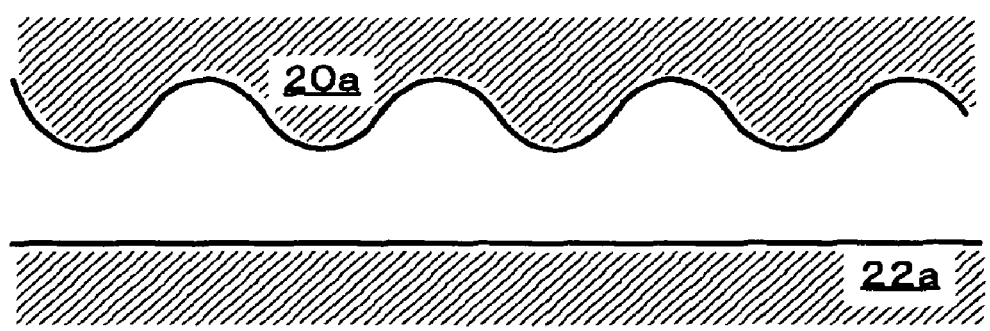
FIGS. 2A and 2B are schematic diagrams illustrating how an attached film is removed by irregularities on a bonding interface.
Figure 2B:
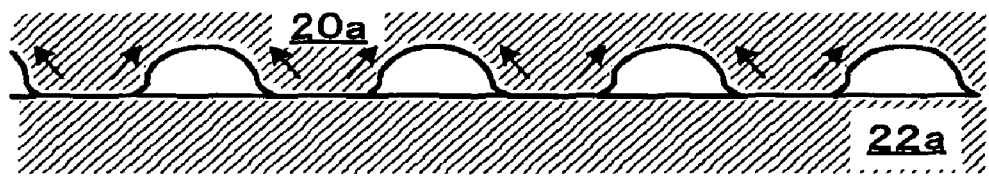
Figure 4:
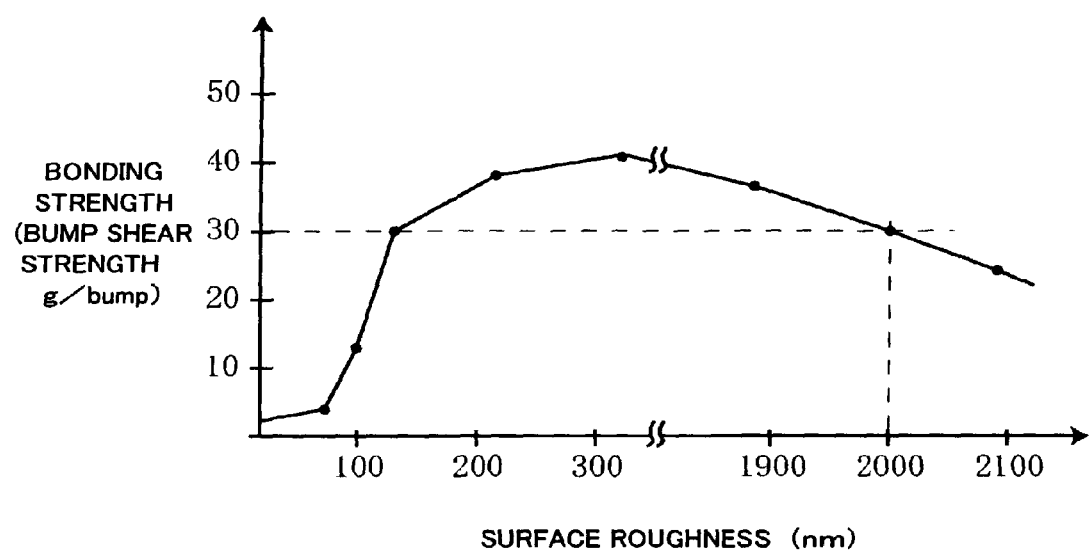
FIG. 4 is a diagram illustrating a relationship between bonding surface roughness and bonding strength.

According to this embodiment, the convex portions are crushed by pressing when objects to be bonded are bonded as illustrated in FIGS. 2A and 2B and are then caused to be spread, so that a new surface appears and bonding is achieved. When viewed microscopically, crystal orientations arranged as illustrated in FIGS. 3A and 3B are rotated by the convex portion being crushed, so that the new surface appears. As can be seen from FIG. 4, when the surface roughness (minute irregularities) is 120 nm or more, a sufficient bonding strength is obtained.

In the case where surfaces are bonded together, even when a plurality of convex-shaped bonding portions are used so as to cause the micro irregularities to be effective as described above, the bonding area is smaller than that of surface bonding, but a similar effect is obtained. In order to crush the micro irregularities to achieve bonding, the bonding metal needs to have a low hardness. In this embodiment, since gold, which has a hardness of 200 Hv or less, was used as a bonding portion, firm bonding was able to be achieved. Note that, when copper or Al was used for a bonding portion, bonding was able to be effectively achieved. In this case, when the pressing force was 150 MPa or more, firmer bonding was able to be achieved. Particularly, when a bonding portion was formed of gold, a low hardness was obtained and oxidation did not occur even in the atmospheric air.

When Ar plasma is used to clean a bonding portion (surface activating treatment), a rough bonding surface is obtained by setting a cleaning time to be longer (e.g., three minutes, where an ordinary time is 30 seconds). When Ar plasma is used to clean an object to be bonded for just a time which allows the roughness to be 120 nm or more, a surface activating treatment, and a process for forming minute irregularities on the surface of a bonding portion can be simultaneously performed, resulting in high efficiency.

Fourth Embodiment

Next, a fourth embodiment will be described in detail. Hereinafter, a difference between the fourth embodiment and the above-described first to third embodiments will be described. The same parts and operations as those of the first to third embodiments will not be described.

Figure 5:
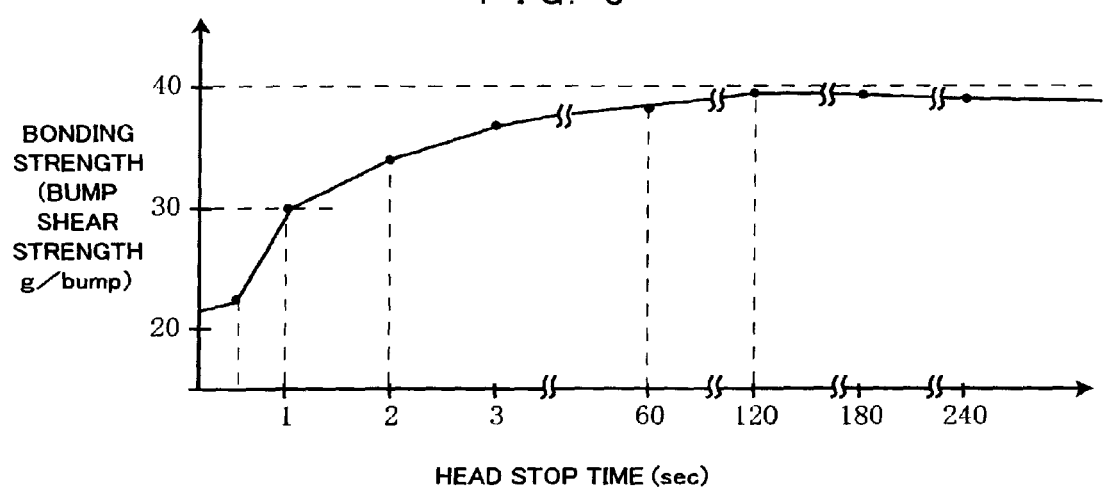
FIG. 5 is a diagram illustrating a relationship between a head stop time during bonding and bonding strength.
Figure 6:
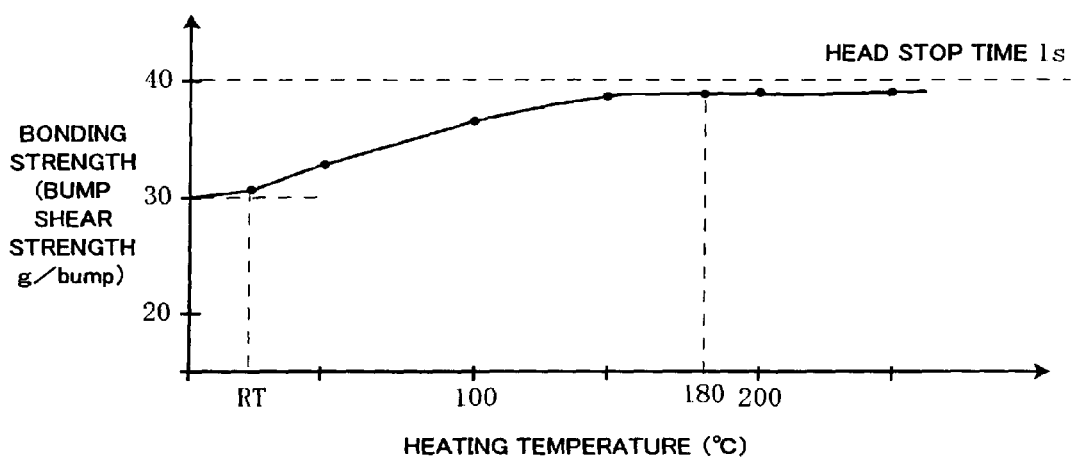
FIG. 6 is a diagram illustrating a relationship between heating temperature during bonding when a head is stopped, and bonding strength.

In the above-described third embodiment, when a pressing force is instantaneously applied to an object to be bonded, irregularities of a bonding surface (bonding portion) are elastically deformed, so that crystal at an interface may not be rotated. Also, the elastic deformation remains as residual stress which acts in a direction which causes the bonding portion to peel off, rather than bonding force, resulting in a reduction in bonding strength. As a method for preventing this, the head height of the head section 26 is kept constant for a predetermined time, so that the crystal cannot resist a load at the bonding interface of the objects to be bonded as viewed microscopically, and therefore, crystal orientations are rotated or particles are moved. As a result, a new surface appears and performs bonding, and the movement of particles removes the residual stress. The effect was obtained when the stop time was one second or more, depending on the material or the bonded state, and a change was not observed when the stop time was two minutes or more, as illustrated in FIG. 5.

In addition, when heating is performed at 180° C. or less during the stop time, the rotation of crystal orientations or the movement of particles is efficiently performed, so that bonding is developed and residual stress is removed, resulting in an increase in bonding strength. As the heating temperature, 180° C. or less was sufficient (low-temperature heating). Flipchip bonding for a semiconductor chip which has a number of electrode portions (metal convex portions) is expected to provide mounting having a high accuracy ranging from minute pitch electrodes to several micrometers or less, and is desired to be performed at a low temperature of 180° C. or less, preferably room temperature, because of an influence of heat to the semiconductor. Therefore, this embodiment is particularly effective to the flipchip bonding.

Although the embodiment for a chip and a substrate has been described as an embodiment, an object to be bonded may be formed of other materials in addition to semiconductors. Although gold, Al, copper, and the like are suitable for the bonding portion, other metals or materials other than metals may be used as long as they can achieve surface activation bonding.

The semiconductor chip may be in any form, such as a chip, a wafer, or the like. The metal protrusion may be a plurality of shapes separately provided or a shape in which a certain continuous region is confined. The entire surface may be a bonding surface.

Fifth Embodiment

Figure 12:
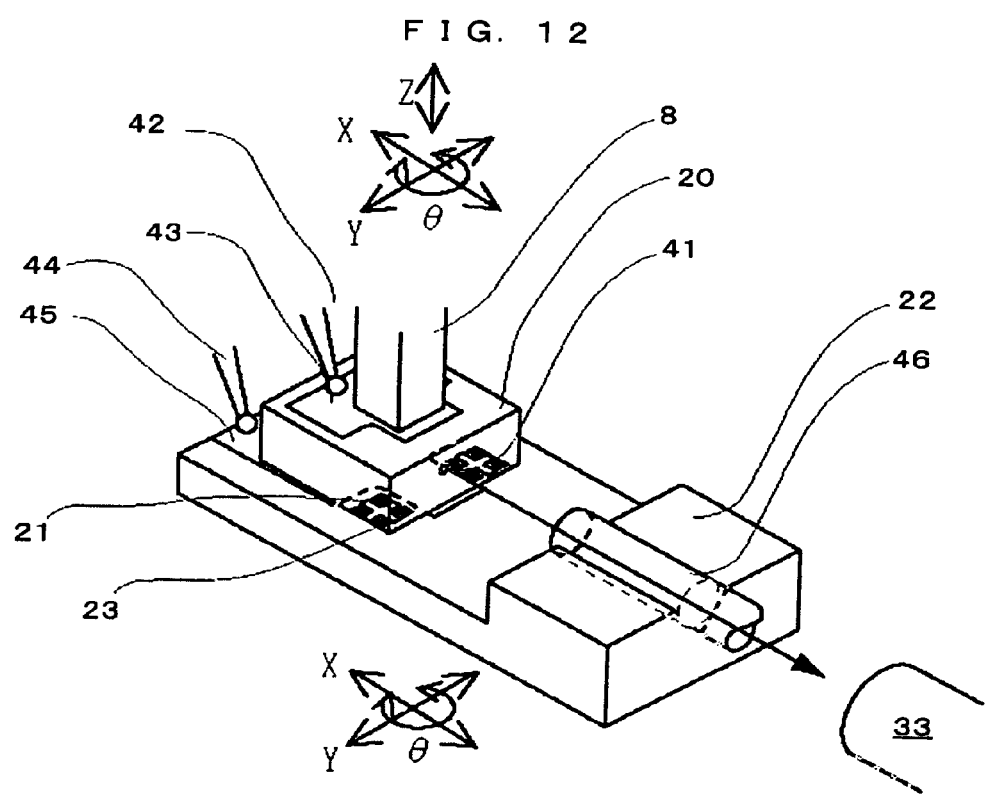
FIG. 12 is a diagram for explaining a center aligning method for a light emitting element.
Figure 13:
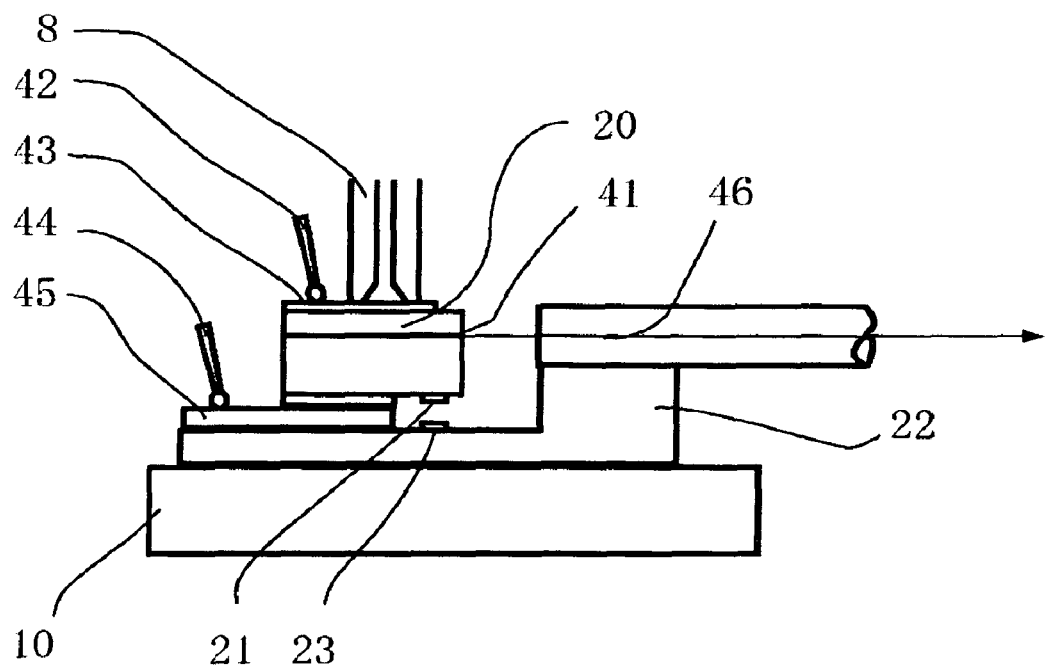
FIG. 13 is a side view of a method for aligning the center of a side light emitting element to an optical fiber on a PLC.

Next, a fifth embodiment of the present invention will be described in detail. This embodiment is significantly different from the above-described first to fourth embodiments in that the chip 20 is a light emitting element. Hereinafter, specific features of this embodiment will be described in detail. FIG. 12 is a diagram for explaining a method for aligning centers of a side-surface light emitting element and a PLC (Planner Light wave guide Circuit) substrate having a V-groove for fixing a fiber, and FIG. 13 is a side view thereof In this embodiment, an apparatus for aligning centers of a light emitting element 20 (a first object to be bonded, a functional device) and a substrate 22 (a second object to be bonded) and bonding them will be described as an example. A metal electrode which is an electrode and is formed of gold is provided on a bonding surface of the light emitting element 20, and a metal electrode which is an electrode is provided on a bonding surface of the substrate 22 and at a position which allows to face the metal electrode of the light emitting element. The metal electrode of the light emitting element and the metal electrode of the substrate are bonded together by heating after center positions of a light emitting point 41 and an optical fiber 46 are aligned.

Next, a bonding apparatus of this embodiment will be described in detail, focusing on a difference between this embodiment and the above-described embodiments. The bonding apparatus roughly includes a bonding mechanism 27 including a vertical drive mechanism 25 and a head section 26, a mounting mechanism 28 including a stage 10 and a stage table 12, a position recognizing section 29, a transport section 30, and a control apparatus 31. The vertical drive mechanism 25 moves the head section 26 vertically using a vertical drive motor 1 and a bolt-nut mechanism 2 while being guided by a vertical guide 3. The head section 26 is guided vertically by a head escape guide 5, and contacts a pressing force detecting means 32 for detecting a pressing force and the vertical drive mechanism while being pulled by a head own-weight counter 4 for canceling the head's own weight and pressing the head against the pressing force detecting means 32. The head section 26 is composed of a chip holding tool 8 which sucks and holds the light emitting element 20, a tip tool 9, a head's alignment table 7 which has movement axes of translation and rotation and performs position correction, and a head holding section 6 which supports them. A heating heater is buried and provided inside the chip holding tool. The mounting mechanism 28 is composed of a stage 10 which sucks and holds the substrate 22, and a stage table 12 which has movement axes of translation and rotation and performs alignment of positions of a light emitting element and a substrate. A stage heater 11 is included in the stage 10. The bonding mechanism is coupled with a frame 34 and is linked to a pedestal 35 via four supporting poles 13 provided around a pressing center. The position recognizing section 29 is composed of a vertical mark recognizing means 14 which is inserted between a light emitting element and a substrate facing each other and recognizes alignment marks for recognizing positions of the light emitting element (upper position) and the substrate (lower position), and a recognizing means moving table 15 which moves the vertical mark recognizing means 14 horizontally and/or vertically. A light emitting point recognizing means 33 is provided at a tip of the vertical mark recognizing means 14, is shifted to an arbitrary position by the recognizing means moving table 15, and is capable of measuring a position of a light emitting point.

Assuming that the optical fiber is buried in the substrate and an end of the optical fiber is extending outside, if the end is input directly into a photometer, a maximum point (light emitting point) can be detected without using the light emitting point recognizing means. The transport section 30 includes a substrate transport apparatus 16 and a substrate transport conveyer 17 which transport the substrate 22, and a light emitting element (chip) supply apparatus 18 and a light emitting element (chip) tray 19 which transport the light emitting element 20. A control section 31 includes a control of the whole apparatus and an operation section. Particularly in a pressing force control, the control section 31 controls the torque of the vertical drive motor 1 based on a signal from the pressing force detecting means 32 to control a pressing force for bonding.

Next, a series of operations will be described. The light emitting element 20 is supplied from the light emitting element tray 19 to the light emitting element holding tool 8 by the light emitting element supply apparatus 18, and is sucked and held by the light emitting element holding tool 8. The substrate 22 is supplied from the substrate transport conveyer 17 to the stage 10 by the substrate transport apparatus 16, and is sucked and held by the stage 10. The vertical mark recognizing means 14 is inserted between the light emitting element 20 and the substrate 22 whose bonding surfaces face each other by the recognizing means moving table 15. Positions of the positioning alignment marks of the light emitting element 20 and the substrate 22 facing each other are recognized by the vertical mark recognizing means 14. Using the light emitting element 20 as a reference, the position of the substrate 22 is moved in a translation direction and a rotation direction by the stage table 12 for the purpose of alignment. Position correction may be performed with respect to the light emitting element by the head's alignment table. In this example, the head's alignment table is assumed to be an alignment table which is composed of a high-accuracy piezo which provides minute strokes for alignment of the center of a light emitting point.

When both bonding positions match, the vertical mark recognizing means 14 is retreated by the recognizing means moving table 15. Next, the head section 26 is lowered by the vertical drive mechanism 25 so that the light emitting element 20 and the substrate 22 contact each other. A position in a height direction of the head section 26 is detected by a head height detecting means 24. Contact timing of the light emitting element 20 and the substrate 22 is detected by the pressing force detecting means 32, and the vertical drive motor is switched from a position control to a torque control. The head height is also monitored by the head height detecting means 24 during the time when pressing is performed in the torque control, so that the position in the height direction can be controlled.

While a predetermined pressing force is applied between the objects to be bonded by the torque of a motor, a probe 1 is contacted with an electrode 1 on an upper surface of the light emitting element, and a probe 2 is contacted with an electrode 2 on an upper surface of the substrate. Preferably, the probe 1 is attached to the head and is moved vertically simultaneously with the head. Alternatively, a portion of the surface of the holding tool can be plated with metal so that the portion can serve as a probe. When the probes are contacted with both the electrodes, the light emitting element is caused to electrically emit light and function. When a V-shaped groove is provided on a PLC substrate and holds an optical fiber, a photometer is set at an end of the optical fiber so as to find a position of the light emitting element which provides a maximum light intensity. The positions of the light emitting element and the substrate are already corrected using the alignment marks with a position accuracy of several micrometers or less.

From that situation, the centers of the light emitting point and the optical fiber are aligned with an accuracy of the order of submicrons. The center aligning method is performed as follows: the light emitting element is caused to emit light; light intensity from the optical fiber is measured; and a light amount is measured while changing the position of the light emitting element to small extent by moving the head vertically, and a maximum point is obtained. The position of the light emitting element is determined to be at the maximum point, and bonding is performed by low-temperature heating (180° C. or less). Thereby, bonding is achieved in terms of position and electricity. Regarding a method for recognizing a light emitting point, a position which provides a maximum light amount is generally considered as the light emitting point, or alternatively, preferably a light emitting point is recognized, taking into consideration a contrast state therearound as well as a maximum value, even though the light emitting point may not have the maximum value. A position in a height direction of the light emitting point is determined, depending on a thickness from a lower portion of the light emitting element to the light emitting point, and therefore, can be maintained with high accuracy if care is taken during production. However, a horizontal direction depends on a mounting position accuracy, and therefore, it is difficult to achieve high-accuracy mounting due to, for example, a position error between the alignment mark and the light emitting point even if the alignment mark is used. Therefore, this embodiment is effective.

When an optical fiber is not attached, an outer shape or a reference mark of the PLC substrate is recognized by an object-to-be-bonded recognizing means. The object-to-be-bonded recognizing means may be either the vertical mark recognizing means 14 or the light emitting point recognizing means, or may be any means. When a substrate mark is present on a surface perpendicular to a light emitting direction, an optical path converting means comprising a prism may be provided on the tip tool or the stage, for example. When a mark is present on the opposite surface, an object-to-be-bonded recognizing means employing IR light, which transmits through the object to be bonded, is used to recognize an alignment mark 23 formed of a metal, thereby making it possible to recognize the object to be bonded.

Initially, the position of the V-groove of the PLC substrate is recognized, and a position which is to be the center of the optical fiber is recognized. Next, the light emitting point is input to a matrix imaging element in the light emitting point recognizing means, which in turn detects the input value. The position of the light emitting element is adjusted so that a position of the matrix imaging element which provides a maximum value matches the center of the optical fiber (target position). The light emitting point may be placed at the center position by shifting the matrix imaging position to the target position. The light emitting point recognizing means 33 is shifted using the recognizing means moving table 15 so as to recognize the outer shape or position of the PLC or the light emitting point, as required. After determining the position of the light emitting element, bonding is performed by low-temperature heating (180° C. or less).

Assuming that a mark on an object to be bonded is present in the same direction as the light emitting direction, if an optical system of the light emitting point recognizing means is used to recognize the mark on or an outer shape of the object to be bonded, a position at which the next light emitting point is to be placed is easily known after the recognition of the object to be bonded, so that, preferably, a relative position error caused by the recognizing means being provided separately, a change over time due to thermal expansion, or the like, does not occur. In addition, higher-accuracy measurement can be achieved by holding at least one of the objects to be bonded using a tool having an optical path converting means comprising a prism or a mirror as illustrated in FIG. 17, and recognizing the object to be bonded and the light emitting point using the same recognizing means from the side.

For example, when the light emitting point recognizing means and the object-to-be-bonded recognizing means have different optical system magnifications, separate matrix imaging elements are provided. In this case, assuming that relative positions of the separate matrix imaging elements are not known, even if the mark of an object to be bonded is recognized, it cannot be determined where to place the light emitting point. Therefore, if the relative positions of the light emitting point and the mark for recognizing the object to be bonded are recognized using a reference jig which previously determines the relative positions, the relative position relationship can be calibrated. Thereby, it is possible to recognize a light emitting point, and an object to be recognized on an object to be bonded even when they have different sizes.

After completion of bonding, the suction of the light emitting element 20 is released, so that the light emitting element 20 is left on the stage while being mounted on the substrate 22. The substrate 22 is discharged to the substrate transport conveyer 17 by the substrate transport apparatus 16. The series of operations are ended.

Bonding can be achieved by applying ultrasonic vibration instead of heating. The method of the present invention can achieve bonding at low temperature or at room temperature, so that metal bonding can be achieved in a solid phase without an influence of thermal expansion. By suppressing an amplitude to a small level and applying vibration after pressing, high-accuracy mounting can be achieved without a position error.

Figure 14:
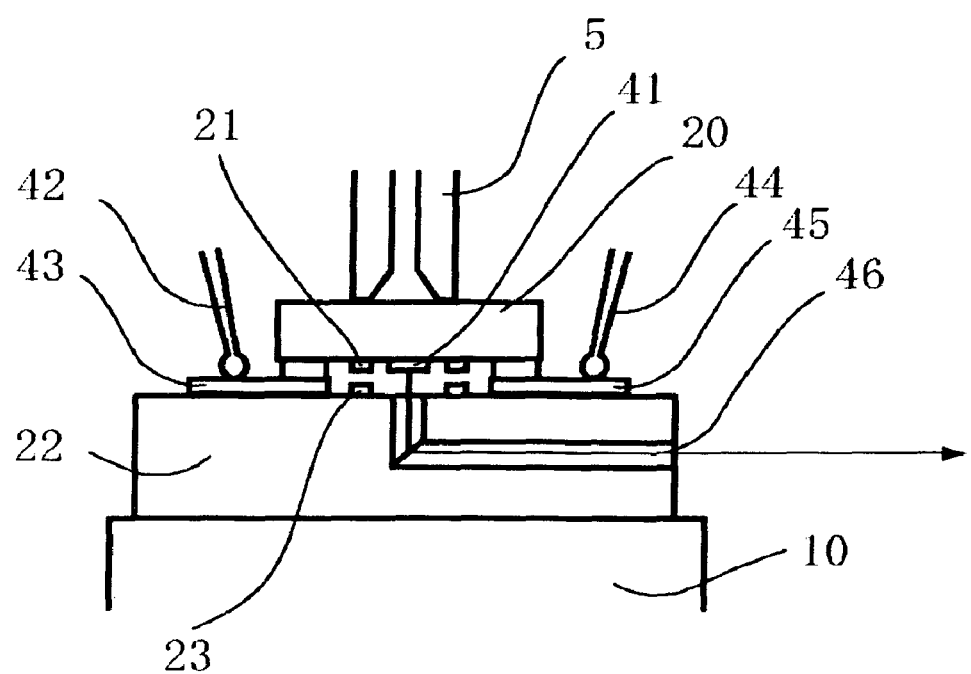
FIG. 14 is a side view of a method for aligning the center of a side light emitting element to an optical fiber-buried substrate.

Next, a variation where a surface light emission type light emitting element is used will be described, focusing on a difference between the variation and the above-described example. FIG. 14 is a diagram for explaining a method of aligning centers of a surface light emitting element and a substrate having a buried optical fiber and bonding them according to the variation. In the case of the surface light emitting element, the positions of the positioning alignment marks of the light emitting element 20 and the substrate 22 facing each other are recognized using the vertical mark recognizing means 14, the positions of the light emitting element 20 and the substrate 22 are aligned, and the probes are contacted with both the electrodes on the substrate while a predetermined pressing force is applied between electrodes which are to be bonding surfaces, so that the light emitting element is caused to electrically emit light and function. The light emitting point recognizing means 33 is shifted to an end of the optical fiber buried in the substrate 22 using the recognizing means moving table 15, to measure light intensity. The positions of the light emitting element and the substrate are already corrected using the alignment marks with a position accuracy of several micrometers or less. From that situation, the centers of the light emitting point and the optical fiber are aligned with an accuracy of the order of submicrons.

The center aligning method is performed as follows: the light emitting element is caused to emit light; light intensity from the optical fiber is measured; and a light amount is measured while changing the position of the light emitting element to small extent by moving the head vertically, and a maximum point is obtained. The position of the light emitting element is determined to be at the maximum point, and bonding is performed by low-temperature heating (180° C. or less). Thereby, bonding is achieved in terms of position and electricity. Regarding a method of recognizing a light emitting point, a position which provides a maximum light amount is generally considered as the light emitting point, or alternatively, preferably a light emitting point is recognized, taking into consideration a contrast state therearound as well as a maximum value, even though the light emitting point may not have the maximum value. A position in a height direction of the light emitting point is determined, depending on a thickness from a lower portion of the light emitting element to the light emitting point, and therefore, can be maintained with high accuracy if care is taken during production. However, a horizontal direction depends on a mounting position accuracy, and therefore, it is difficult to achieve high-accuracy mounting due to, for example, a position error between the alignment mark and the light emitting point even if the alignment mark is used. Therefore, this embodiment is effective.

When an optical fiber is not buried in the substrate, and the substrate is a submount substrate having an optical path hole, an outer shape or a reference mark of the submount substrate is recognized by an object-to-be-bonded recognizing means. The object-to-be-bonded recognizing means may be either the vertical mark recognizing means 14 or the light emitting point recognizing means, or may be any means. When a substrate mark is present on a perpendicular surface, an optical path converting means comprising a prism may be provided on the tip tool or the stage, for example. When a mark is present on the opposite surface, an object-to-be-bonded recognizing means employing IR (infrared) light, which transmits through the object to be bonded, is used to recognize an alignment mark 23 formed of a metal, thereby making it possible to recognize the object to be bonded.

If a position where the light emitting point is to be placed is previously recognized by recognizing a position of the optical path hole of the submount or a position of the submount based on the outer shape or the mark, center alignment can be achieved by directly inputting the light emitting point to a matrix imaging element, detecting the input value, and adjusting the position of the light emitting element so that a position of the matrix imaging element which provides a maximum value of the input value matches a target matrix imaging element position. The light emitting point may be placed at the center position by shifting the matrix imaging position to the target position. Regarding a method of recognizing a light emitting point using a matrix imaging means, an imaging element position which provides a maximum value is generally considered as the light emitting point, or alternatively, preferably a light emitting point is recognized in units of a subpixel of the imaging element, taking into consideration a contrast state therearound as well as a maximum value, even though the light emitting point may not have the maximum value. Assuming that a mark on an object to be bonded is present in the same direction as the light emitting direction, if an optical system of the light emitting point recognizing means is used to recognize a mark on or an outer shape of an object to be bonded, a position at which the next light emitting point to be placed is easily known after the recognition of the object to be bonded, so that, preferably, a relative position error caused by the recognizing means being provided separately, a change over time due to thermal expansion, or the like, does not occur.

Figure 18:
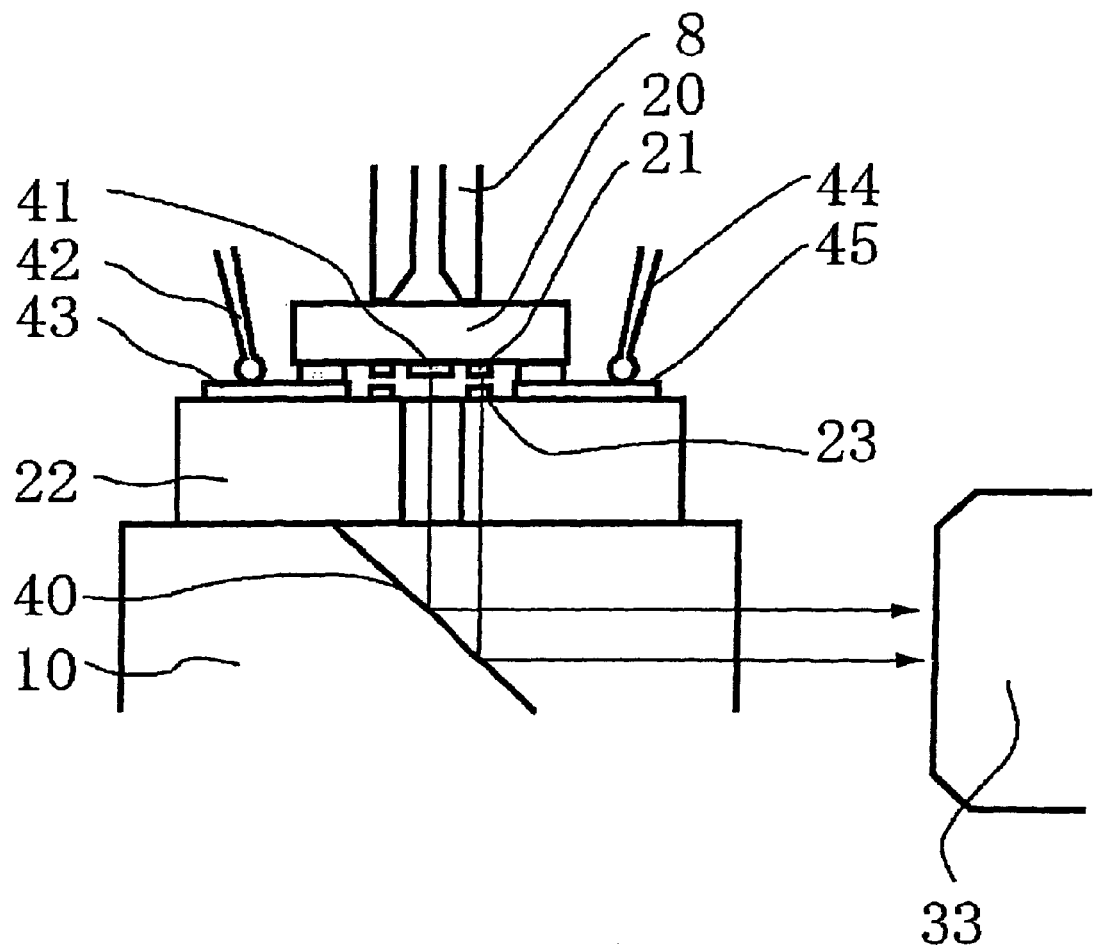
FIG. 18 is a diagram illustrating a configuration for simultaneous recognition using an optical path converting means of a surface light emitting element, as viewed from the side.

In addition, higher-accuracy measurement can be achieved by holding at least one of the objects to be bonded using, for example, a tool having an optical path converting means comprising a prism or a mirror as illustrated in FIG. 18, and recognizing the object to be bonded and the light emitting point using the same recognizing means from the side. The light emitting point recognizing means 33 is shifted using the recognizing means moving table 15 so as to recognize the outer shape or position of the substrate or the light emitting point, as required. After completion of bonding, the suction of the chip 20 is released, so that the chip 20 is left on the stage while being mounted on the substrate 22. The substrate 22 is discharged to the substrate transport conveyer 17 by the substrate transport apparatus 16. The series of operations are ended.

By providing an ultrasonic transmitter or a horn instead of the light emitting element holding tool 8 and/or the tip tool 9, ultrasonic vibration is applied instead of heating during the bonding, thereby making it possible to more easily achieve metal bonding in a solid phase. In this case, the method of the present invention can achieve bonding at low temperature or room temperature, so that metal bonding can be achieved in a solid phase without an influence of thermal expansion. By suppressing an amplitude to a small level and applying vibration after pressing, high-accuracy mounting can be achieved without a position error.

Although a light emitting element and a substrate have been described in the example of the fifth embodiment, the present invention encompasses an object to be bonded which is a functional device which requires position adjustment in addition to light emitting elements.

Sixth Embodiment

Next, a sixth embodiment of the present invention will be described in detail. This embodiment is significantly different from the above-described first to fifth embodiments in that, before bonding objects to be bonded, the bonding portions are subjected to the above-described leveling (see FIGS. 8 to 11). Hereinafter, specific features of this embodiment will be described.

Figure 7:
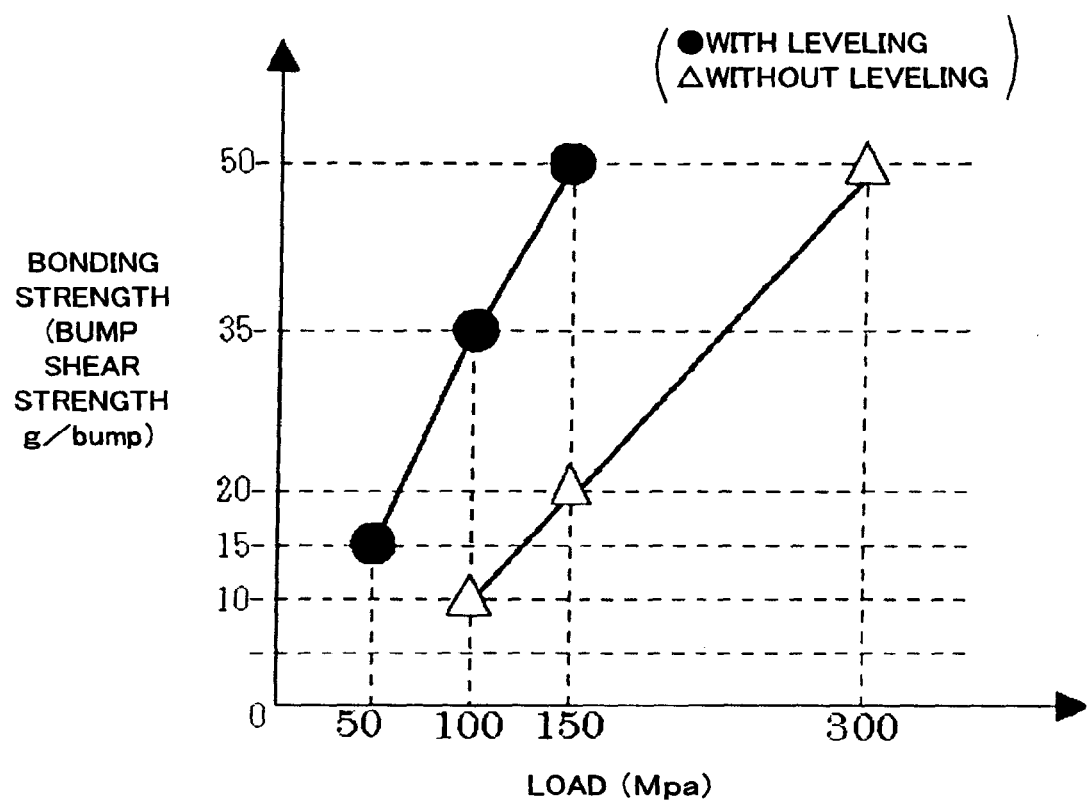
FIG. 7 is a diagram illustrating a relationship between a bonding load in the presence or absence of leveling, and bonding strength.
Figure 8:
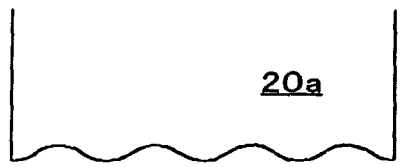
FIG. 8 is a schematic diagram illustrating bump surface roughness.
Figure 9:
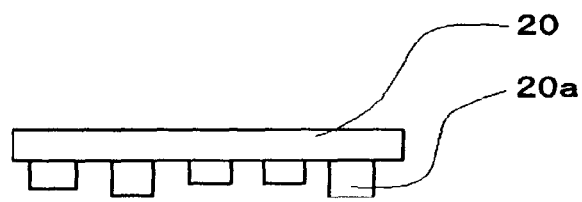
FIG. 9 is a schematic diagram illustrating a variation in bump height.

In order to perform room-temperature bonding while keeping a solid phase in the atmospheric air, the bonding surfaces (portions to be bonded) of objects to be bonded are previously etched by several nanometers in a vacuum using Ar plasma (an energy wave) to remove adhering substances. When bonding is performed in the atmospheric air after cleaning, an adhering substance layer is formed on the bonding surface, so that bonding is not achieved only by contacting. However, since the adhering substance layer is thin immediately after cleaning, a new surface appears due to pressing, which allows bonding. As illustrated in FIG. 7, room-temperature bonding can be achieved by pressing even in the atmospheric air if the object to be bonded is not allowed to stand after dry cleaning This may be because, although a thin adhering substance layer is formed on the bonding surface, the layer is so thin that it can be crushed by pressing.

Figure 10:
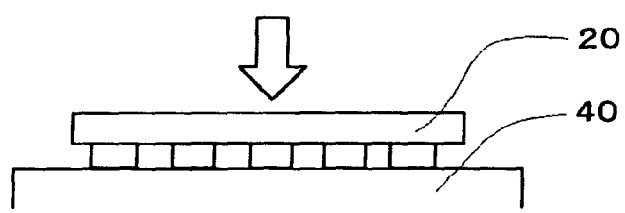
FIG. 10 is a schematic diagram of leveling.
Figure 11:
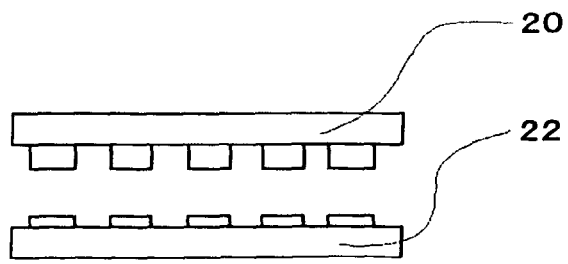
FIG. 11 is a schematic diagram illustrating bonding between a chip and a substrate after leveling.

In this embodiment, when the bonding portion is subjected to leveling, a sufficient bonding strength can be obtained using a pressing force of 150 MPa, while a pressing force of 300 MPa is required when leveling is not performed. This may be because a pressing force which is required to crush a rough portion of the bonding portion so as to contact bonding portions together varies, due to variations in height of the bumps 20a and 22a or the surface roughness. In the case of an ordinary bump which was not subjected to leveling, the height variation was 2 μm and the surface roughness was 200 nm. However, after performing leveling, both the height variation and the surface roughness of a bump were 50 nm or less. Therefore, it is considered that the bonding load was able to be reduced. The leveling indicates that the height or surface roughness of bumps is corrected to be uniform by pressing the bump against a reference support 40 having a high flatness as illustrated in FIG. 10. Leveled chips may be previously arranged, or may be leveled using a bonding apparatus before bonding to a substrate.

In order to crush the bonding portion to achieve bonding, the bonding metal needs to have a low hardness. In this embodiment as in the above-described embodiments, a metal bonding portion which has a hardness of 200 Hv or less was used, and particularly when gold or copper was used, firm bonding was able to be achieved. Note that, when leveling was used, bonding was able to be achieved by a pressing force of 150 MPa or less. Particularly, when a bonding portion was formed of gold, a low hardness was obtained and oxidation did not occur even in the atmospheric air. Thus, gold is an effective metal.

Flipchip bonding for a semiconductor chip which has a number of electrode portions (metal bumps) is expected to provide mounting having a high accuracy ranging from minute pitch electrodes to several micrometers or less, and is desired to be performed at a low temperature of 180° C. or less, preferably room temperature, because of an influence of heat to a semiconductor. Therefore, this embodiment is particularly effective to the flipchip bonding.

The semiconductor chip may be in any form, such as a chip, a wafer, or the like. The metal bump may be a plurality of shapes separately provided or a shape in which a certain continuous region is confined. The entire surface may be a bonding surface.

Although a chip and a substrate have been described in the example of the sixth embodiment, an object to be bonded may be formed of materials other than semiconductors.

Seventh Embodiment

Figure 19:
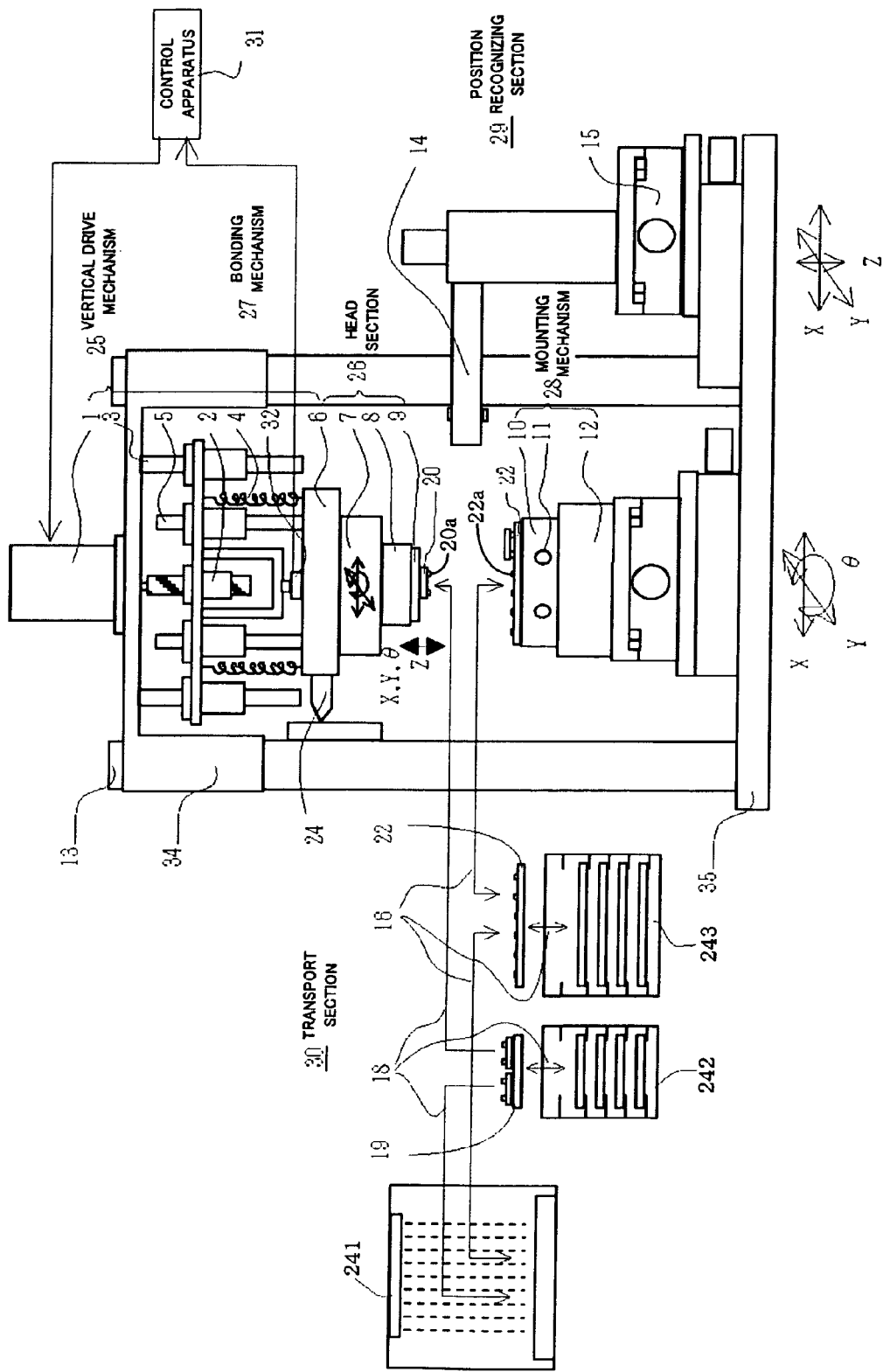
FIG. 19 is a diagram illustrating a bonding apparatus.

Hereinafter, a seventh embodiment of the present invention will be described in detail. FIG. 19 illustrates the seventh embodiment of the bonding apparatus of the present invention. In the seventh embodiment, an apparatus for bonding a chip 20 formed of a semiconductor (a first object to be bonded) and a substrate 22 formed of a wafer (a second object to be bonded) will be described as an example. A bonding surface of the chip 20 has a plurality of bumps (metal electrodes) 20a which are electrodes and are formed of gold, and a bonding surface of the substrate 22 has a metal pad 22a which is an electrode and is provided at a position which allows to face the metal electrode of the chip. The metal electrode of the chip and the metal electrode of the substrate are bonded together by pressing after a treatment using an energy wave.

The bonding apparatus roughly includes a bonding mechanism 27 including a vertical drive mechanism 25 and a head section 26, a mounting mechanism 28 including a stage 10 and a stage table 12, a position recognizing section 29, a transport section 30, and a control apparatus 31. The vertical drive mechanism 25 moves the head section 26 vertically using a vertical drive motor 1 and a bolt-nut mechanism 2 while being guided by a vertical guide 3. The head section 26 is guided vertically by a head escape guide 5, and contacts a pressing force detecting means 32 for detecting a pressing force and the vertical drive mechanism while being pulled by a head own-weight counter 4 for canceling the head's own weight and pressing the head against the pressing force detecting means 32. The head section 26 is composed of a chip holding tool 8 which sucks and holds the chip 20, a tip tool 9, a head's alignment table 7 which has movement axes of translation and rotation and performs position correction, and a head holding section 6 which supports them. A heating heater is buried and provided inside the chip holding tool. The mounting mechanism 28 is composed of the stage 10 which sucks and holds the substrate 22, and the stage table 12 which has movement axes of translation and rotation and performs alignment of positions of a chip and a substrate. A stage heater 11 is included in the stage 10. The bonding mechanism is coupled with a frame 34 and is linked to a pedestal 35 via four supporting poles 13 provided around a pressing center. The position recognizing section 29 is composed of a vertical mark recognizing means 14 which is inserted between a chip and a substrate facing each other and recognizes alignment marks for recognizing positions of the chip (upper position) and the substrate (lower position), and a recognizing means moving table 15 which moves the vertical mark recognizing means 14 horizontally and/or vertically.

The transport section 30 includes a substrate transport apparatus 16 and a wafer cassette 243 which transport the substrate 22, and a chip supply apparatus 18 and a chip tray 19 which transport the chip 20. In order to continuously perform cleaning and bonding, a cleaning machine 241 is linked with the bonding apparatus and the transport means. The chip tray and the wafer are transported into the cleaning machine, followed by cleaning and removal, as required. The chip tray 19 is supplied from or stored into a chip tray cassette 242. The wafer 22 is supplied from or stored into the wafer cassette 243. A control section 31 includes a control of the whole apparatus and an operation section. Particularly in a pressing force control, the control section 31 controls the torque of the vertical drive motor 1 based on a signal from the pressing force detecting means 32 to control a pressing force for bonding.

Next, a series of operations will be described. The cleaned chip 20 is supplied from the chip tray 19 to the chip holding tool 8 by the chip supply apparatus 18, and is sucked and held by the chip holding tool 8. The cleaned substrate (wafer) 22 is supplied to the stage 10 by the substrate transport apparatus 16, and is sucked and held by the stage 10. The vertical mark recognizing means 14 is inserted between the chip 20 and the substrate 22 whose bonding surfaces face each other by the recognizing means moving table 15. Positions of the positioning alignment marks of the chip 20 and the substrate 22 facing each other are recognized by the vertical mark recognizing means 14. Using the chip 20 as a reference, the position of the substrate 22 is moved in a translation direction and a rotation direction by the stage table 12 for the purpose of alignment. During alignment, position correction may be performed by the stage table 12 and the head's alignment table, or only by the head's alignment table. Only either of the tables may be provided.

When both the bonding positions match each other, the vertical mark recognizing means 14 is retreated by the recognizing means moving table 15. Next, the head section 26 is lowered by the vertical drive mechanism 25 so that the chip 20 and the substrate 22 contact each other. A position in a height direction of the head section 26 is detected by a head height detecting means 24. Contact timing of the chip 20 and the substrate 22 is detected by the pressing force detecting means 32, and the vertical drive motor is switched from a position control to a torque control. The head height is also monitored by the head height detecting means 24 during the time when pressing is performed in the torque control, so that the position in the height direction can be controlled. After completion of bonding, the suction of the chip 20 is released, so that the chip 20 is left on the stage while being mounted on the substrate 22. By continuously bonding chips to a substrate (wafer), mounting is completed. The substrate 22 is discharged to the wafer cassette 243 by the substrate transport apparatus 16. The series of operations are ended.

Note that, assuming that a plurality of chips are bonded onto a single wafer, if the number of chips is large, it takes a long time. In order to achieve room-temperature bonding in the atmospheric air, bonding is performed within about one hour after dry cleaning. This is because, if otherwise, adhering substances increase on a bonding surface, so that bonding cannot be performed. Therefore, dry cleaning (surface activating treatment) is preferably performed again with a low-pressure plasma (energy wave) within one hour, preferably 30 minutes. Therefore, the cleaning machine 241 is coupled with the bonding apparatus so that, when a chip is bonded onto a wafer, after a predetermined time has passed, the wafer is temporarily transported from the stage to the cleaning machine, in which cleaning is in turn performed again. After cleaning, the wafer is set on the stage again to start chip bonding. Thereby, a number of chips can be continuously bonded to a wafer in the atmospheric air at low temperature.

Eighth Embodiment

Figure 24:
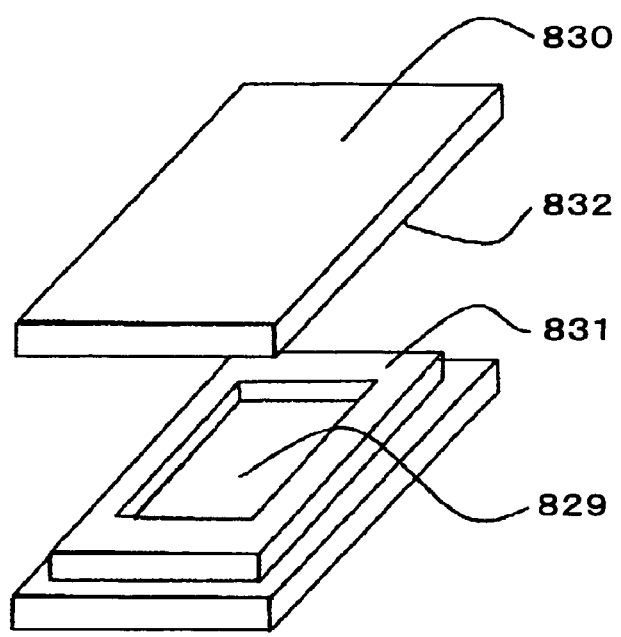
FIG. 24 is a diagram illustrating a configuration of a device at a chip level.
Figure 25:
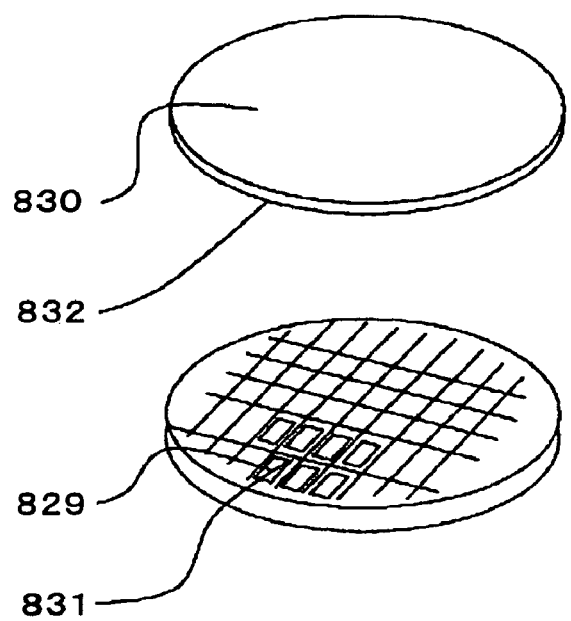
FIG. 25 is a diagram illustrating a configuration of a device at a wafer level.
Figure 26:
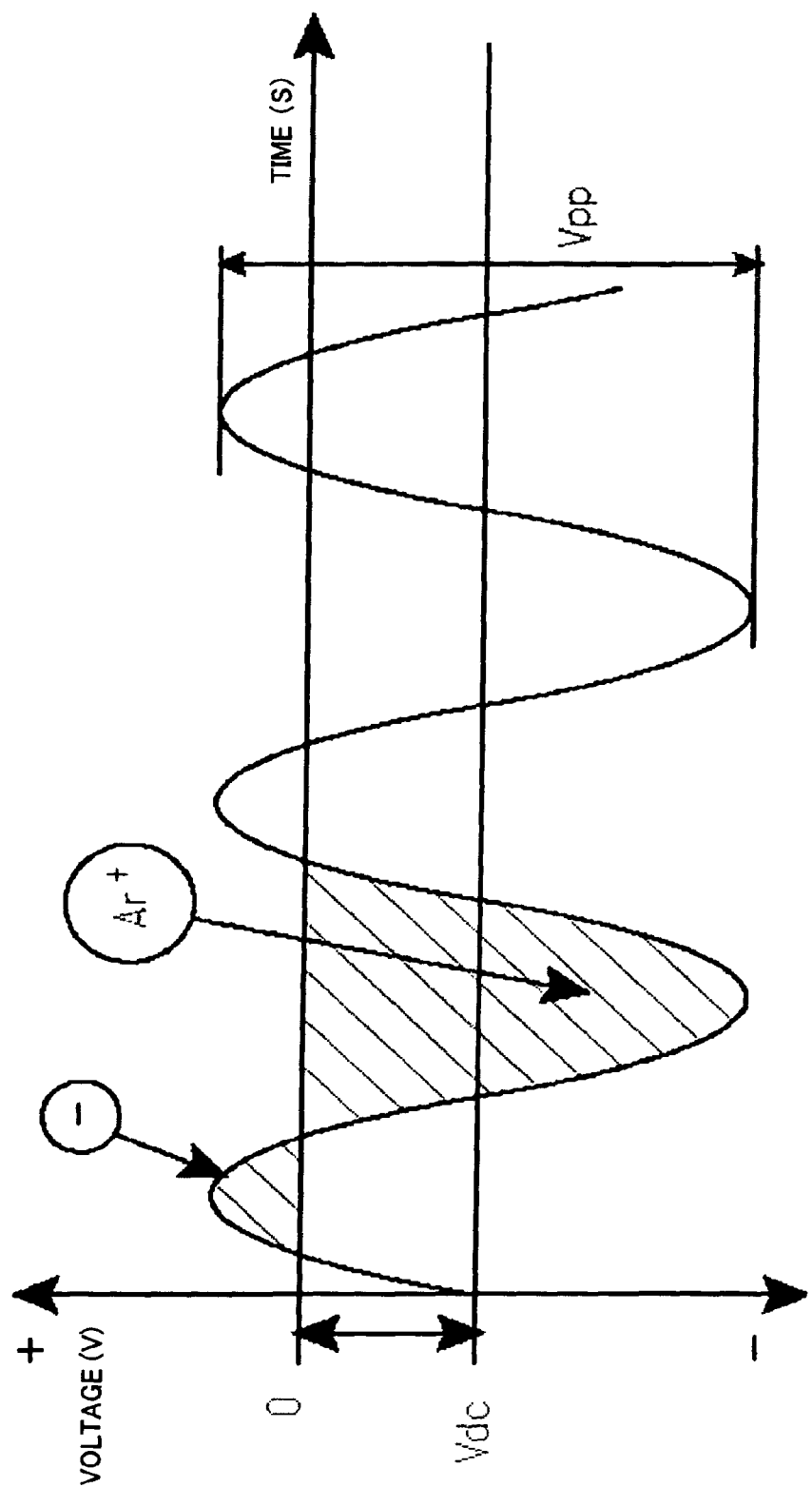
FIG. 26 is a diagram illustrating an RF plasma power supply.
Figure 27:
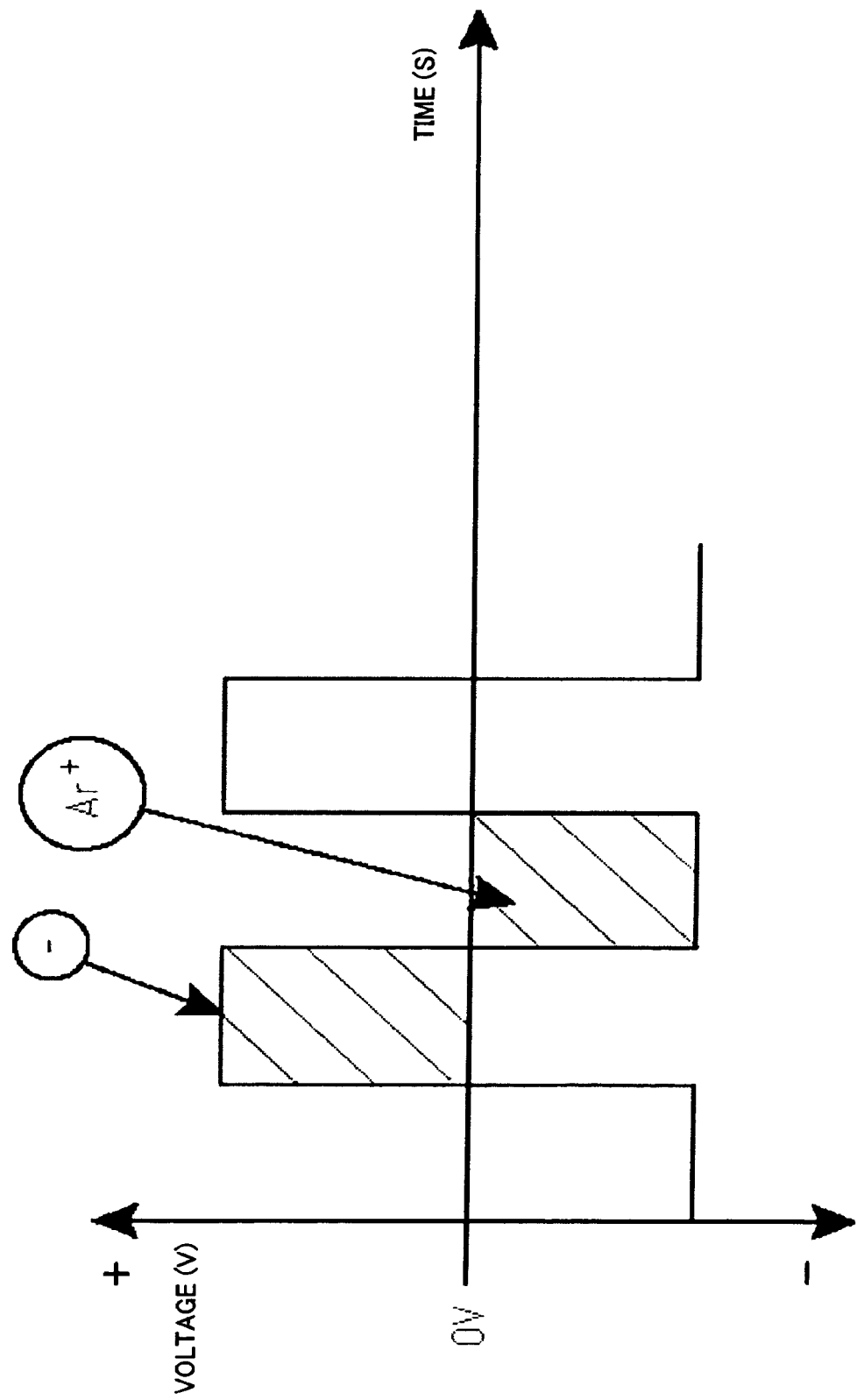
FIG. 27 is a diagram illustrating a pulsed wave plasma power supply.
Figure 28:
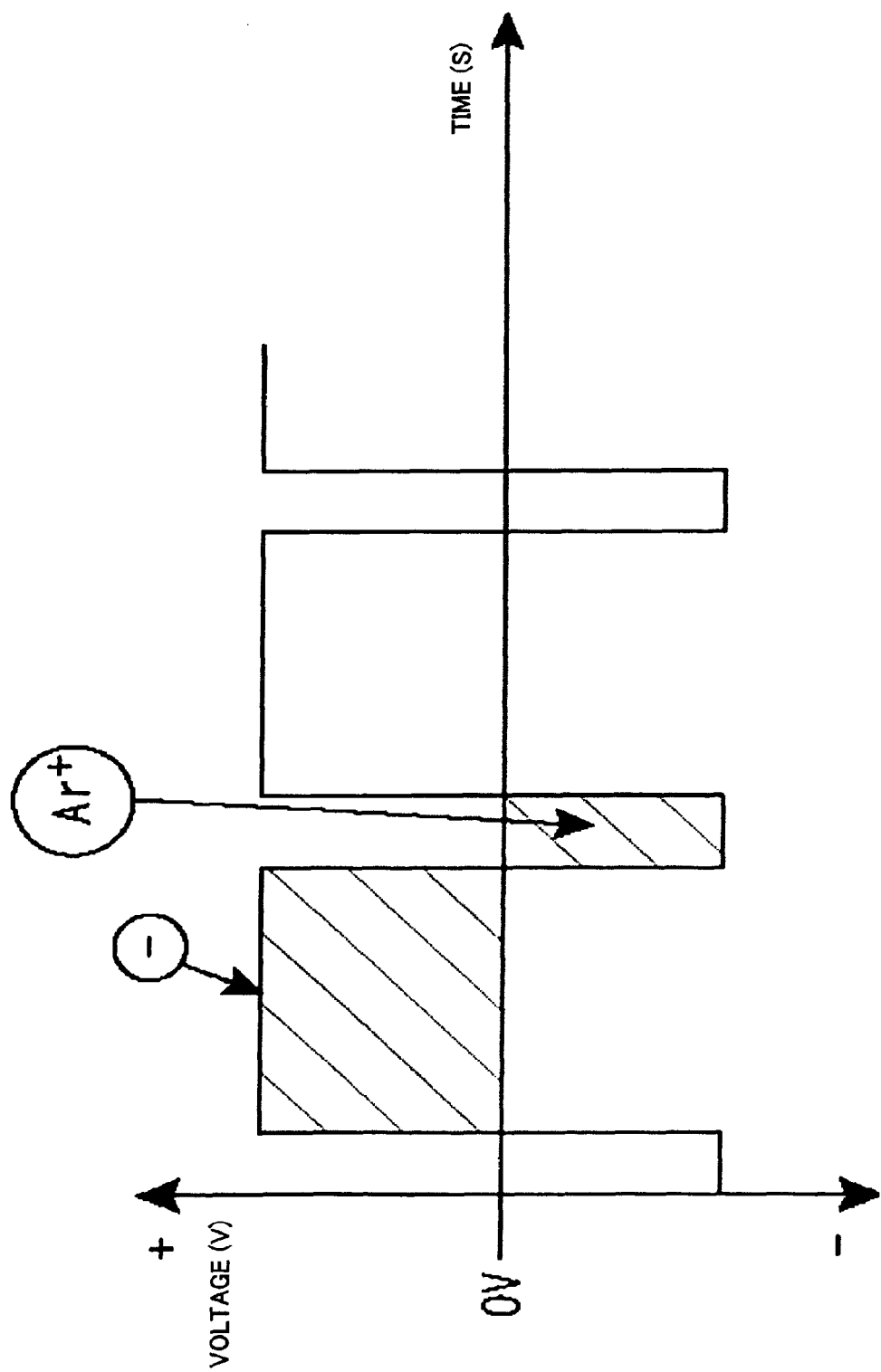
FIG. 28 is a method for reducing damage, depending on a pulse width.

Hereinafter, an eighth embodiment of the present invention will be described in detail. Firstly, an object to be bonded of this embodiment will be described in detail with reference to FIG. 24. As illustrated in FIG. 24, in this embodiment, a device 829 and a lid 830 are bonded together. A contour-shaped gold plating 831 having a thickness of 1 μm or more is formed as a bonding portion on a bonding surface of the device 829. A thin gold film 832 is formed on a bonding surface of the lid 830 by sputtering or flash plating. Note that the thick film plating 831 and the thin film 832 may be reversely formed on the lid 830 and the device 829, respectively. FIG. 24 illustrates a chip form. Alternatively, as illustrated in FIG. 25, bonding is most effectively performed on a wafer before dicing.

Figure 20:
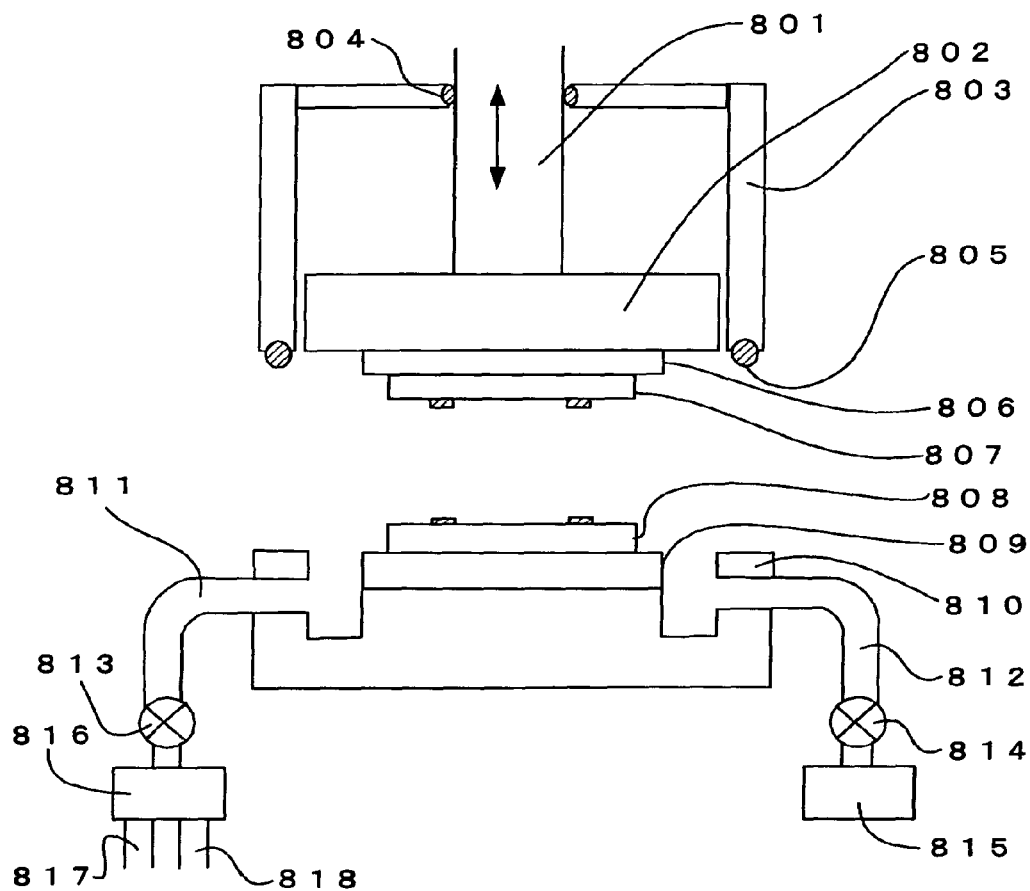
FIG. 20 is a diagram illustrating a bonding apparatus.

FIG. 20 illustrates a wafer bonding apparatus according to the eighth embodiment of the present invention. In this embodiment, a wafer which is an object to be bonded serving as a lid, is held at an upper portion and a wafer which serves as a device is held at a lower portion while the wafers face each other. In this situation, a chamber is closed, both the objects to be bonded are etched in a vacuum using Ar plasma before being contacted each other and bonded together by pressing. In this apparatus, in some cases, heating is performed at a low temperature of 180° C. or less so as to increase strength. The apparatus is configured to have a head section which holds an upper wafer 807 (the lid 830) and performs a vertical movement control and a pressing control using a Z axis 801, and a stage section which holds a lower wafer 808 (the device 829) and may align the wafers.

The Z axis 801 includes a pressure detecting means, and performs a pressing force control by performing feedback with respect to a torque control of a Z-axis servo motor. A chamber wall 803 which can be lifted and lowered by an actuator additionally provided is lowered, and is contacted via a fixing packing 805 to a chamber support 810. In this situation, the chamber is evacuated, reaction gas is introduced, a plasma treatment is performed, evacuation is performed, replacement with filling gas is performed when the chamber is filled with filling gas, and the head section is lowered to contact and press both wafers together so that the wafers are bonded. The chamber wall 803 is sealed using an O ring in a manner which allows the chamber wall to be lifted and lowered, or alternatively may be received at a place where a shaft is narrowed or at an outer circumference of a piston. In some cases, an upper electrode 806 and a lower electrode 809 may be provided with a heating heater which can perform heating during bonding.

Figure 21A:
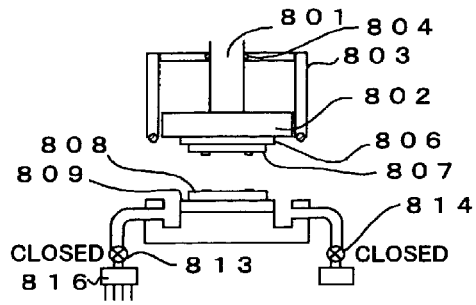
FIGS. 21A to 21G are diagrams illustrating a bonding process.
Figure 21B:
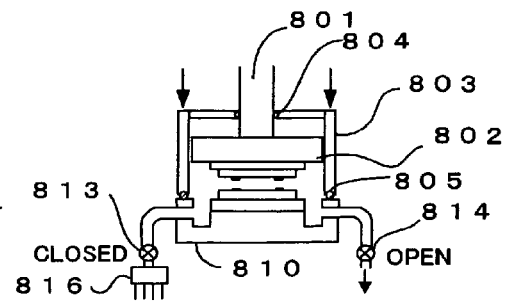

As illustrated in FIGS. 21A to 21G, an operation will be described in sequence. As illustrated in FIG. 21A, while the chamber wall 803 is in the lifted state, the upper wafer 807 is held by the upper electrode (energy wave emitting means) 806. The holding method may be a mechanical chucking method, or desirably an electrostatic chuck method. Thereafter, the lower wafer 808 is held by the lower electrode (energy wave emitting means) 809. Next, as illustrated in FIG. 21B, the chamber wall 803 is lowered to be contacted via the fixing packing 805 to the chamber support 810. The chamber wall 803 is sealed from the atmosphere by a sliding packing 804. Therefore, by opening a discharge valve 814 while an intake valve 813 is closed, the chamber is evacuated using a vacuum pump 815, thereby making it possible to increase the degree of vacuum in the chamber.

Figure 21C:
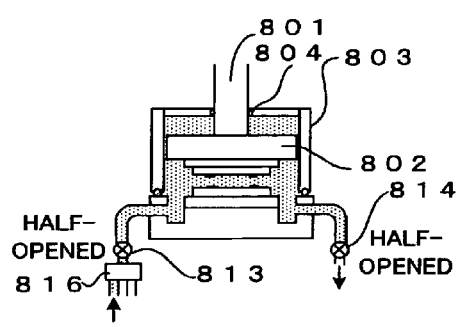
Figure 21D:
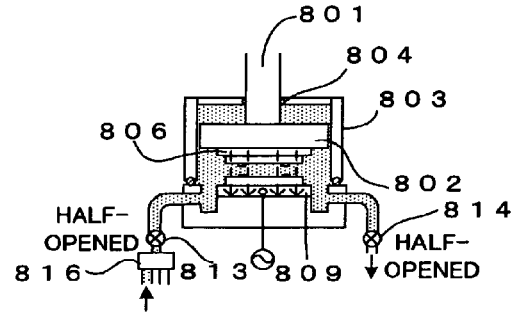
Figure 21E:
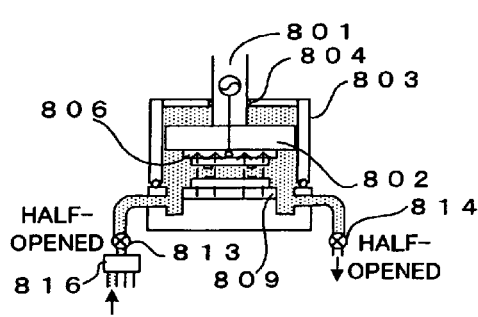

Next, as illustrated in FIG. 21C, the chamber is filled with reaction gas including Ar. By controlling a discharge amount at the discharge valve 814 and a gas intake amount at the intake valve 813 while the vacuum pump 815 is being operated, the chamber can be filled with the reaction gas while keeping a certain degree of vacuum. As illustrated in FIGS. 21D and 21E, in this embodiment, the chamber is initially filled with Ar gas, and a plasma generating voltage is applied to the lower electrode 809 by an alternating power supply where the degree of vacuum is about $10^{-2}$ Torr, thereby generating plasma to etch and clean a surface of the lower wafer 808 using the Ar plasma. Next, by applying a voltage from a similar alternating power supply to the upper electrode 806, the upper wafer is etched and cleaned using Ar plasma. Next, as illustrated in FIG. 21B, the chamber is evacuated to discharge Ar. In some cases, by performing evacuation while heating both the electrodes at about 100° C., Ar which adheres to a surface or is implanted into a part is discharged. Thereafter, replacement with filling gas is performed when the chamber is filled with filling gas.

Figure 21F:
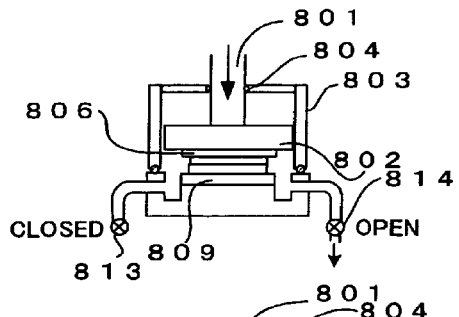
Figure 21G:
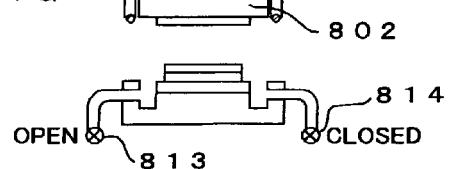

Next, as illustrated in FIG. 21F, a piston type head 802 is lowered by the Z axis 801 in a vacuum or in filling gas while the chamber wall 803 contacts the Z axis 801 via the sliding packing 804, so that both the wafers are contacted with each other in a vacuum or in filling gas, and both the wafers are bonded together by pressing. The inside of the chamber is blocked from an external atmosphere by the sliding packing 804 between the chamber wall 803 and the Z axis 801, whereby the piston type head section can be lowered while being held in a vacuum or in filling gas. In some cases, the wafers are simultaneously heated to about 180° C. by the heaters included in both the electrodes, thereby increasing strength. Thereafter, as illustrated in FIG. 21G, an atmospheric air is supplied into the chamber so that the pressure of the chamber is put back to the atmospheric pressure, the head section is lifted, and the bonded wafers are removed out. A method of changing two gases (Ar and the atmospheric air or nitrogen) in a single chamber, can select and supply Ar and the atmospheric gas using a gas switch valve 816. After Ar is initially selected to fill the chamber, the intake valve 813 is closed to evacuate the chamber to discharge Ar. Thereafter, the gas switch valve 816 is switched to the atmospheric gas, and the intake valve 813 is opened to fill the chamber with the atmospheric air. When the chamber is opened, the atmospheric air can be released.

Figure 22:
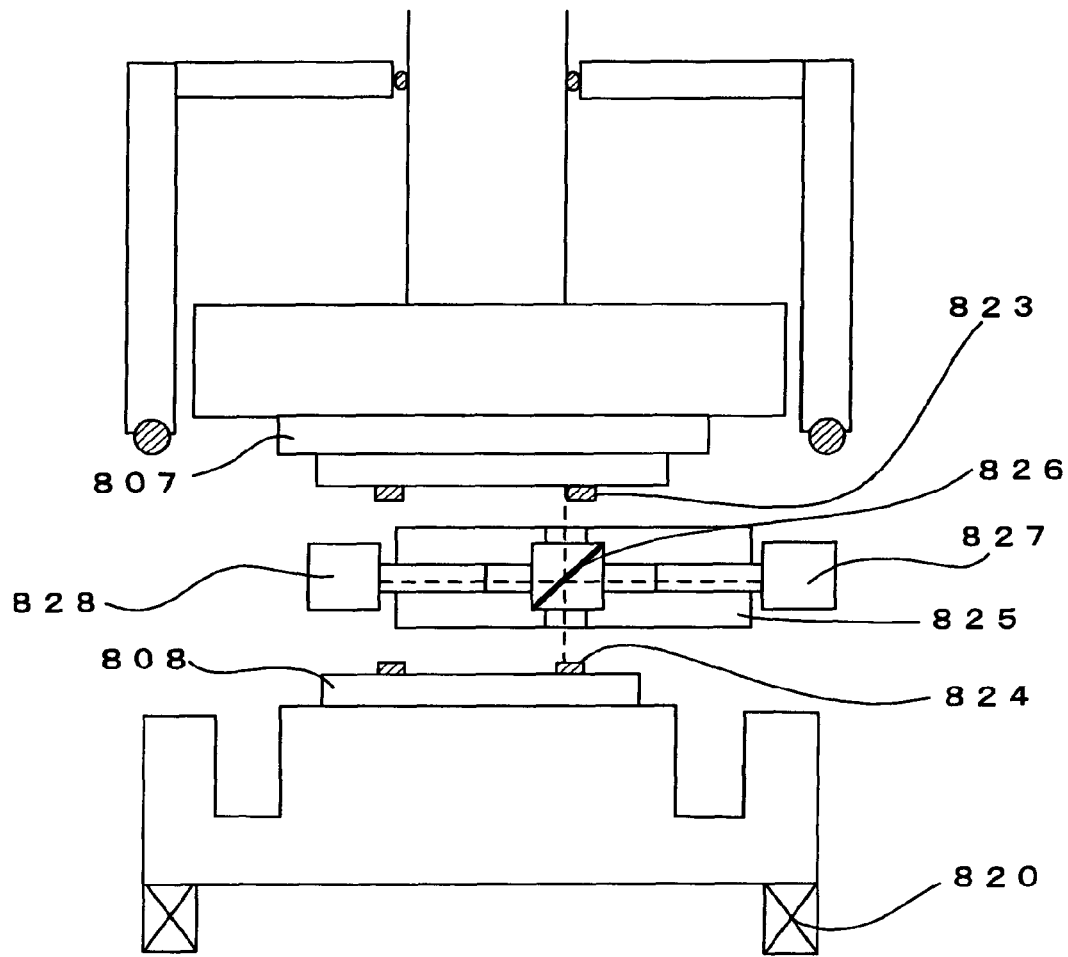
FIG. 22 is a diagram illustrating an alignment in the atmospheric air using a two-side recognizing means.

In some cases, regarding bonding of objects to be bonded, a device and a lid may be bonded together after the positions of the device and the lid are aligned. FIG. 22 illustrates a method of performing alignment before evacuation. Upper alignment marks 823 are attached to two portions of the upper wafer 807, and lower alignment marks 824 are attached to two similar portions of the lower wafer 808. A two-side recognizing means 825 is inserted between both the wafers, and the upper and lower mark positions are read using the recognizing means. The two-side recognizing means 825 splits upper and lower mark images using a prism 826, so that the upper and lower mark images are separately read by an upper mark recognizing means 827 and a lower mark recognizing means 828. The two-side recognizing means 825 is moved using a table having the X and Y axes and, in some cases, the Z axis, thereby making it possible to read a mark at any arbitrary position. Thereafter, the position of the lower wafer 808 is corrected and shifted to the position of the upper wafer 807 using an alignment table 820. After shifting, the two-side recognizing means 825 can be inserted again to repeat correction, thereby improving accuracy.

Figure 23:
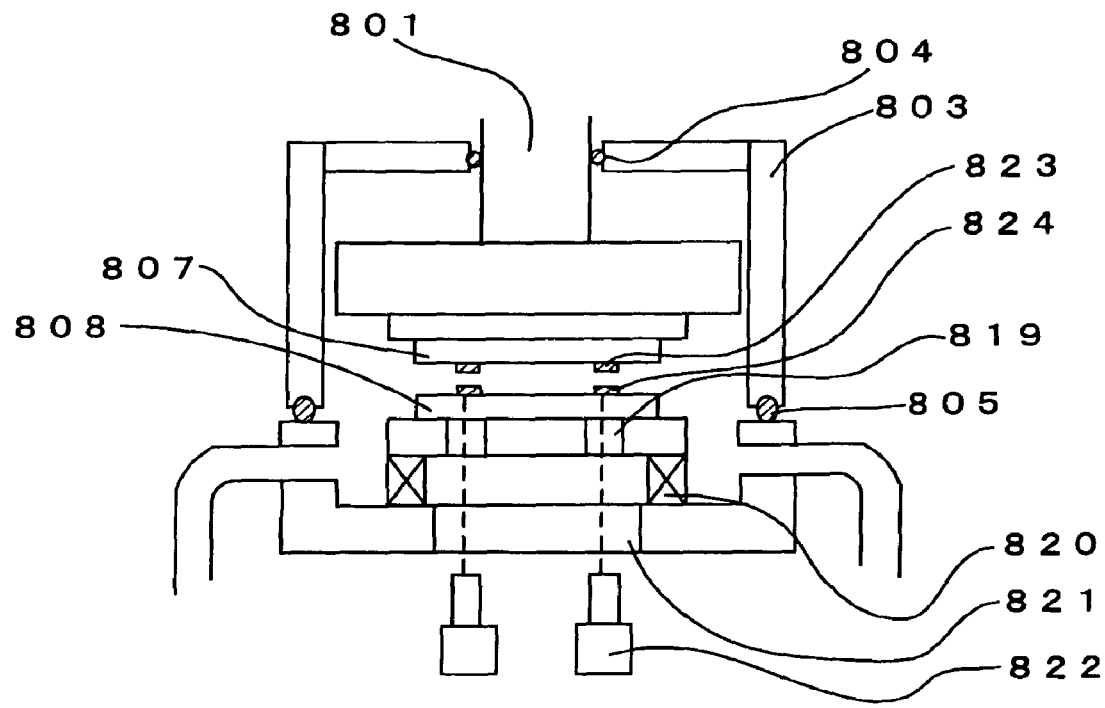
FIG. 23 is a diagram illustrating an alignment in the vacuum atmosphere using an IR recognizing means.

FIG. 23 illustrates a method capable of performing alignment even after evacuation and before bonding. Upper alignment marks 823 are attached to two portions of the upper wafer 807, and lower alignment marks 824 are attached to two portions of the lower wafer 808. The upper and lower marks have shapes which can be recognized in the same visual field even if they overlap each other. After a plasma treatment, both wafers are placed close to each other, and the upper and lower alignment marks formed of a metal are simultaneously recognized and the positions thereof are read by an IR recognizing means 822, where a mark read transparent portion 819, a glass window 821, and the lower wafer are transparent with respect to the upper and lower alignment marks. When a correct depth of focus is not obtained, reading is performed by moving the IR recognizing means 822 vertically. The IR recognizing means 822 is moved using a table having the X and Y axes and, in some cases, the Z axis, thereby making it possible to read a mark at any arbitrary position. Thereafter, the position of the lower wafer 808 is corrected and shifted to the position of the upper wafer 807 using an alignment table 820. After shifting, the IR recognizing means 822 can be used again to repeat correction, thereby improving accuracy.

Note that, when a bonding portion is formed of gold, the bonding portion is not corroded by filling gas even if the filling gas is not inert gas, so that the filling gas does not have an influence on bonding. Therefore, other gases as well as inert gas can be applied in this embodiment.

Etching is preferably performed using Ar plasma in terms of efficiency, however, etching may be performed using other gases, such as nitrogen, oxygen, and the like.

Regarding a method of subjecting an object to be bonded to a plasma treatment (a treatment using an energy wave, a surface activating treatment), a wafer held on an electrode surface to which an alternating power supply is connected is preferably cleaned in terms of efficiency, however, the electrode may be placed at a position other than the wafer holding position and the wafer may be cleaned (a surface activating treatment) in terms of uniformity or a reduction in damage.

In the configuration in which the IR recognizing means reads a mark, a passage of an IR light source in space or the like between the mark read transparent portion 819, the glass window 821, and the alignment table is not limited to space and glass, and may be formed of a material which transmits IR light. Instead of reflected light, transmitting light may be used, where a light source is provided on the opposite side of the IR recognizing means.

An elastic material may be provided on a surface of at least one of the objects-to-be-bonded holding means (the head or the stage), and when objects to be bonded are bonded together, pressing may be performed via the elastic material with respect to both the objects to be bonded. With such a configuration, it is possible to increase the parallelism of the objects to be bonded. Also, it is possible to increase the flatness if an object to be bonded is thin.

The object-to-be-bonded holding means may be held on the stage and/or the head via a spherical bearing, and objects to be bonded may be contacted and pressed by each other during or before bonding so that the tilt of at least one of the objects to be bonded can match the tilt of the other. With such a configuration, bonding can be performed, increasing the parallelism (see FIG. 29).

The bonding apparatus of this embodiment is configured to be able to perform a batch process from a surface activating treatment (cleaning) of objects to be bonded to bonding of the objects to be bonded, however, a surface activating apparatus for performing a surface activating treatment using an energy wave and a bonding apparatus for performing bonding may be separated.

Ninth Embodiment

Figure 29:
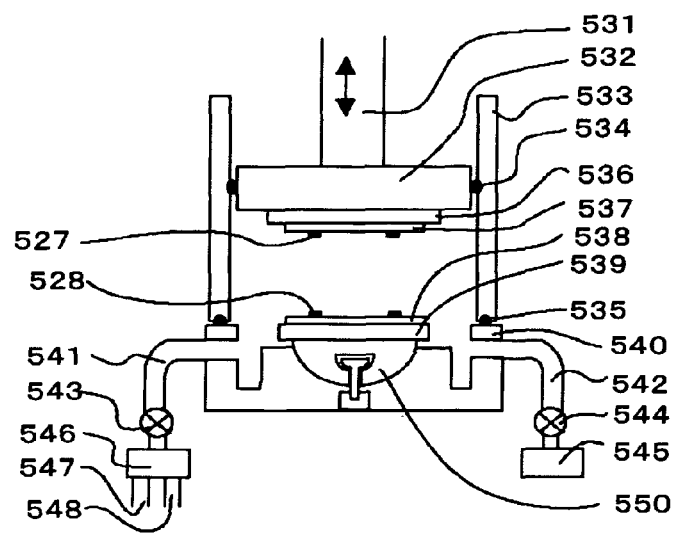
FIG. 29 is a diagram illustrating a bonding apparatus.

A ninth embodiment of the present invention will be described in detail with reference to FIG. 29. This embodiment provides an apparatus for closing a chamber while holding wafers (objects to be bonded) facing each other vertically, treating the wafers with Ar plasma and oxygen plasma, and bonding the wafer together, and in some cases, heating the wafers to increase strength. The apparatus includes a head section which holds an upper wafer 537 and performs a vertical movement control and a pressing control using a Z axis 531, and a stage section which holds a lower wafer 538 and, in some cases, aligning wafers. The Z axis 531 includes a pressure detecting means, and performs a pressing force control by performing feedback with respect to a torque control of a Z axis servo motor. A chamber wall 533 which can be lifted and lowered by an actuator additionally provided is lowered, and is contacted via a fixing packing 535 to a chamber support 540. In this situation, evacuation is performed, reaction gas is introduced, a plasma treatment (surface activating treatment) is performed, and the head section is lowered to bond both wafers together.

In some cases, the upper electrode 536 and the lower electrode 539 may be provided with a heating heater which can perform heating during bonding. Thereafter, the atmospheric air is supplied into the chamber so that the pressure of the chamber is put back to the atmospheric pressure, the head section is lifted, and the bonded wafers are removed out. In some cases, bonding can be performed after alignment of the positions of both the wafers. When alignment is performed in the atmospheric air, an optical system having two visual fields (upper and lower) is inserted between both objects to be bonded, and the head or the stage is moved and corrected in horizontal and rotational directions. When alignment is performed in a vacuum, a portion of the stage may be formed of a transparent material so as to be transparent with respect to both the objects to be bonded, where light transmits the transparent material from the bottom, and alignment marks formed of a metal may be read, and the head or the stage may be moved and corrected in horizontal and rotational directions.

A lower electrode (object-to-be-bonded holding means) 539 is held by a copying mechanism (spherical bearing) 550, so that the wafers are contacted and pressed by each other during or before bonding of the wafers to cause the tilt of the lower wafer 538 to match the tilt of the upper wafer 537 on the upper electrode 536. With such a configuration, the wafers (objects to be bonded) can be bonded together while increasing the parallelism of the wafers (see FIG. 29). The copying mechanism 550 may have a lock mechanism which selects lock/free, and is normally in a locked state, and when copying, is in a free state. The copying mechanism 550 can be locked after the parallelism is once increased, and while holding this state, the wafers can also be subjected to a plasma treatment (energy wave treatment) and alignment, followed by bonding. Therefore, since alignment is performed after increasing the parallelism, the wafers can be bonded together without a position error.

Tenth Embodiment

Figure 30:
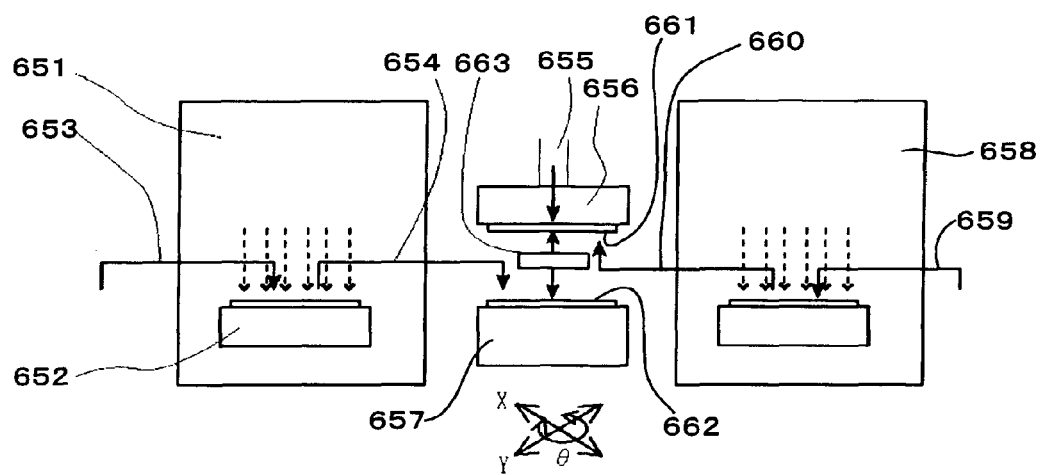
FIG. 30 is a diagram illustrating a cleaning apparatus and a bonding apparatus.

A tenth embodiment of the present invention will be described in detail with reference to FIG. 30. This embodiment provides a bonding apparatus in which objects to be bonded are bonded together in the atmospheric air after being subjected to plasma cleaning (surface activating treatment) in a vacuum. At least one of the objects to be bonded is transported into a cleaning chamber, which is linked to a transport means for transporting the objects to be bonded to a bonding section after cleaning, and the next objects to be bonded are cleaned during bonding.

Objects to be bonded whose bonding surfaces are formed of gold or copper can be previously separately surface-activated by a plasma treatment in a vacuum chamber, and can be removed into the atmospheric air, followed by bonding. The cleaned objects to be bonded are transported to a bonding section by a transport means, and the next objects to be bonded are cleaned during bonding. Therefore, cleaning can be performed parallel to bonding, thereby making it possible to save time.

When balance is not attained on a one-by-one basis, a plurality of objects to be bonded may be placed on a tray or the like and may be simultaneously cleaned. When a continuous object to be bonded is provided on a reel, the object to be bonded may be seized via a packing by a chamber door to be subjected to a plasma treatment. When alignment is performed before bonding, a recognizing means 663 having two (upper and lower) visual fields may be inserted between both objects to be bonded, and the head or the stage may be moved and corrected in horizontal and rotational directions. The recognizing means 663 having two (upper and lower) visual fields can be shifted to any arbitrary position by a recognizing means moving table to perform position measurement.

Note that a means for holding an object to be bonded in a vacuum is desirably of an electrostatic chuck type, or may be of a mechanical chuck type. Preferably, objects to be bonded sucked and held by vacuum are tightly attached together in the atmospheric air before mechanical chucking, resulting in an improvement in tight attachment.

Eleventh Embodiment

Figure 31:
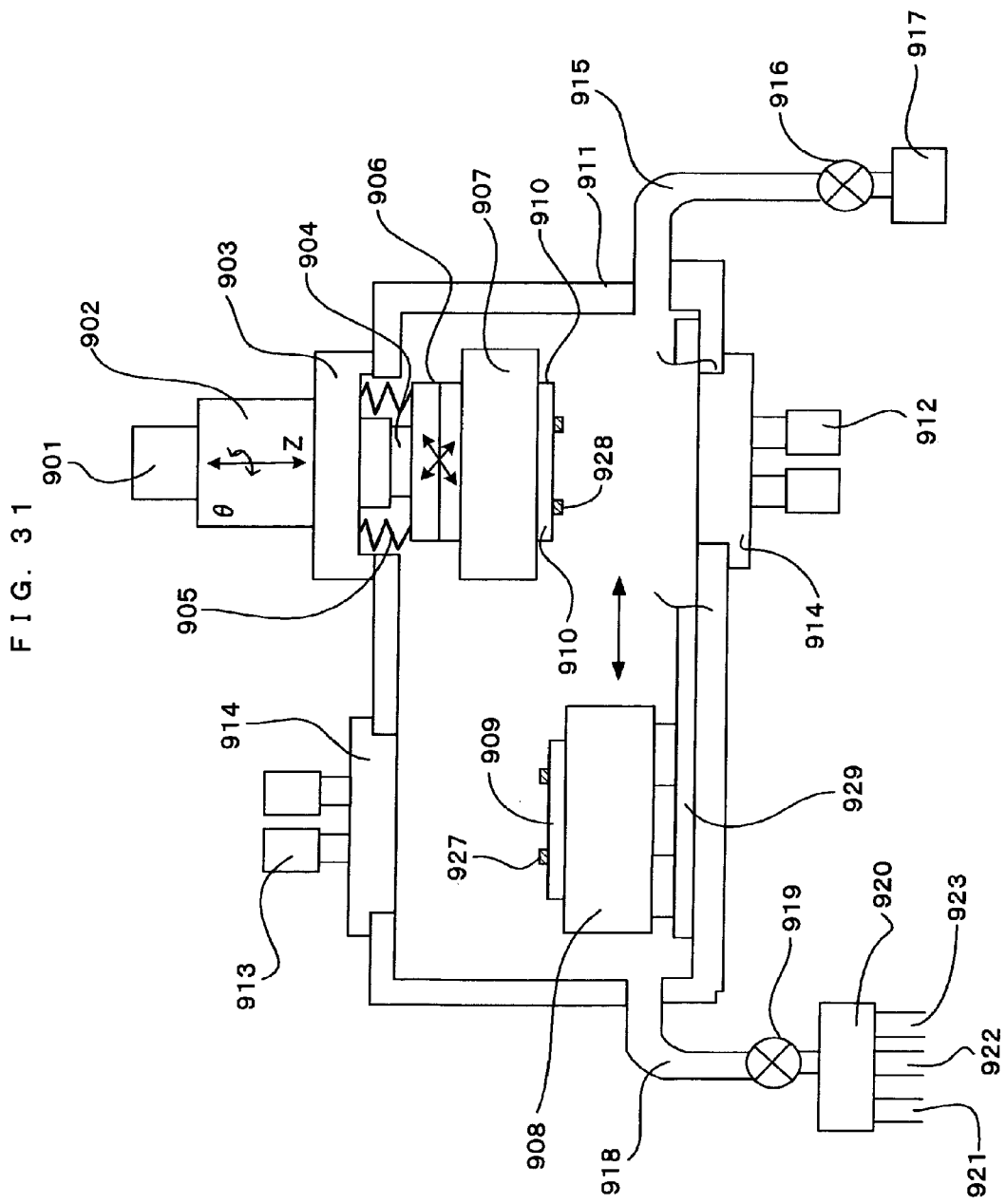
FIG. 31 is a diagram illustrating a bonding apparatus.

Next, an eleventh embodiment of the present invention will be described in detail with reference to FIG. 31. In this embodiment, an apparatus for bonding an upper wafer (first object to be bonded) and a lower wafer (second object to be bonded) will be described as an example. Firstly, a configuration of the apparatus will be described. A head 907 which holds the upper wafer and a stage 908 which holds the lower wafer are provided in a vacuum chamber 911. The head includes a Z-axis lifting/lowering mechanism (vertical drive mechanism) 902 to which a torque control lifting/lowering drive motor 901 is linked, a θ-axis mechanism which rotates the Z-axis lifting/lowering mechanism 902, and an XY alignment table 906 which moves and aligns the head section in X and Y horizontal directions, which provide an aligning/moving means for the X, Y, and θ directions and a lifting/lowering means for the Z direction.

A pressing force detected by a pressure detecting means 904 during bonding is fed back to the torque control lifting/lowering drive motor 901, thereby switching between a position control and a pressing force control. Also, the pressure detecting means 904 can be used to detect contact of objects to be bonded. The XY alignment table 906 can use a means which can be used in a vacuum. Since the Z- and θ-axis mechanisms are placed outside a vacuum chamber, the head section is blocked from the outside via a bellows 905 in a manner which allows the head section to move.

The stage 908 can be slid between a bonding position and a standby position by a slide moving means 929. A linear scale for high-accuracy guidance and position recognition is attached to the slide moving means, so that a stop position between the bonding position and the standby position can be maintained with high accuracy. The moving means is built in the vacuum chamber. However, if the moving means can be provided outside and linked via a linking rod with packing, a cylinder, a linear servo motor, and the like can be provided outside. Alternatively, a ball screw can be provided in a vacuum, and a servo motor can be provided outside. Any moving means may be used.

Although the object-to-be-bonded holding means of the head and the stage may be of a mechanical chucking type, an electrostatic chuck is preferably provided. The object-to-be-bonded holding means also includes a heating heater, and also serves as a plasma electrode (energy wave emitting means), i.e., has three functions: holding means; heating means; and plasma generating means. Regarding a decompressing means, a vacuum pump 917 is coupled with a gas discharge pipe 915, and a gas discharge valve 916 is opened or closed so as to control a flow rate, so that the degree of vacuum is controlled. Regarding an intake portion, an intake gas switching valve 920 is linked to an intake pipe 918, and a gas intake valve 919 is opened or closed so as to control a flow rate.

Regarding intake gas, two plasma reaction gases can be linked. For example, Ar and oxygen can be linked. As the other one, the atmospheric air for releasing the atmospheric air or nitrogen is linked. The degree of vacuum and the reaction gas concentration can be controlled to be optimum values by a control of a flow rate, including opening or closing of the gas intake valve 919 and the gas discharge valve 916. In addition, a vacuum pressure sensor can be provided in the vacuum chamber to perform automatic feedback.

Alignment mark recognizing means comprising an optical system for alignment are provided outside the vacuum chamber above the stage standby position and below the head. Regarding the number of recognizing means, at least one needs to be provided for the stage and at least one needs to be provided for the head. Assuming that a small object, such as a chip, is recognized, if an alignment mark has a shape whose θ-direction component can be read or two marks are provided in one visual field, a single recognizing means is sufficient to read. However, when an object having a large radius, such as a wafer, is used as in this embodiment, two recognizing means are preferably provided at each end, thereby making it possible to read with high θ-direction accuracy.

The recognizing means may also be provided with a means which can move in a horizontal direction or a focusing direction, thereby reading an alignment mark placed at any arbitrary position. The recognizing means may include a camera having an optical lens for visible light or IR (infrared) light, for example. The vacuum chamber is provided with a window formed of a material which is transparent with respect to an optical system of the recognizing means, such as glass. An alignment mark on an object to be bonded in the vacuum chamber is recognized via the window. Alignment marks are provided on objects to be bonded (e.g., surfaces facing each other of an upper wafer or a lower wafer), thereby making it possible to recognize a position with high accuracy. Although the alignment mark is preferably in any specific shape, a portion of a circuit pattern provided on a wafer may be used as an alignment mark. When a mark is not present, an outer shape, such as an orientation flat or the like, can be used.

The alignment marks of both the upper and lower wafers are read at the stage standby position, the stage is shifted to a bonding position, and the head is moved so as to perform alignment in the X, Y, and θ directions. In order to reflect the result of reading at the standby position at the bonding position, accuracy is required so that a relative movement distance vector between the stage standby position and the bonding position repeatedly has the same result. Therefore, a guide which has high repetition accuracy is used, and a linear scale which reads position recognition at both the sides with high accuracy, are provided.

When stop position accuracy is improved by feeding a linear scale back to the moving means, and the moving means is one which is like a simple cylinder or one which has a backlash, such as a bolt-nut mechanism, the linear scale is read at both the stop positions, an excess or a shortage is corrected when the head's aligning/moving means is moved, thereby making it possible to easily achieve high accuracy. When fine alignment is performed with nano-level accuracy, rough positioning is performed, and thereafter, while the upper wafer and the lower wafer are close to each other at a distance of about several micrometers, a visible light/IR recognizing means is used as the head's recognizing means, and a transparent hole or a transparent material is provided at an alignment mark position of the stage, so that alignment marks on both the wafers are simultaneously recognized via the transparent stage from the bottom, and alignment can be achieved again in the X, Y, and θ directions. When the recognizing means has a moving means in a focusing direction, the upper and lower wafers can be separately recognized. However, it is preferable in terms of accuracy that the wafers be placed close to each other and be simultaneously recognized.

Regarding the fine alignment, accuracy can be improved by repetition of alignment. The θ direction is affected by center displacement. Therefore, after the θ reaches within a predetermined range, alignment is performed only in the X and Y directions, thereby making it possible to improve the accuracy to a nano-level. Regarding the image recognizing means, recognition accuracy higher than the resolution of infrared can be obtained by using a subpixel algorithm. When alignment is performed after the wafers are placed close to each other, a Z movement amount required during bonding is within a minimum limit of several micrometers or less, so that play or tilt with respect to the Z movement can be minimized, resulting in high accuracy, i.e., nano-level bonding accuracy.

Next, an operation flow will be described with reference to FIGS. 32A to 32K. Firstly, as illustrated in FIG. 32A, while a front door of the vacuum chamber is open, the upper wafer and the lower wafer are held on the stage and the head. The wafers may be manually set or may be automatically loaded from a cassette. Next, as illustrated in FIG. 32B, the front door is closed, and the vacuum chamber is decompressed. In order to remove impurities, the pressure is preferably reduced to $10^{-3}$ Torr or less. Next, as illustrated in FIGS. 32C and 32D, plasma reaction gas (e.g., Ar) is supplied, and a plasma generating voltage is applied to plasma electrodes, where the degree of vacuum is constant at, for example, about $10^{-2}$ Torr, so that plasma is generated.

Generated plasma ions go toward and strike a surface of a wafer held by an electrode which is connected to a power supply, so that adhering substances, such as an oxide film, an organic substance layer, or the like, on the surface is etched, resulting in surface activation. At the same time, both the wafers can be cleaned. Alternatively, the wafers can be alternately cleaned by switching one matching box. The pressure is preferably reduced to $10^{-3}$ Torr or less so as to remove reaction gas or etched matter after or during cleaning In order to remove Ar implanted in the bonding surface, the wafers can be heated to about 100 to 200° C. as well.

Next, as illustrated in FIG. 32E, alignment marks on the upper and lower wafers are read at the stage standby position using the head's and stage's recognizing means in a vacuum, and the positions are recognized. Next, as illustrated in FIG. 32F, the stage is slid and shifted to a bonding position. In this case, a relative movement between the recognized standby position and the bonding position to which the stage is slid and shifted, is performed with high accuracy using a linear scale. When nano-level accuracy is required, a step indicated with FIG. 32G is added. After rough positioning, while the upper wafer and the lower wafer are close to each other at a distance of about several micrometers, a visible light/IR recognizing means is used as the head's recognizing means, and a transparent hole or a transparent material is provided at an alignment mark position of the stage, so that alignment marks on both the wafers are simultaneously recognized by infrared transmission via the transparent stage from the bottom, and alignment can be achieved again in the X, Y, and θ directions. In this case, accuracy can be improved by repetition of alignment. The θ direction is affected by center displacement. Therefore, after the θ reaches within a predetermined range, alignment is performed only in the X and Y directions, thereby making it possible to improve the accuracy to a nano-level.

Next, as illustrated in FIG. 32H, the head is lowered to contact both the wafers together, and the position control is switched to the pressing force control, in which pressing is in turn performed. The contact is detected by the pressure detecting means and a height position is recognized. In this situation, a value obtained by the pressure detecting means is fed back to the torque control lifting/lowering drive motor to perform a pressing force control so as to achieve a set pressure. Also, heat is applied during bonding as required. After contacting at room temperature, heating can be performed (temperature is increased) while keeping the accuracy. Next, as illustrated in FIG. 32I, the head's holding means is released, and the head is lifted. Next, as illustrated in FIG. 32J, the stage is moved back to the standby position, and the vacuum chamber is released to atmospheric air. Next, as illustrated in FIG. 32K, the front door is opened, the bonded upper and lower wafers are removed. The wafers are unloaded onto a cassette manually or preferably automatically.

A metal electrode can be provided on an opposing surface of at least one of the objects to be bonded during cleaning (energy wave treatment), and a metal film can be formed of a metal forming an electrode provided on a bonding surface of the object to be bonded by sputtering, and thereafter, the objects to be bonded can be bonded together. The objects to be bonded are moved so that plasma can be generated while the bonding surfaces of the objects to be bonded do not face each other. Therefore, a metal for sputtering is provided on a surface facing the bonding surface (bonding portion), and the metal is used as an electrode for generating plasma, so that the metal is sputtered on a surface (bonding surface) of the object to be bonded, thereby forming a thin metal film formed of the metal. Different metals for sputtering can be used between the head and the stage.

Different plasma reaction gases can be used between one and the other objects to be bonded, which can be in turn cleaned separately.

An elastic material may be provided on a surface of at least one of the objects-to-be-bonded holding means, and when objects to be bonded are bonded together, pressing may be performed via the elastic material with respect to both the objects to be bonded. With such a configuration, it is possible to increase the parallelism of the objects to be bonded. Also, it is possible to increase the flatness if an object to be bonded is thin.

The object-to-be-bonded holding means may be held on the stage and/or the head via a spherical bearing. With such a configuration, objects to be bonded may be contacted and pressed by each other during or before bonding so that the tilt of at least one of the objects to be bonded can match the tilt of the other. Therefore, bonding can be performed after increasing the parallelism.

Since the bonding surfaces of objects to be bonded are surface-activated with a plasma treatment before bonding, the heating temperature during bonding of the objects to be bonded can be set at 180° C. or less which is below 183° C. which is the melting point of conventional tin-lead solder (solid phase bonding). Also, bonding is preferably possible at 100° C. or less, even at room temperature.

By attaching semiconductors using the above-described method, a three-dimensional structure can be preferably obtained, resulting a semiconductor apparatus having a high packaging density.

When ultrasonic vibration is performed as well during bonding, the head 907 is composed of a horn holding section, a horn, and a oscillator, vibration generated by the oscillator is transferred to the horn, and the ultrasonic vibration is transferred to an object to be bonded held by the horn. The horn holding section includes a means which holds the horn in a manner which does not diminish vibration of the horn and the oscillator. In this case, the transmissibility is determined based on a friction coefficient and a pressure between the horn and the object to be bonded, and therefore, a pressing force is preferably controlled in proportion to the bonding area as bonding is developed. When bonding is performed over a large area in the case of a wafer or the like, the bonding area is too large to use a horizontal vibration type ultrasonic head to perform horizontal vibration. Large area surface bonding can be achieved by using a vertical vibration type ultrasonic head. The vibration frequency may not be particularly in an ultrasonic region, though it is herein called ultrasonic vibration. Particularly in the vertical vibration type, even a low frequency is sufficiently effective.

Although wafers have been described as objects to be bonded in the above-described embodiment, a chip and a substrate may be used. An object to be bonded is not limited to a wafer, a chip, and a substrate, and may be in any form.

Note that a means for holding an object to be bonded is desirably of an electrostatic chuck type, or may be of a mechanical chuck type. Preferably, objects to be bonded sucked and held by vacuum are tightly attached together in the atmosphere before mechanical chucking, resulting in an improvement in tight attachment.

Although the head has the aligning/moving means and the lifting/lowering axis and the stage has the sliding axis in the above-described embodiment, the aligning/moving means, the lifting/lowering axis, and the sliding axis may be assigned to the head and the stage in any combinations, or may overlap between the head and the stage. The head and the stage may not be arranged vertically, and may be arranged in any arrangement directions such as laterally or slantingly.

When plasma cleaning is performed while the stage is being moved, since the head and the stage have similar electrode shapes and peripheral shapes, electric field environments thereof are similar to each other. Therefore, separate matching boxes for automatically controlling a plasma power supply may not be used, and a single matching box can be used to change electrodes, so that cleaning can be sequentially performed on the head and the stage. As a result, a compact size and a reduction in cost can be achieved.

Others

Note that the present invention is not limited to the above-described embodiments, and various other changes can be made without departing from the scope of the present invention. For example, in the first embodiment, the same apparatus performs a batch process including from a surface activating treatment (cleaning) of objects to be bonded to bonding of the objects to be bonded. Alternatively, the surface activating treatment of objects to be bonded using an energy wave and the bonding process of the objects to be bonded may be performed by separate apparatuses.

In the above-described embodiments, an elastic material may be provided on a surface of at least one of the objects-to-be-bonded holding means (the head or the stage), and when objects to be bonded are bonded together, pressing may be performed via the elastic material with respect to both the objects to be bonded. With such a configuration, it is possible to increase the parallelism of the objects to be bonded. Also, it is possible to increase the flatness if an object to be bonded is thin.

In the above-described embodiments, the object-to-be-bonded holding means may be held on the stage and/or the head via a spherical bearing, and objects to be bonded may be contacted and pressed by each other during or before bonding so that the tilt of at least one of the objects to be bonded can match the tilt of the other. With such a configuration, bonding can be performed, increasing the parallelism (see FIG. 29).

By providing an ultrasonic transmitter or a horn instead of the object-to-be-bonded holding tool, ultrasonic vibration is applied instead of heating during the bonding, thereby making it possible to more easily achieve metal bonding in a solid phase. In this case, bonding can be achieved at low temperature or room temperature, so that metal bonding can be achieved in a solid phase without an influence of thermal expansion. By suppressing an amplitude to a small level and applying vibration after pressing, high-accuracy mounting can be achieved without a position error.

A method and a bonding apparatus may be provided in which an ultrasonic vibration head comprising a horn, a horn holding section, and an oscillator is provided, and ultrasonic vibration having an amplitude of 2 μm or less is applied to objects to be bonded in the atmospheric air during bonding, so that metal bonding is performed in a solid phase, where a load is 150 MPa or less and heating is at 180° C. or less. When bonding is performed in the atmospheric air, bonding is more easily achieved by applying ultrasonic vibration. Since surface activation has already been performed, only a small level of ultrasonic energy is required, i.e., an amplitude of 2 μm or less which can suppress damage and position error, is sufficient. More preferably, the amplitude is 1 μm or less. Also, by applying ultrasonic waves, a bonding load can be reduced by half, i.e., to 150 MPa or less. When bonding is performed with respect to a metal (gold) protrusion, bonding can be achieved using a pressing force of as high as about 300 MPa at room temperature. If a bump is present on a semiconductor circuit surface, some circuits are generally damaged with 200 MPa or more. Experiments were conducted under the following conditions: a gold bump (metal protrusion) having 50 μm square and 20 μm in height is provided on a semiconductor chip, where a variation in bump height is 1 μm, and the semiconductor chip is bonded onto a thin gold film substrate using ultrasonic waves (ultrasonic bonding) or at room temperature (room-temperature bonding). In the case of the room-temperature bonding, bonding was achieved when the load was 80 g/bump or more. In the case of the ultrasonic bonding, bonding was achieved when the load was 40 g/bump or more. Therefore, the bump needs to be crushed by 1 μm or more as a crushed bump amount. When a bump having a height of 20 μm is produced by gold plating, the lower limit of a variation in height is 1 μm. Therefore, it is necessary to crush the bump in such an amount.

INDUSTRIAL APPLICABILITY

Note that the present invention is not limited to the above-described embodiments, and various changes can be made with respect to the above-described embodiments without departing the scope and spirit of the present invention. The present invention can be widely applied to bonding of a plurality of objects to be bonded, such as a wafer and the like, particularly preferably a MEMS device.

The invention claimed is:

1. A bonding method for bonding objects to be bonded having a bonding portion formed of metal, comprising the following steps:
   (a) removing impurities around the objects to be bonded by evacuating to reduce pressure;
   (b) introducing an inert reaction gas;
   (c) etching the bonding portions of the objects to be bonded with an energy wave which is an atom beam, an ion beam, or a plasma to thereby clean the bonding portions of adhering substances and generate an active dangling bond of a metal atom on a bonding surface of the bonding portions;
   (d) contacting the bonding portions of the objects to be bonded with each other; and
   (e) crushing minute irregularities on a bonding surface of the bonding portions in contact with each other to thereby bond to the objects to be bonded together, wherein
   after step (c) and prior to step (d) at least some of the adhering substance readhere to the bonding portions to thereby form an adhering substance layer,
   step (e) causes a bonding interface between the bonding portions to spread by spreading the adhering substance layer which causes new metal surface to appear at the bonding interface so that bonding is achieved between the bonding portions,
   step (d) and (e) are each performed in a solid phase at a temperature between room temperature and 180° C., and
   at least one of the bonding portions in step (e) has a surface roughness Ry of 120 nm or more.

2. The bonding method according to claim 1, wherein step (c) is performed in a low vacuum $10^{-5}$ Torr or more in the atmospheric air.

3. The bonding method according to claim 1, wherein the bonding portions of objects to be bonded are formed of metal which have a hardness of 20 Hv to 200 Hv or less.

4. The bonding method according to claim 1, wherein the bonding portions of the objects to be bonded are formed of gold.

* * * * *